(12) United States Patent
Hayashi et al.

(10) Patent No.: US 11,776,936 B2
(45) Date of Patent: *Oct. 3, 2023

(54) SEMICONDUCTOR DEVICE

(71) Applicant: ROHM CO., LTD., Kyoto (JP)

(72) Inventors: Kenji Hayashi, Kyoto (JP); Akihiro Suzaki, Kyoto (JP); Masaaki Matsuo, Kyoto (JP); Ryuta Watanabe, Kyoto (JP); Makoto Ikenaga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/644,452

(22) Filed: Dec. 15, 2021

(65) Prior Publication Data
US 2022/0108977 A1 Apr. 7, 2022

Related U.S. Application Data

(63) Continuation of application No. 16/492,307, filed as application No. PCT/JP2018/015987 on Apr. 18, 2018, now Pat. No. 11,233,037.

(30) Foreign Application Priority Data

Apr. 20, 2017 (JP) ................................ 2017-083370
Apr. 16, 2018 (JP) ................................ 2018-078529

(51) Int. Cl.
*H01L 25/07* (2006.01)
*H01L 23/049* (2006.01)
(Continued)

(52) U.S. Cl.
CPC .......... *H01L 25/072* (2013.01); *H01L 23/049* (2013.01); *H01L 23/296* (2013.01);
(Continued)

(58) Field of Classification Search
CPC ... H01L 25/072; H01L 23/049; H01L 23/296; H01L 23/3107; H01L 23/3735;
(Continued)

(56) References Cited

U.S. PATENT DOCUMENTS 10,068,825 B2 9/2018 Negishi et al.
11,233,037 B2 * 1/2022 Hayashi .............. H01L 23/4334
(Continued)

FOREIGN PATENT DOCUMENTS

DE 11 2015 002 024 T5 2/2017
JP 63-143850 A 6/1988
(Continued)

OTHER PUBLICATIONS

International Search Report issued in PCT/JP2018/015987, dated Jun. 19, 2018 (2 pages).

(Continued)

*Primary Examiner* — Jasmine J Clark
(74) *Attorney, Agent, or Firm* — Hamre, Schumann, Mueller & Larson, P.C.

(57) ABSTRACT

The present disclosure provides a semiconductor device. The semiconductor device includes a substrate, amounting layer, switching elements, a moisture-resistant layer and a sealing resin. The substrate has a front surface facing in a thickness direction. The mounting layer is electrically conductive and disposed on the front surface. Each switching element includes an element front surface facing in the same direction in which the front surface faces along the thickness direction, a back surface facing in the opposite direction of the element front surface, and a side surface connected to the element front surface and the back surface. The switching elements are electrically bonded to the mounting layer with their back surfaces facing the front surface. The moisture-resistant layer covers at least one side surface. The sealing (Continued)

resin covers the switching elements and the moisture-resistant layer. The moisture-resistant layer is held in contact with the mounting layer and the side surface so as to be spanned between the mounting layer and the side surface in the thickness direction.

30 Claims, 39 Drawing Sheets

(51) Int. Cl.

| | | |
|---|---|---|
| H01L 23/29 | (2006.01) | |
| H01L 23/31 | (2006.01) | |
| H01L 23/373 | (2006.01) | |
| H01L 23/00 | (2006.01) | |

(52) U.S. Cl.
CPC ...... *H01L 23/3107* (2013.01); *H01L 23/3735* (2013.01); *H01L 23/564* (2013.01); *H01L 24/32* (2013.01); *H01L 24/40* (2013.01); *H01L 24/48* (2013.01); *H01L 24/73* (2013.01); *H01L 2224/32225* (2013.01); *H01L 2224/40139* (2013.01); *H01L 2224/40225* (2013.01); *H01L 2224/48096* (2013.01); *H01L 2224/48139* (2013.01); *H01L 2224/48225* (2013.01); *H01L 2224/73263* (2013.01); *H01L 2224/73265* (2013.01); *H01L 2924/13091* (2013.01); *H01L 2924/14252* (2013.01)

(58) Field of Classification Search
CPC ....... H01L 23/564; H01L 24/32; H01L 24/40; H01L 24/48; H01L 24/73
See application file for complete search history.

(56) References Cited

U.S. PATENT DOCUMENTS

| | | |
|---|---|---|
| 2014/0124915 A1 | 5/2014 | Hayashi et al. |
| 2015/0187674 A1 | 7/2015 | Miyanagi |

FOREIGN PATENT DOCUMENTS

| | | |
|---|---|---|
| JP | 1-261850 A | 10/1989 |
| JP | 2006-165151 A | 6/2006 |
| JP | 2013-16684 A | 1/2013 |
| JP | 2013-183038 A | 9/2013 |
| JP | 2016-139691 A | 8/2016 |
| WO | 2013/002249 A1 | 1/2013 |
| WO | 2016/205929 A1 | 12/2016 |

OTHER PUBLICATIONS

Office Action received in the corresponding German patent application, dated Feb. 2, 2022, and English machine translation (14 pages).

Office Action received in the corresponding Chinese Patent application, dated May 7, 2023, and machine translation (24 pages).

* cited by examiner

| Test Items | Present Invention (A14) | Comparative Example (B10) |
|---|---|---|
| H3TRB Test Device Withstand Time (h) | 1000 or more (Acceptable) | 10~500 (Non-acceptable) |
| Insulation Resistance Reduction Rate of Sealing Resin 52 During H3TRB Test (unit: %) | 20 | 84 |

SEMICONDUCTOR DEVICE

TECHNICAL FIELD

The present disclosure relates to a semiconductor device provided with a plurality of switching elements.

BACKGROUND ART

A semiconductor device having a plurality of switching elements such as MOSFET which are electrically-coupled is known. Such a semiconductor device may include a case made of a synthetic resin and a wiring board supported by the case. The switching elements are electrically connected to the wiring board. The case and the wiring board surrounds a space, which may be filled with a sealing resin such as silicone gel. The switching elements are covered with the sealing resin.

In recent years, semiconductor devices with relatively high rating voltages are increasingly demanded in areas with tropical climate near/on the equator. In tropical areas, semiconductor devices are placed in a high temperature and high humidity environment. For a semiconductor device to operate stably in such an environment, it is desirable that the semiconductor device passes the H3TRB (High Humidity High Temperature Reverse Bias) test. The H3TRB test estimates the withstand time (unit: hours) of a semiconductor device when it is driven at 80% of its rated DC voltage under high temperature and high humidity conditions (temperature: 85° C., humidity: 85%). In the H3TRB test, semiconductor devices with withstand time of 1000 h or more are considered as acceptable. The semiconductor devices accepted by this test are expected to operate stably under high temperature and high humidity conditions.

By performing the H3TRB test on the above-described semiconductor devices, the inventors have found that the withstand time of the devices is highly likely to be short of 1000 h. If moisture enters the sealing resin of a semiconductor device placed under high temperature and high humidity conditions, the dielectric breakdown voltage of the sealing resin will deteriorate, which may allow leak current in the switching elements. If the leak current reaches the wiring board, at least one of the switching elements may be destroyed, and consequently, the withstand time of the device will be shortened. With a higher rating voltage, a semiconductor device tends to have a shorter withstand time. Thus, in order to operate stably under high temperature and high humidity conditions, a semiconductor device may need to pass, as a criterion, the H3TRB test for the desired rating voltage.

SUMMARY OF THE INVENTION

In light of the above circumstances, the present disclosure aims to provide a semiconductor device capable of operating stably under high temperature and high humidity conditions.

According to the present disclosure, a semiconductor device is provided. The semiconductor device includes a substrate, a mounting layer, switching elements, a moisture-resistant layer and a sealing resin. The substrate has a front surface facing in a thickness direction. The mounting layer is electrically conductive and disposed on the front surface. Each of the switching elements includes an element front surface facing in a same direction in which the front surface faces along the thickness direction, a back surface facing in the opposite direction of the element front surface, and a side surface connected to both of the element front surface and the back surface. The switching elements are electrically bonded to the mounting layer with the back surface facing the front surface. The moisture-resistant layer covers at least one of the side surfaces. The sealing resin covers both of the switching elements and the moisture-resistant layer. The moisture-resistant layer is held in contact with both of the mounting layer and the side surface so as to be spanned between the mounting layer and the side surface in the thickness direction.

Other features and advantages of the present disclosure will become apparent from the following detailed description with reference to the accompanying drawings.

MODE FOR CARRYING OUT THE INVENTION

Modes for carrying out the disclosure (hereinafter referred to as embodiments) are described below with reference to the accompanying drawings.

First Embodiment

Figure 2:
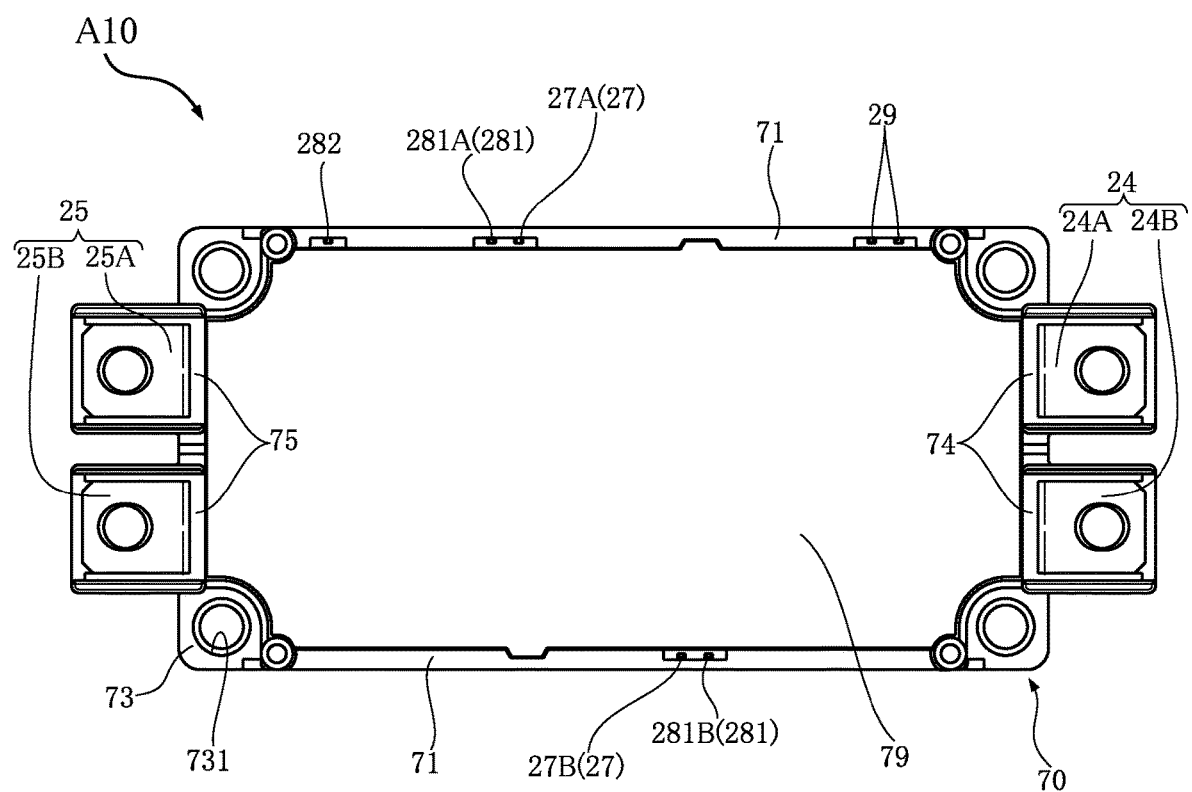
FIG. 2 is a plan view of the semiconductor device shown in FIG. 1.
Figure 2:
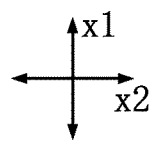
Figure 3:
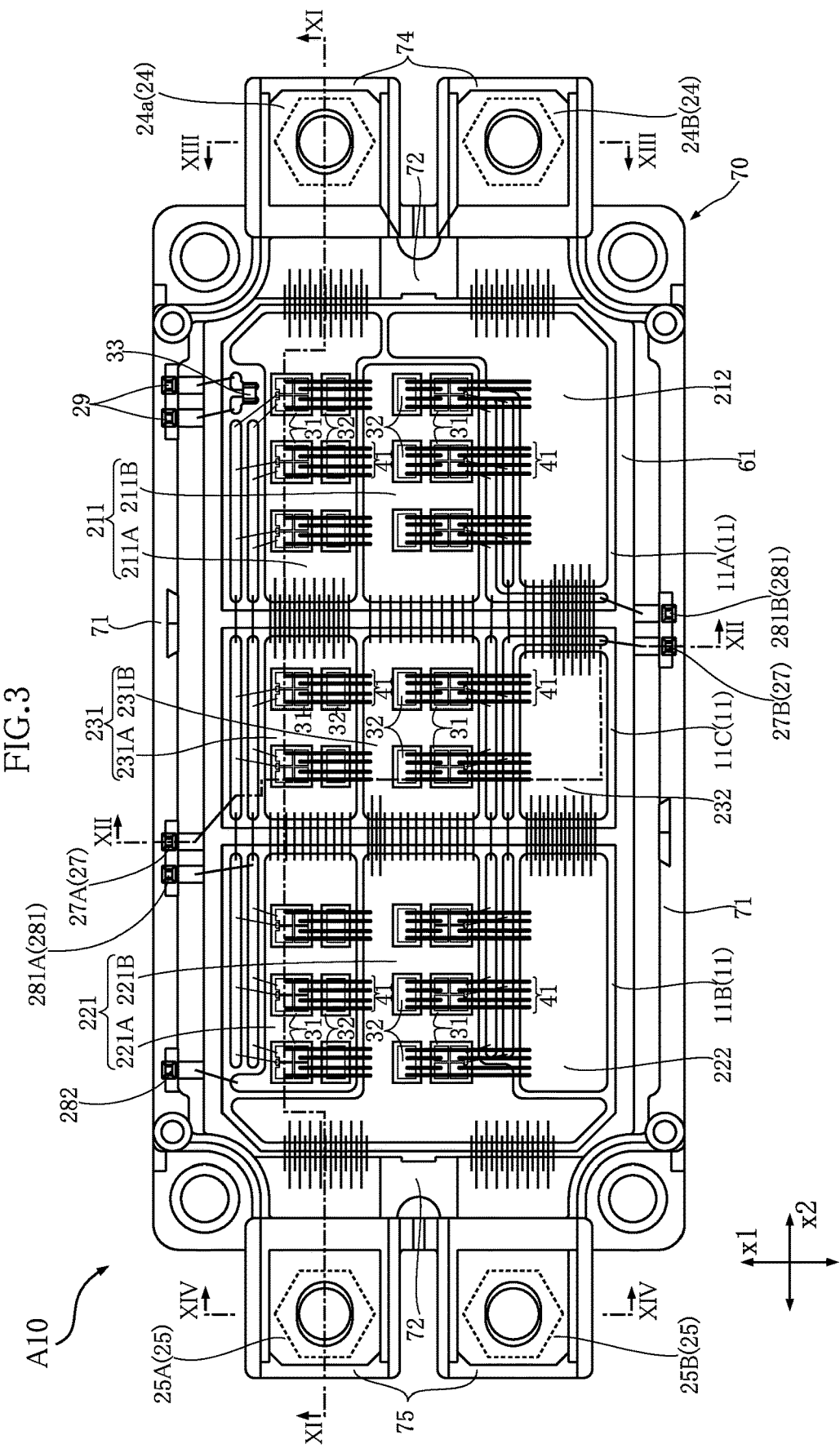
FIG. 3 is a plan view of the semiconductor device shown in FIG. 1 (as seen through a sealing resin, a moisture-resistant layer and a top plate)
Figure 11:
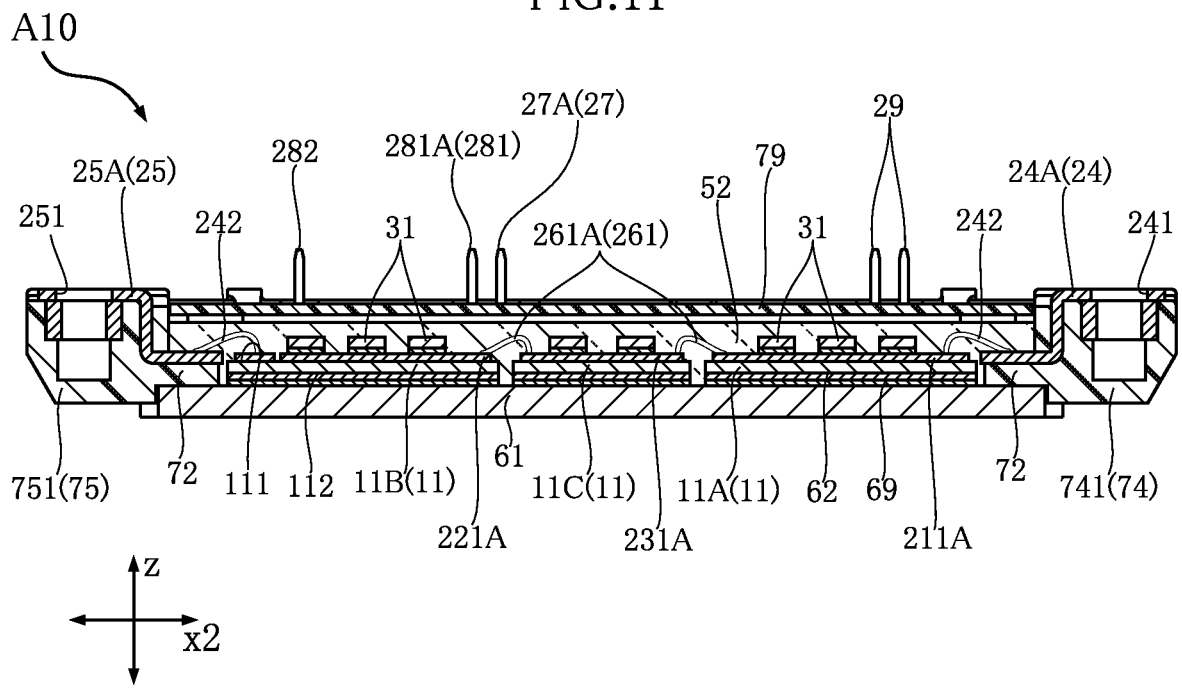
FIG. 11 is a sectional view taken along line XI-XI in FIG. 3.
Figure 12:
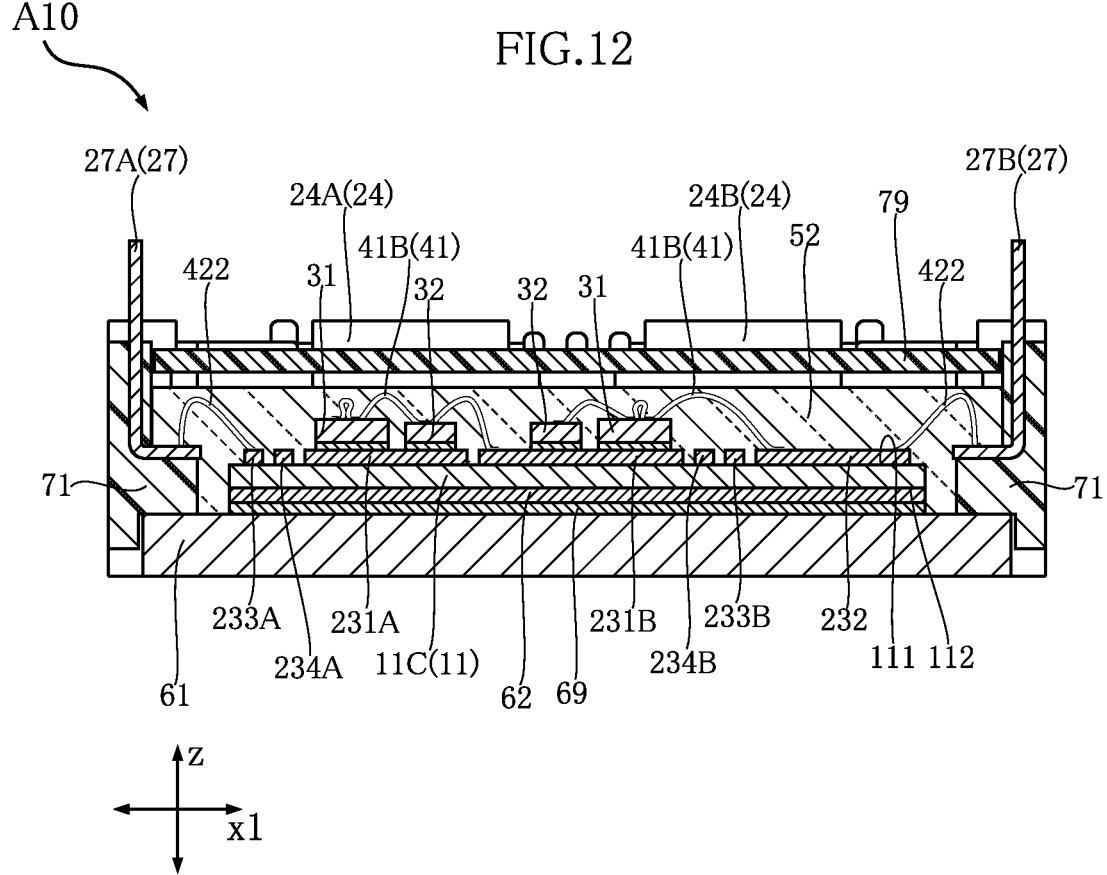
FIG. 12 is a sectional view taken along line XII-XII in FIG. 3.

With reference to FIGS. 1 to 23, a semiconductor device A10 according to a first embodiment of the present disclosure is described. The semiconductor device A10 includes a substrate 11, a first mounting layer 211, a second mounting layer 221, a third mounting layer 231, switching elements 31, a moisture-resistant layer 51 and a sealing resin 52. Of these, the first mounting layer 211, the second mounting layer 221 and the third mounting layer 231 are examples of the "mounting layer" as set forth in the appended claims of the present disclosure. In addition to these, the semiconductor device A10 further includes a first electroconductive layer 212, a second electroconductive layer 222, a third electroconductive layer 232, a power supply terminal 24, an output terminal 25, a connecting electroconductive member 261, protective elements 32, wires 41, a heat sink 61 and a case 70. Of these, the first electroconductive layer 212, the second electroconductive layer 222 and the third electroconductive layer 232 are examples of the "electroconductive layer" asset forth in the appended claims of the present disclosure. The power supply terminal 24 includes a first power supply terminal 24A and a second power supply terminal 24B. For easier understanding, FIG. 3 shows a view seen through the moisture-resistant layer 51, the sealing resin 52 and a top plate 79. In FIG. 3, the line XI-XI and the line XII-XII are indicated by dash-dotted lines. In FIGS. 11 and 12, illustration of the moisture-resistant layer 51 is omitted.

Figure 1:
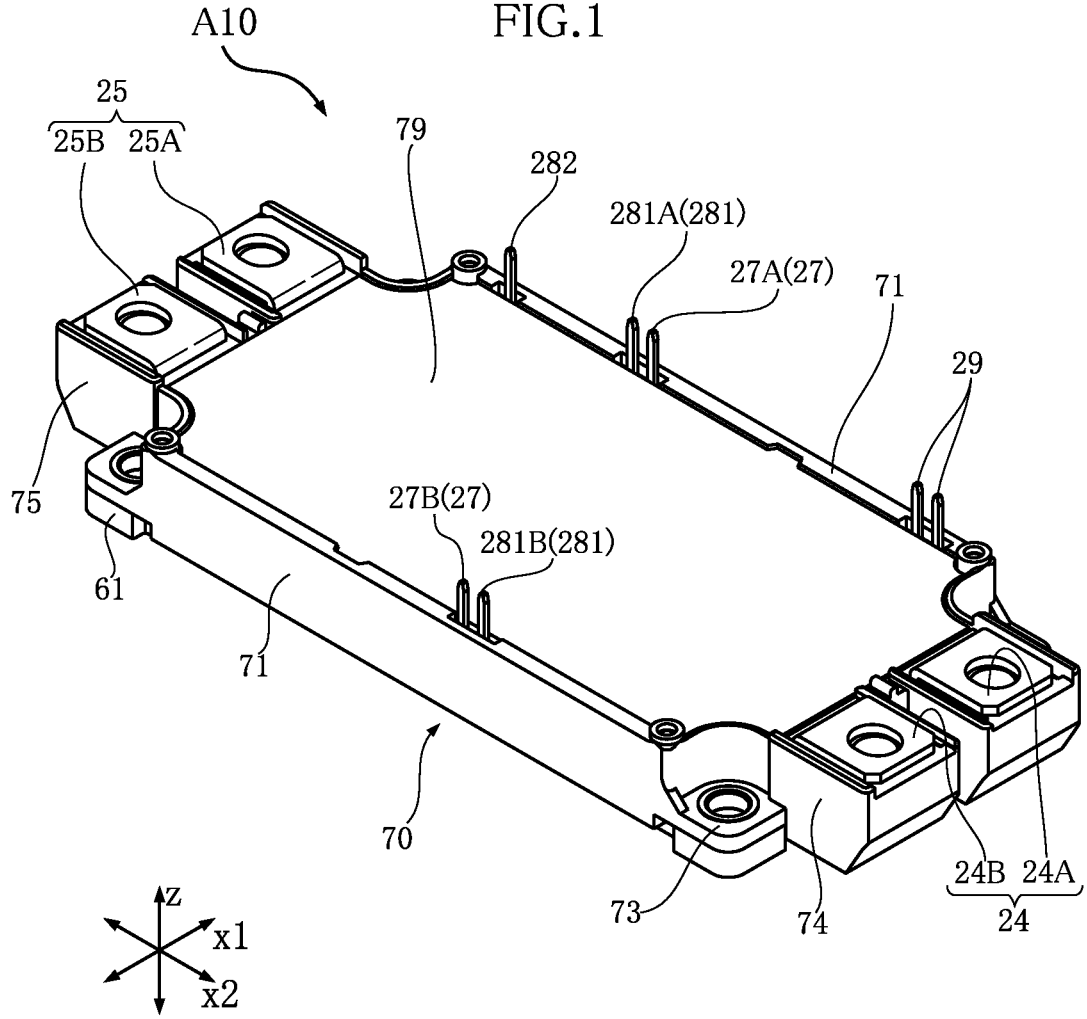
FIG. 1 is a perspective view of a semiconductor device according to a first embodiment of the present disclosure.

The semiconductor device A10 shown in FIG. 1 is a power module. The semiconductor device A10 may be used for inverter devices of various electric products. As shown in FIGS. 1 and 2, the semiconductor device A10 is rectangular as viewed in the thickness direction z of the substrate 11. For convenience of explanation, a direction that is perpendicular to the thickness direction z of the substrate 11 (hereinafter simply "thickness direction z") is referred to as the "first direction x1". The direction that is perpendicular to both of the thickness direction z and the first direction x1 is referred to as the "second direction x2". The longitudinal direction of the semiconductor device A10 is the second direction x2.

The substrate 11 is an electrically insulating member on which the mounting layer (the first mounting layer 211, the second mounting layer 221 and the third mounting layer 231) and the electroconductive layer (the first electroconductive layer 212, the second electroconductive layer 222 and the third electroconductive layer 232) are disposed, as shown in FIG. 3. The substrate 11 has three sections, namely a first substrate 11A, a second substrate 11B and a third substrate 11C. The first substrate 11A, the second substrate 11B and the third substrate 11C are spaced apart from each other in the second direction x2. In the second direction x2, the third substrate 11C is located between the first substrate 11A and the second substrate 11B. Unlike this configuration, the substrate 11 may have two sections, namely the first substrate 11A and the second substrate 11B, or may only have a single section. As shown in FIG. 11, each of the first substrate 11A, the second substrate 11B and the third substrate 11C has a front surface 111 and a back surface 112 facing away from each other in the thickness direction z.

The substrate 11 is made of a ceramic with excellent thermal conductivity. Examples of such a ceramic include aluminum nitride (AlN). A DBC (Direct Bonding Copper) substrate, which has copper (Cu) foils bonded to the front surface 111 and the back surface 112, may be used as the substrate 11. By using a DBC substrate, the mounting layer and the electroconductive layer can be easily formed through patterning of the copper foil bonded to the front surface 111. The copper foil bonded to the back surface 112 can be formed into a heat transfer layer 62 (described later).

Figure 8:
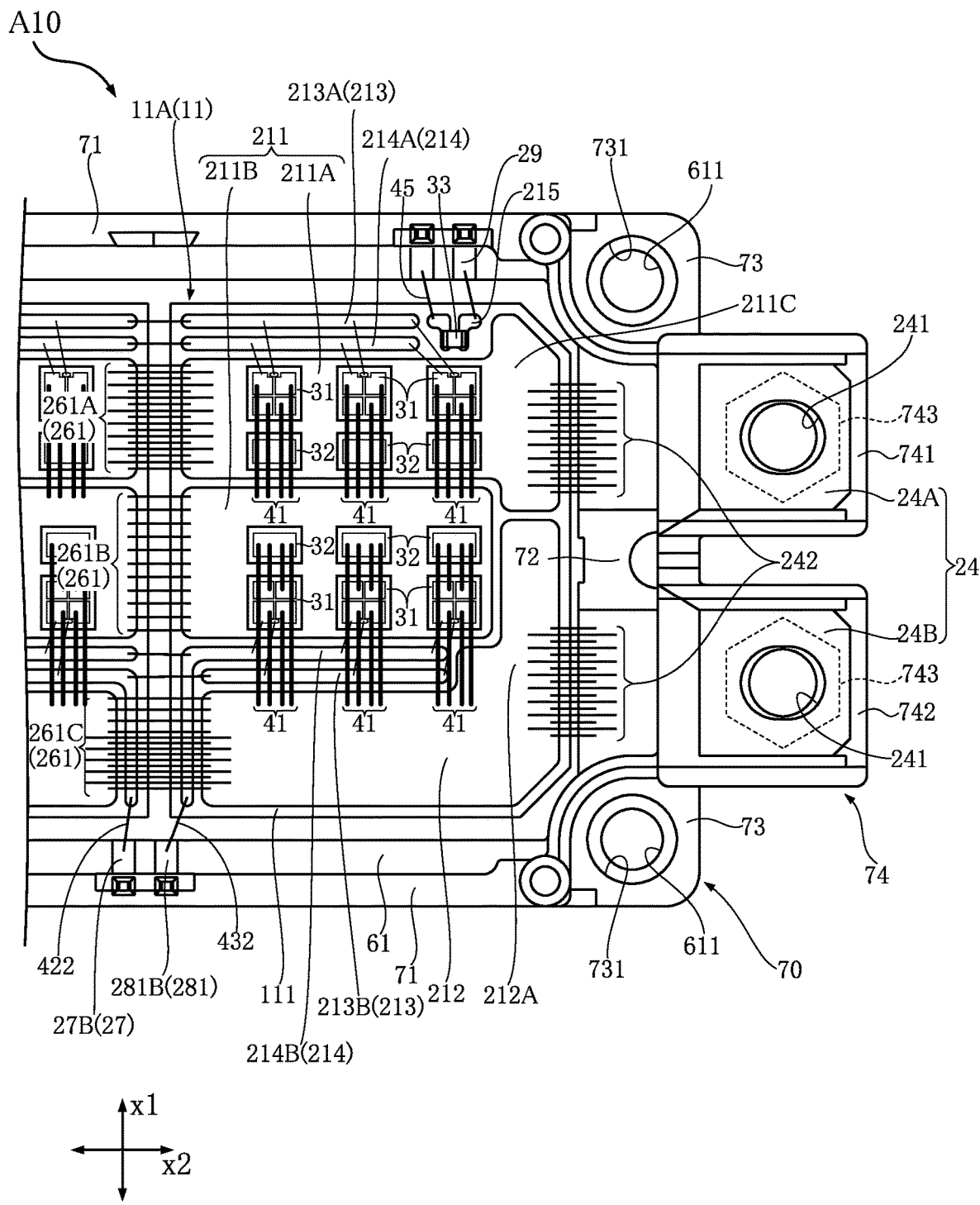
FIG. 8 shows a right portion (near the first substrate) of FIG. 3 as enlarged.

As shown in FIGS. 3 and 8, on the front surface 111 of the first substrate 11A are disposed the first mounting layer 211, the first electroconductive layer 212, a first gate layer 213, a first detection layer 214 and a thermistor mounting layer 215. These are electroconductive members made of a thin metal film such as a copper foil. The surfaces of these layers may be plated with silver (Ag), for example.

As shown in FIG. 8, switching elements 31 and protective elements 32 are electrically bonded to the first mounting layer 211. The first mounting layer 211 includes a first upper arm mounting layer 211A and a first lower arm mounting layer 211B.

As shown in FIG. 8, the first upper arm mounting layer 211A is offset toward one end of the first substrate 11A (upper side in FIG. 8) in the first direction x1. The first upper arm mounting layer 211A is in the form of a strip extending along the second direction x2. Three switching elements 31 and three protective elements 32 are electrically bonded to the first upper arm mounting layer 211A. Note that the number of switching elements 31 and the number of the protective elements 32 to be electrically bonded to the first upper arm mounting layer 211A are not limited to three. On the first upper arm mounting layer 211A, both of the switching elements 31 and the protective elements 32 are aligned in the second direction x2. The first upper arm mounting layer 211A is formed with a first power supply pad 211C in the form of a strip extending along the first direction x1 at an end close to the case 70 in the second direction x2. The first power supply pad 211C is electrically connected to the first power supply terminal 24A.

Figure 15:
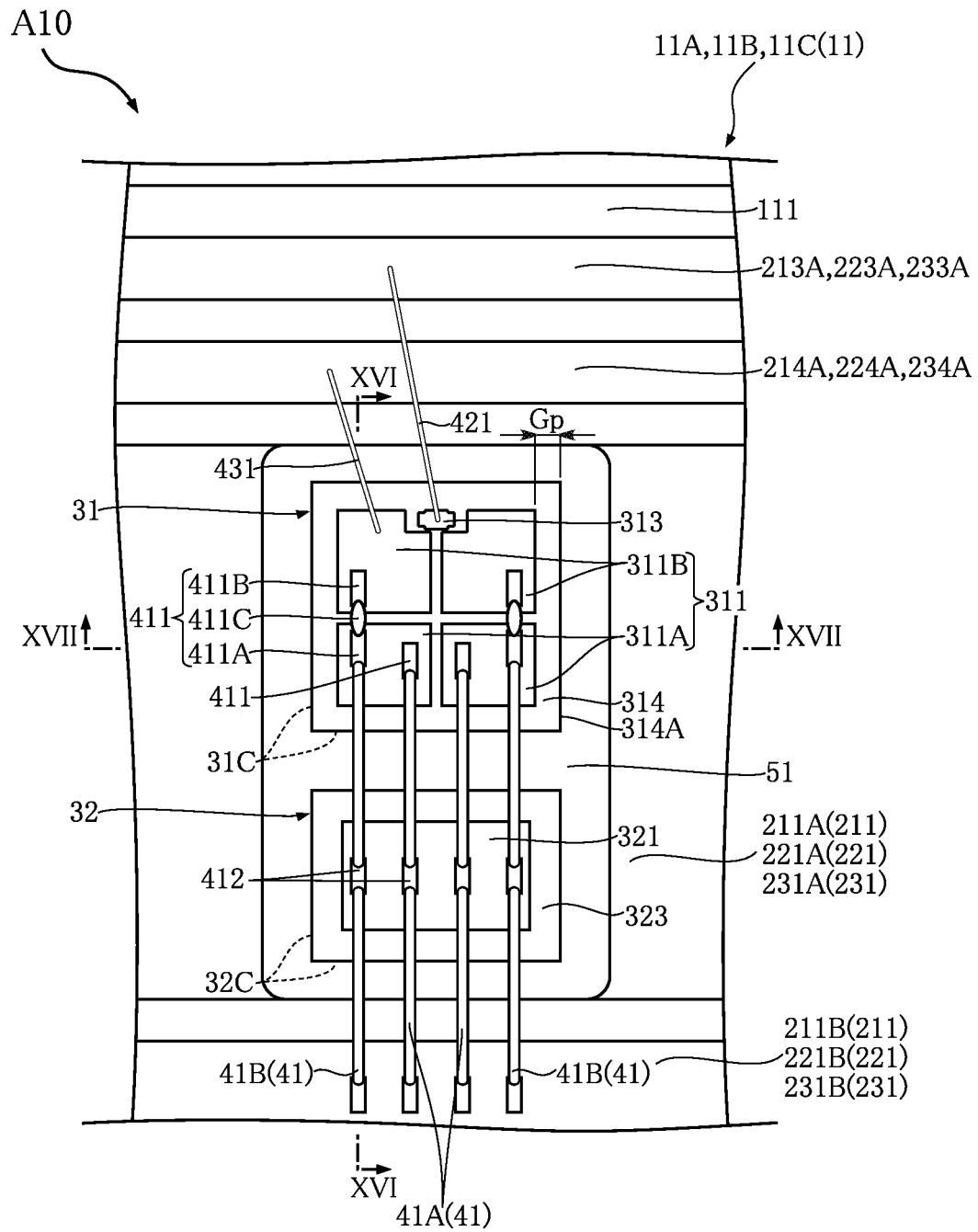
FIG. 15 shows a portion of FIG. 3 (a switching element and a protective element bonded to an upper arm mounting layer) as enlarged.

As shown in FIG. 8, the first lower arm mounting layer 211B is located between the first upper arm mounting layer 211A and the first electroconductive layer 212 in the first direction x1. The first lower arm mounting layer 211B is in the form of a strip extending along the second direction x2. Three switching elements 31 and three protective elements 32 are electrically bonded to the first lower arm mounting layer 211B. Note that the number of switching elements 31 and the number of the protective elements 32 to be electrically bonded to the first lower arm mounting layer 211B are not limited to three. On the first lower arm mounting layer 211B, both of the switching elements 31 and the protective elements 32 are aligned in the second direction x2. As shown in FIG. 15, the first lower arm mounting layer 211B is electrically connected, via wires 41, to both of the front surface electrodes 311 (described later) of the switching elements 31 and anode electrodes 321 (described later) of the protective elements 32 that are electrically bonded to the first upper arm mounting layer 211A.

Figure 18:
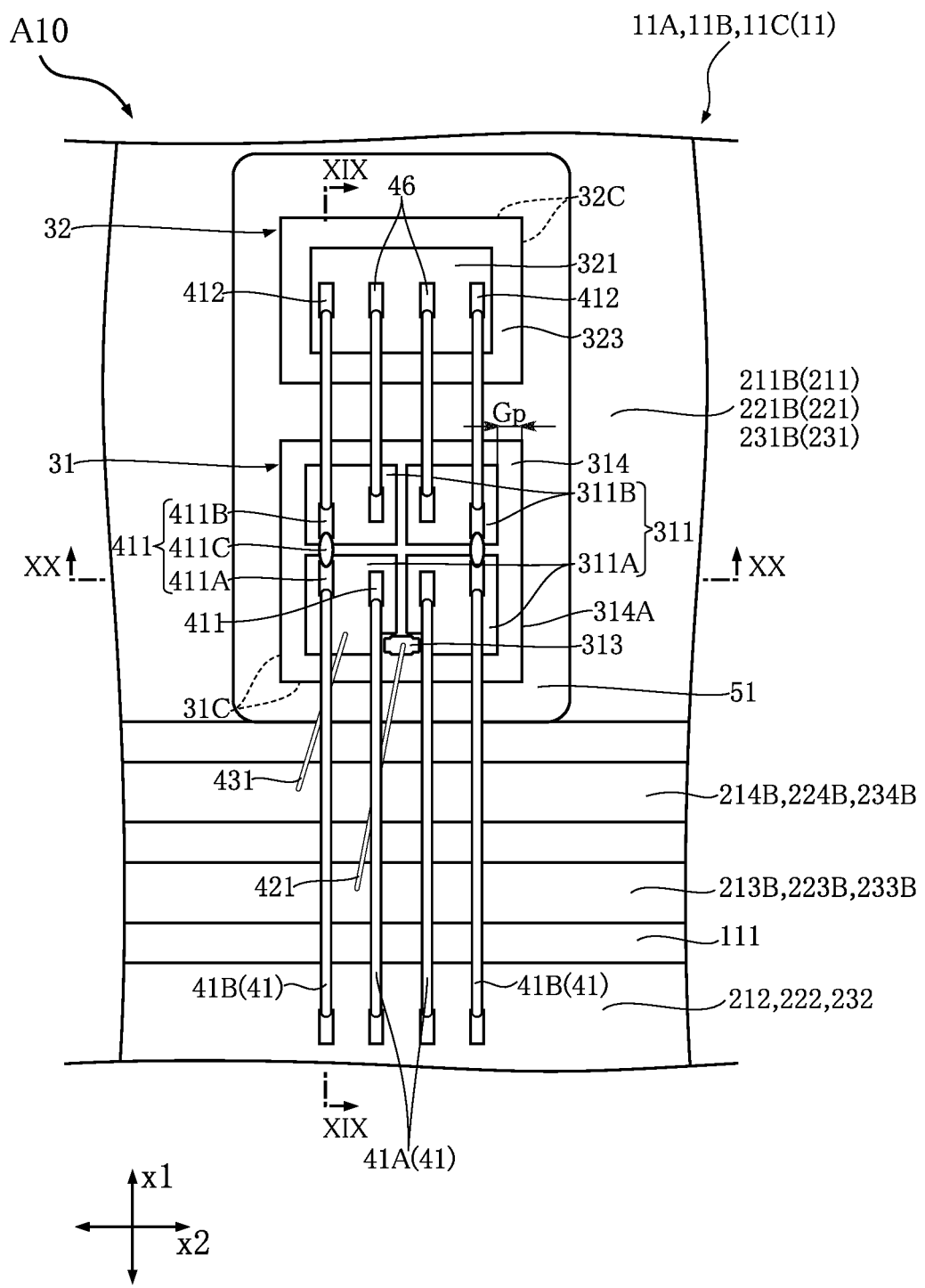
FIG. 18 shows a portion of FIG. 3 (a switching element and a protective element bonded to a lower arm mounting layer) as enlarged.

As shown in FIGS. 8 and 18, the first electroconductive layer 212 is electrically connected, via wires 41, to the front surface electrodes 311 of the switching elements 31 and the anode electrodes 321 of the protective elements 32 that are electrically bonded to the first lower arm mounting layer 211B. The first electroconductive layer 212 is offset toward the other end of the first substrate 11A (lower side in FIG. 8) in the first direction x1. The first electroconductive layer 212 is in the form of a strip extending along the second direction x2. The first electroconductive layer 212 is formed with a second power supply pad 212A in the form of a strip extending along the first direction x1 at an end close to the case 70 in the second direction x2. The second power supply pad 212A is electrically connected to the second power supply terminal 24B.

As shown in FIGS. 15 and 18, the first gate layer 213 is electrically connected, via first gate wires 421, to gate electrodes 313 (described later) of the switching elements 31 electrically bonded to the first mounting layer 211. The first gate layer 213 is in the form of a strip extending along the second direction x2 and faces the switching elements 31 as viewed in the thickness direction z. The first gate layer 213 includes a first upper arm gate layer 213A and a first lower arm gate layer 213B.

As shown in FIG. 8, the first upper arm gate layer 213A is located between the first upper arm mounting layer 211A and the case 70 in the first direction x1. As viewed in the thickness direction z, the first upper arm gate layer 213A faces the switching elements 31 electrically bonded to the first upper arm mounting layer 211A. As shown in FIG. 15, the first upper arm gate layer 213A is electrically connected, via first gate wires 421, to the gate electrodes 313 of the switching elements 31 electrically bonded to the first upper arm mounting layer 211A.

As shown in FIG. 8, the first lower arm gate layer 213B is located between the first lower arm mounting layer 211B and the first electroconductive layer 212 in the first direction x1. As viewed in the thickness direction z, the first lower arm gate layer 213B faces the switching elements 31 electrically bonded to the first lower arm mounting layer 211B. As shown in FIG. 18, the first lower arm gate layer 213B is electrically connected, via first gate wires 421, to the gate electrodes 313 of the switching elements 31 electrically bonded to the first lower arm mounting layer 211B.

As shown in FIGS. 15 and 18, the first detection layer 214 is electrically connected, via first detection wires 431, to the front surface electrodes 311 of the switching elements 31 electrically bonded to the first mounting layer 211. The first detection layer 214 is in the form of a strip extending along the second direction x2 and faces the switching elements 31 as viewed in the thickness direction z. The first detection layer 214 includes a first upper arm detection layer 214A and a first lower arm detection layer 214B.

As shown in FIG. 8, the first upper arm detection layer 214A is located between the first upper arm mounting layer 211A and the first upper arm gate layer 213A in the first direction x1. As viewed in the thickness direction z, the first upper arm detection layer 214A faces the switching elements 31 electrically bonded to the first upper arm mounting layer 211A. As shown in FIG. 15, the first upper arm detection layer 214A is electrically connected, via first detection wires 431, to the front surface electrodes 311 of the switching elements 31 electrically bonded to the first upper arm mounting layer 211A.

As shown in FIG. 8, the first lower arm detection layer 214B is located between the first lower arm mounting layer 211B and the first lower arm gate layer 213B in the first direction x1. The first lower arm detection layer 214B is in the form of an L-shaped strip with a part extending in the first direction x1 and a part extending in the second direction x2. As viewed in the thickness direction z, the part extending in the second direction x2 faces the switching elements 31 electrically bonded to the first lower arm mounting layer 211B. As shown in FIG. 18, the first lower arm detection layer 214B is electrically connected, via first detection wires 431, to the front surface electrodes 311 of the switching elements 31 electrically bonded to the first lower arm mounting layer 211B.

As shown in FIG. 8, a thermistor 33 is electrically bonded to the thermistor mounting layer 215. The thermistor mounting layer 215 is located close to a corner of the first substrate 11A. The thermistor mounting layer 215 is surrounded by the first upper arm mounting layer 211A, the first upper arm gate layer 213A and the first upper arm detection layer 214A. The thermistor mounting layer 215 has a pair of sections spaced apart from each other in the second direction x2. The positive electrode of the thermistor 33 is electrically bonded to one of these sections, whereas the negative electrode of the thermistor 33 is electrically bonded to the other one of these sections.

Figure 9:
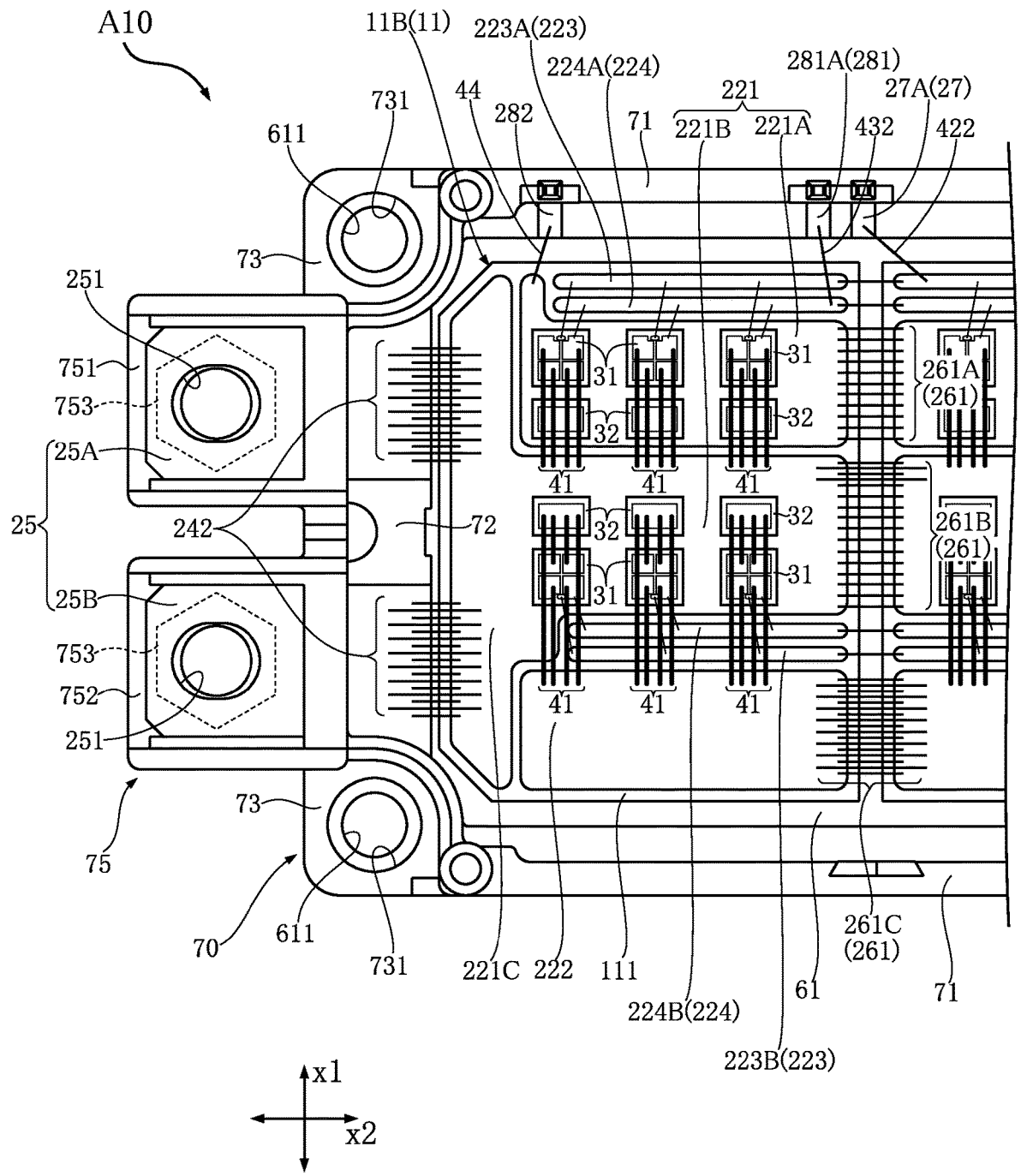
FIG. 9 shows a left portion (near the second substrate) of FIG. 3 as enlarged.

As shown in FIGS. 3 and 9, on the front surface 111 of the second substrate 11B are disposed the second mounting layer 211, the second electroconductive layer 222, a second gate layer 223 and a second detection layer 224. These are electroconductive members made of a thin metal film such as a copper foil. The surfaces of these layers may be plated with silver, for example.

As shown in FIG. 9, switching elements 31 and protective elements 32 are electrically bonded to the second mounting layer 221. The second mounting layer 221 includes a second upper arm mounting layer 221A and a second lower arm mounting layer 221B.

As shown in FIG. 9, the second upper arm mounting layer 221A is offset toward one end of the second substrate 11B (upper side in FIG. 9) in the first direction x1. The second upper arm mounting layer 221A is in the form of a strip extending along the second direction x2. Three switching elements 31 and three protective elements 32 are electrically bonded to the second upper arm mounting layer 211A. Note that the number of switching elements 31 and the number of the protective elements 32 to be electrically bonded to the second upper arm mounting layer 221A are not limited to three. On the second upper arm mounting layer 221A, both of the switching elements 31 and the protective element 32 are aligned in the second direction x2.

As shown in FIG. 9, the second lower arm mounting layer 221B is located between the second upper arm mounting layer 221A and the second electroconductive layer 222 in the first direction x1. The second lower arm mounting layer 221B is in the form of a strip extending along the second direction x2. Three switching elements 31 and three protective elements 32 are electrically bonded to the second lower arm mounting layer 221B. Note that the number of switching elements 31 and the number of the protective elements 32 to be electrically bonded to the second lower arm mounting layer 221B are not limited to three. On the second lower arm mounting layer 221B, both of the switching elements 31 and the protective element 32 are aligned in the second direction x2. As shown in FIG. 15, the second lower arm mounting layer 221B is electrically connected, via wires 41, to the front surface electrodes 311 of the switching elements 31 and the anode electrodes 321 of the protective elements 32 that are electrically bonded to the second upper arm mounting layer 221A. The second lower arm mounting layer 221B is formed with an output pad 221C in the form of a strip extending along the first direction x1 at an end close to the case 70 in the second direction x2. In the second direction x2, the output pad 221C is close to both of the second upper arm mounting layer 221A and the second electroconductive layer 222. The output pad 221C is electrically connected to the output terminal 25.

As shown in FIGS. 9 and 18, the second electroconductive layer 222 is electrically connected, via wires 41, to the front surface electrodes 311 of the switching elements 31 and the anode electrodes 321 of the protective elements 32 that are electrically bonded to the second lower arm mounting layer 221B. The second electroconductive layer 222 is offset toward the other end of the second substrate 11B (lower side in FIG. 9) in the first direction x1. The second electroconductive layer 222 is in the form of a strip extending along the second direction x2.

As shown in FIGS. 15 and 18, the second gate layer 223 is electrically connected, via first gate wires 421, to the gate electrodes 313 of the switching elements 31 electrically bonded to the second mounting layer 221. The second gate layer 223 is in the form of a strip extending along the second direction x2 and faces the switching elements 31 as viewed in the thickness direction z. The second gate layer 223 includes a second upper arm gate layer 223A and a second lower arm gate layer 223B.

As shown in FIG. 9, the second upper arm gate layer 223A is located between the second upper arm mounting layer 221A and the case 70 in the first direction x1. As viewed in the thickness direction z, the second upper arm gate layer 223A faces the switching elements 31 electrically bonded to the second upper arm mounting layer 221A. As shown in FIG. 15, the second upper arm gate layer 223A is electrically connected, via first gate wires 421, to the gate electrodes 313 of the switching elements 31 electrically bonded to the second upper arm mounting layer 221A.

As shown in FIG. 9, the second lower arm gate layer 223B is located between the second lower arm mounting layer 221B and the second electroconductive layer 222 in the first direction x1. As viewed in the thickness direction z, the second lower arm gate layer 223B faces the switching elements 31 electrically bonded to the second lower arm mounting layer 221B. As shown in FIG. 18, the second lower arm gate layer 223B is electrically connected, via first gate wires 421, to the gate electrodes 313 of the switching elements 31 electrically bonded to the second lower arm mounting layer 221B.

As shown in FIGS. 15 and 18, the second detection layer 224 is electrically connected, via first detection wires 431, to the front surface electrodes 311 of the switching elements 31 electrically bonded to the second mounting layer 221. The second detection layer 224 is in the form of a strip extending along the second direction x2 and faces the switching elements 31 as viewed in the thickness direction z. The second detection layer 224 includes a second upper arm detection layer 224A and a second lower arm detection layer 224B.

As shown in FIG. 9, the second upper arm detection layer 224A is located between the second upper arm mounting layer 221A and the second upper arm gate layer 223A in the first direction x1. As viewed in the thickness direction z, the second upper arm detection layer 224A faces the switching elements 31 electrically bonded to the second upper arm mounting layer 221A. As shown in FIG. 15, the second upper arm detection layer 224A is electrically connected, via first detection wires 431, to the front surface electrodes 311 of the switching elements 31 electrically bonded to the second upper arm mounting layer 221A.

As shown in FIG. 9, the second lower arm detection layer 224B is located between the second lower arm mounting layer 221B and the second lower arm gate layer 223B in the first direction x1. As viewed in the thickness direction z, the second lower arm detection layer 224B faces the switching elements 31 electrically bonded to the second lower arm mounting layer 221B. As shown in FIG. 18, the second lower arm detection layer 224B is electrically connected, via first detection wires 431, to the front surface electrodes 311 of the switching elements 31 electrically bonded to the second lower arm mounting layer 221B.

Figure 10:
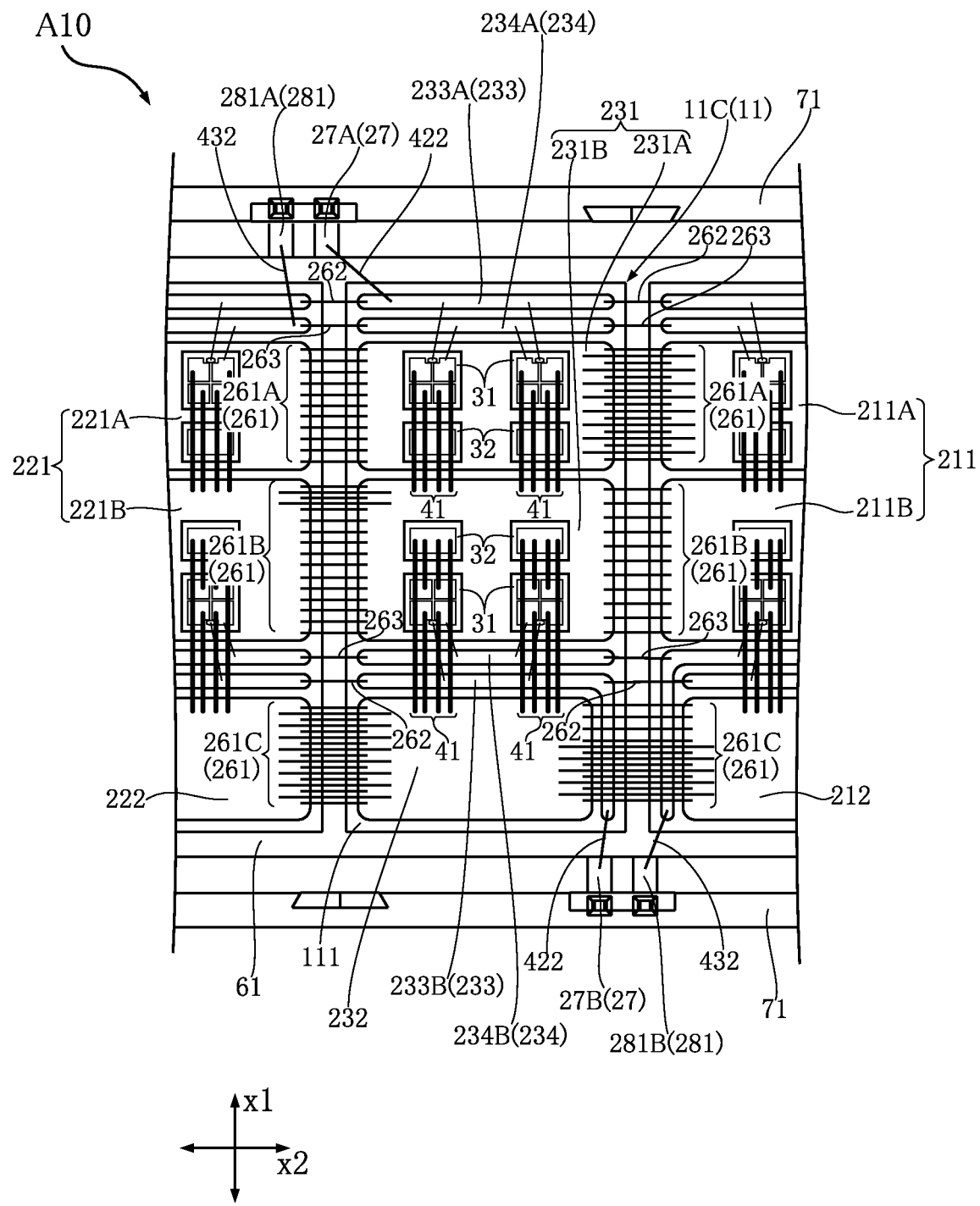
FIG. 10 shows a central portion (near the third substrate) of FIG. 3 as enlarged.

As shown in FIGS. 3 and 10, on the front surface 111 of the third substrate 11C are disposed the third mounting layer 231, the third electroconductive layer 232, a third gate layer 233 and a third detection layer 234. These are electroconductive members made of a thin metal film such as a copper foil. The surfaces of these layers may be plated with silver, for example.

As shown in FIG. 10, switching elements 31 and protective elements 32 are electrically bonded to the third mounting layer 231. The third mounting layer 231 includes a third upper arm mounting layer 231A and a third lower arm mounting layer 231B.

As shown in FIG. 10, the third upper arm mounting layer 231A is offset toward one end of the third substrate 11C (upper side in FIG. 10) in the first direction x1. The third upper arm mounting layer 231A is in the form of a strip extending along the second direction x2. Two switching elements 31 and two protective elements 32 are electrically bonded to the third upper arm mounting layer 231A. Note that the number of switching elements 31 and the number of the protective elements 32 to be electrically bonded to the third upper arm mounting layer 231A are not limited to two. On the third upper arm mounting layer 231A, both of the switching elements 31 and the protective element 32 are aligned in the second direction x2.

As shown in FIG. 10, the third lower arm mounting layer 231B is located between the third upper arm mounting layer 231A and the third electroconductive layer 232 in the first direction x1. The third lower arm mounting layer 231B is in the form of a strip extending along the second direction x2. Two switching elements 31 and two protective elements 32 are electrically bonded to the third lower arm mounting layer 231B. Note that the number of switching elements 31 and the number of the protective element 32 to be electrically bonded to the third lower arm mounting layer 231B are not limited to two. On the third lower arm mounting layer 231B, both of the switching elements 31 and the protective element 32 are aligned in the second direction x2. As shown in FIG. 15, the third lower arm mounting layer 231B is electrically connected, via wires 41, to the front surface electrodes 311 of the switching elements 31 and the anode electrodes 321 of the protective elements 32 that are electrically bonded to the third upper arm mounting layer 231A.

As shown in FIGS. 10 and 18, the third electroconductive layer 232 is electrically connected, via wires 41, to the front surface electrodes 311 of the switching elements 31 and the anode electrodes 321 of the protective elements 32 that are electrically bonded to the third lower arm mounting layer 231B. The third electroconductive layer 232 is offset toward the other end of the third substrate 11C (lower side in FIG. 10) in the first direction x1. The third electroconductive layer 232 is in the form of a strip extending along the second direction x2.

As shown in FIGS. 15 and 18, the third gate layer 233 is electrically connected, via first gate wires 421, to the gate electrodes 313 of the switching elements 31 electrically bonded to the third mounting layer 231. The third gate layer 233 is in the form of a strip extending along the second direction x2 and faces the switching elements 31 as viewed in the thickness direction z. The third gate layer 233 includes a third upper arm gate layer 233A and a third lower arm gate layer 233B.

As shown in FIG. 10, the third upper arm gate layer 233A is located between the third upper arm mounting layer 231A and the case 70 in the first direction x1. As viewed in the thickness direction z, the third upper arm gate layer 233A faces the switching elements 31 electrically bonded to the third upper arm mounting layer 231A. As shown in FIG. 15, the third upper arm gate layer 233A is electrically connected, via first gate wires 421, to the gate electrodes 313 of the switching elements 31 electrically bonded to the third upper arm mounting layer 231A.

As shown in FIG. 10, the third lower arm gate layer 233B is located between the third lower arm mounting layer 231B and the third electroconductive layer 232 in the first direction x1. The third lower arm gate layer 233B is in the form of an L-shaped strip with a part extending in the first direction x1 and a part extending in the second direction x2. As viewed in the thickness direction z, the part extending in the second direction x2 faces the switching elements 31 electrically bonded to the third lower arm mounting layer 231B. As shown in FIG. 18, the third lower arm gate layer 233B is electrically connected, via first gate wires 421, to the gate electrodes 313 of the switching elements 31 electrically bonded to the third lower arm mounting layer 231B.

As shown in FIGS. 15 and 18, the third detection layer 234 is electrically connected, via first detection wires 431, to the front surface electrodes 311 of the switching elements 31 electrically bonded to the third mounting layer 231. The third detection layer 234 is in the form of a strip extending along the second direction x2 and faces the switching elements 31 as viewed in the thickness direction z. The third detection layer 234 includes a third upper arm detection layer 234A and a third lower arm detection layer 234B.

As shown in FIG. 10, the third upper arm detection layer 234A is located between the third upper arm mounting layer 231A and the third upper arm gate layer 233A in the first direction x1. As viewed in the thickness direction z, the third upper arm detection layer 234A faces the switching elements 31 electrically bonded to the third upper arm mounting layer 231A. As shown in FIG. 15, the third upper arm detection layer 234A is electrically connected, via first detection wires 431, to the front surface electrodes 311 of the switching elements 31 electrically bonded to the third upper arm mounting layer 231A.

As shown in FIG. 10, the third lower arm detection layer 234B is located between the third lower arm mounting layer 231B and the third lower arm gate layer 233B in the first direction x1. As viewed in the thickness direction z, the third lower arm detection layer 234B faces the switching elements 31 electrically bonded to the third lower arm mounting layer 231B. As shown in FIG. 18, the third lower arm detection layer 234B is electrically connected, via first detection wires 431, to the front surface electrodes 311 of the switching elements 31 electrically bonded to the third lower arm mounting layer 231B.

The first upper arm mounting layer 211A, the second upper arm mounting layer 221A and the third upper arm mounting layer 231A respectively correspond to sections of the "upper arm mounting layer" as set forth in the appended claims of the present disclosure. The first lower arm mounting layer 211B, the second lower arm mounting layer 221B and the third lower arm mounting layer 231B respectively correspond to sections of the "lower arm mounting layer" as set forth in the appended claims of the present disclosure.

As shown in FIGS. 2 and 3, the power supply terminal 24 is an element of an external connection terminal provided in the semiconductor device A10. As described before, the power supply terminal 24 includes a first power supply terminal 24A and a second power supply terminal 24B. The power supply terminal 24 is supported on the case 70 and connected to a DC power supply arranged outside the semiconductor device A10. The power supply terminal 24 is made of a thin metal plate such as a copper plate. The surface of the thin metal plate may be plated with nickel (Ni). The first power supply terminal 24A is the positive electrode (P-terminal) of the semiconductor device A10. The second power supply terminal 24B is the negative electrode (N-terminal) of the semiconductor device A10. The first power supply terminal 24A and the second power supply terminal 24B are spaced apart from each other in the first direction x1. The first power supply terminal 24A and the second power supply terminal 24B have the same shape.

As shown in FIG. 11, the power supply terminal 24 is bent into a hook shape as viewed in the first direction x1. The power supply terminal 24 is formed with a coupling hole 241 penetrating the terminal in the thickness direction z at a portion exposed outside the semiconductor device A10 and extending perpendicularly to the thickness direction z. Into the coupling hole 241, a fastening member such as a bolt is inserted. As shown in FIG. 8, a connection member 242 with electrical conductivity is connected to a portion of the power supply terminal 24 that is located inside the case 70 and that extends perpendicularly to the thickness direction z. For example, the connection member 242 includes a plurality of wires made of aluminum (Al). The connection member 242 connected to the first power supply terminal 24A is connected at its other end to the power supply pad 211C of the first upper arm mounting layer 211A. Thus, with this connection member 242, the first power supply terminal 24A is electrically connected to the first upper arm mounting layer 211A. The connection member 242 connected to the second power supply terminal 24B is connected, at its other end, to the second power supply pad 212A of the first electroconductive layer 212. Thus, with this connection member 242, the second power supply terminal 24B is electrically connected to the first electroconductive layer 212.

As shown in FIGS. 2 and 3, the output terminal 25 is an element of an external connection terminal provided in the semiconductor device A10. The output terminal 25 is divided into two, namely a first output terminal 25A and a second output terminal 25B. Note that the output terminal 25 may be configured as a single unit that is not divided into multiple parts. The output terminal 25 is supported on the case 70 and connected to a driving target such as a motor arranged outside the semiconductor device A10. The output terminal 25 is located opposite to the power supply terminal 24 across the substrate 11 in the second direction x2. The output terminal 25 is made of the same thin metal film as the power supply terminal 24. The surface of the thin metal plate may be plated with nickel. The first output terminal 25A and the second output terminal 25B are connected in parallel to the second lower arm mounting layer 221B. The first output terminal 25A and the second output terminal 25B are each connected to a driving target of the semiconductor device A10 that is externally arranged. In the second direction x2, the first output terminal 25A faces the first power supply terminal 24A, whereas the second output terminal 25B faces the second power supply terminal 24B. The first output terminal 25A and the second output terminal 25B are spaced apart from each other in the first direction x1. The first output terminal 25A and the second output terminal 25B have the same shape.

As shown in FIG. 11, the output terminal 25 is bent into a hook shape as viewed in the first direction x1. The output terminal 25 is formed with a coupling hole 251 penetrating the terminal in the thickness direction z at a portion exposed outside the semiconductor device A10 and extending perpendicularly to the thickness direction z. Into the coupling hole 251, a fastening member such as a bolt is inserted. As shown in FIG. 9, a connection member 252 with electrical conductivity is connected to a portion of the output terminal 25 that is located inside the case 70 and that extends perpendicularly to the thickness direction z. For example, the connection member 252 includes a plurality of wires made of aluminum. The connection member 252 connected to the output terminal 25 is connected at its other end to the output pad 221C of the second lower arm mounting layer 221B disposed on the second substrate 11B. Thus, with the connection member 25, the output terminal 25 is electrically connected to the second lower arm mounting layer 221B.

As shown in FIG. 10, the connecting electroconductive member 261 connects the first mounting layer 211 and the third mounting layer 231 to each other, and also connects the second mounting layer 221 and the third mounting layer 231 to each other. Thus, the first mounting layer 211, the second mounting layer 221 and the third mounting layer 231 are electrically connected to each other via the connecting electroconductive member 261. Further, as shown in FIG. 10, the connecting electroconductive member 261 connects the first electroconductive layer 212 and the third electroconductive layer 232 to each other, and also connects the second electroconductive layer 222 and the third electroconductive layer 232 to each other. Thus, the first electroconductive layer 212, the second electroconductive layer 222 and the third electroconductive layer 232 are electrically connected to each other via the connecting electroconductive member 261. For example, the connecting electroconductive member 261 includes a plurality of wires made of aluminum.

As shown in FIG. 10, the connecting electroconductive member 261 includes a first part 261A, a second part 261B and a third part 261C. All of the first part 261A, the second part 261B and the third part 261C extend in the second direction x2. The first part 261A connects the first upper arm mounting layer 211A and the third upper arm mounting layer 231A to each other, and also connects the second upper arm mounting layer 221A and the third upper arm mounting layer 231A to each other. Thus, the first upper arm mounting layer 211A and the second upper arm mounting layer 221A are electrically connected to each other via the first part 261A. The second part 261B connects the first lower arm mounting layer 211B and the third lower arm mounting layer 231B to each other, and also connects the second lower arm mounting layer 221B and the third lower arm mounting layer 231B to each other. Thus, the first lower arm mounting layer 211B and the second lower arm mounting layer 221B are electrically connected to each other via the second part 261B. The third part 261C connects the first electroconductive layer 212 and the third electroconductive layer 232 to each other, and also connects the second electroconductive layer 222 and the third electroconductive layer 232 to each other. Thus, the first electroconductive layer 212 and the second electroconductive layer 222 are electrically connected to each other via the third part 261C.

As shown in FIG. 10, first electroconductive members 262 connect the first gate layer 213 and the third gate layer 233 to each other, and also connect the second gate layer 223 and the third gate layer 233 to each other. Thus, the first gate layer 213, the second gate layer 223 and the third gate layer 233 are electrically connected to each other via the first electroconductive members 262. For example, the first electroconductive members 262 are wires made of aluminum. All of the first electroconductive members 262 extend in the second direction x2 and may consist of four first electroconductive members 262. The first one of the first electroconductive members 262 connects the first upper arm gate layer 213A and the third upper arm gate layer 233A. The second one of the first electroconductive members 262 connects the second upper arm gate layer 223A and the third upper arm gate layer 233A. The third one of the first electroconductive members 262 connects the first lower arm gate layer 213B and the third lower arm gate layer 233B. The fourth one of the first electroconductive members 262 connects the second lower arm gate layer 223B and the third lower arm gate layer 233B.

As shown in FIG. 10, second electroconductive members 263 connect the first detection layer 214 and the third detection layer 234 to each other, and also connect the second detection layer 224 and the third detection layer 234 to each other. Thus, the first detection layer 214, the second detection layer 224 and the third detection layer 234 are electrically connected to each other via the second electroconductive members 263. For example, the second electroconductive members 263 are wires made of aluminum. All of the second electroconductive members 263 extend in the second direction x2 and may consist of four second electroconductive members 263. The first one of the second electroconductive members 263 connects the first upper arm detection layer 214A and the third upper arm detection layer 234A. The second one of the second electroconductive members 263 connects the second upper arm detection layer 224A and the third upper arm detection layer 234A. The third one of the second electroconductive members 263 connects the first lower arm detection layer 214B and the third lower arm detection layer 234B. The fourth one of the second electroconductive members 263 connects the second lower arm detection layer 224B and the third lower arm detection layer 234B.

Figure 4:
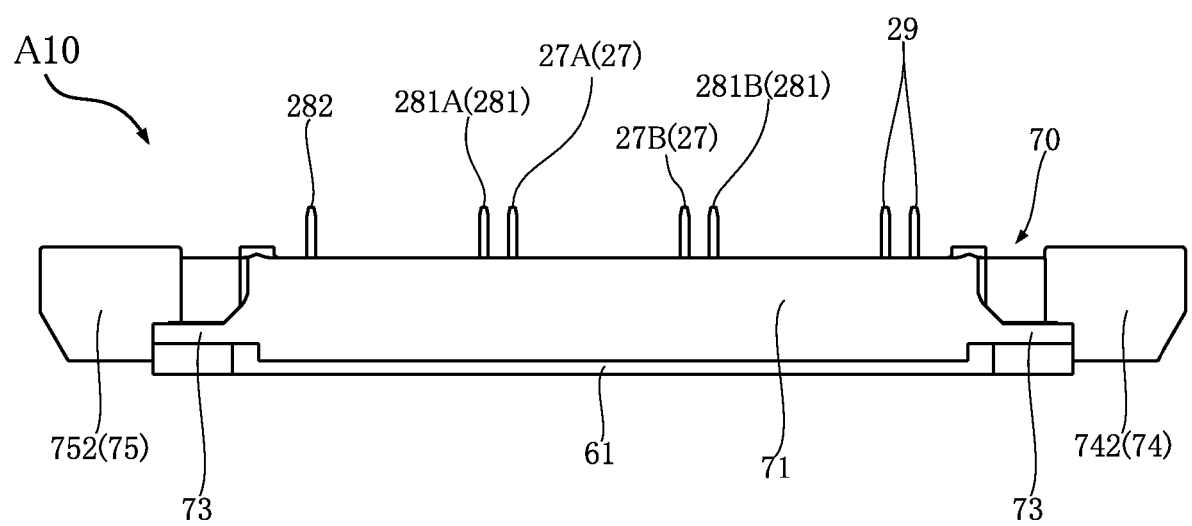
FIG. 4 is a front view of the semiconductor device shown in FIG. 1.

As shown in FIGS. 2-4, a gate terminal 27 is an element of an external connection terminal provided in the semiconductor device A10. The gate terminal 27 is connected to an externally arranged driving circuit (e.g. gate driver) for the semiconductor device A10. The gate terminal 27 is disposed to face the substrate 11 as viewed in the thickness direction z and supported on the case 70. The gate terminal 27 projects in the same direction in which the front surface 111 of the substrate 11 faces (along the thickness direction z). For example, the gate terminal 27 is in the form of a metal rod made of copper. The surface of the metal rod is plated with tin (Sn). Nickel plating may be provided between the surface of the metal rod and the tin plating. As shown in FIG. 12, the gate terminal 27 is bent into a hook shape at its end closer to the substrate 11 in the thickness direction z, thereby having a portion extending along the first direction x1. The gate terminal 27 includes a first gate terminal 27A and a second gate terminal 27B. Paired second gate wires 422 are connected to the first gate terminal 27A and the second gate terminal 27B. For example, the paired second gate wires 422 are made of aluminum.

As shown in FIG. 10, the first gate terminal 27A is disposed close to the second upper arm gate layer 223A to face the second substrate 11B as viewed in the thickness direction z. The second gate wire 422 connected at one end to the first gate terminal 27A is connected at the other end to the third upper arm gate layer 233A. Thus, the first gate terminal 27A is electrically connected to the gate electrodes 313 of the switching elements 31 electrically bonded to the first upper arm mounting layer 211A, the second upper arm mounting layer 221A and the third upper arm mounting layer 231A.

As shown in FIG. 10, the second gate terminal 27B is disposed close to the third lower arm gate layer 233B to face the third substrate 11C as viewed in the thickness direction z. The second gate wire 422 connected at one end to the second gate terminal 27B is connected at the other end to the third lower arm gate layer 233B. Thus, the second gate terminal 27B is electrically connected to the gate electrodes 313 of the switching elements 31 electrically bonded to the first lower arm mounting layer 211B, the second lower arm mounting layer 221B and the third lower arm mounting layer 231B.

As shown in FIGS. 2-4, a device current detection terminal 281 is an element of an external connection terminal provided in the semiconductor device A10. The device current detection terminal 281 is connected to an externally arranged control circuit for the semiconductor device A10. The device current detection terminal 281 is disposed to face the substrate 11 and supported on the case 70. The device current detection terminal 281 projects in the same direction in which the gate terminal 27 projects along the thickness direction z. The device current detection terminal 281 is made of a metal rod of the same material as the gate terminal 27. The device current detection terminal 281 has the same shape as the gate terminal 27. Thus, the device current detection terminal 281 is bent into a hook shape at its end closer to the substrate 11 in the thickness direction z, thereby having a portion extending along the first direction x1. The device current detection terminal 281 includes a first detection terminal 281A and a second detection terminal 281B. Paired second detection wires 432 are connected to the first detection terminal 281A and the second detection terminal 281B. For example, the paired second detection wires 432 are made of aluminum.

As shown in FIG. 10, the first detection terminal 281A is disposed close to the second upper arm detection layer 224A to face the second substrate 11B as viewed in the thickness direction z, and is also close to the first gate terminal 27A. The second detection wire 432 connected at one end to the first detection terminal 281A is connected at the other end to the second upper arm detection layer 224A. Thus, the first detection terminal 281A is electrically connected to the front surface electrodes 311 of the switching elements 31 electrically bonded to the first upper arm mounting layer 211A, the second upper arm mounting layer 221A and the third upper arm mounting layer 231A.

As shown in FIG. 10, the second detection terminal 281B is disposed close to the first lower arm detection layer 214B to face the first substrate 11A as viewed in the thickness direction z, and is also close to the second gate terminal 27B. The second detection wire 432 connected at one end to the second detection terminal 281B is connected at the other end to the first lower arm detection layer 214B. Thus, the second detection terminal 281B is electrically connected to the front surface electrodes 311 of the switching elements 31 electrically bonded to the first lower arm mounting layer 211B, the second lower arm mounting layer 221B and the third lower arm mounting layer 231B.

As shown in FIGS. 2-4 and 9, a power supply current detection terminal 281 is an element of an external connection terminal provided in the semiconductor device A10. The power supply current detection terminal 282 is connected to an externally arranged control circuit for the semiconductor device A10 and supported on the case 70. The power supply current detection terminal 282 projects in the same direction in which the gate terminal 27 projects along the thickness direction z. The power supply current detection terminal 28 is made of a metal rod of the same material as the gate terminal 27. The power supply current detection terminal 282 is located at the same position as the first gate terminal 27A and the first detection terminal 281A in the first direction x1 and spaced apart from the first detection terminal 281A toward the first output terminal 25A in the second direction x2. The power supply current detection terminal 282 is disposed close to the second upper arm mounting layer 221A to face the second substrate 11B in the first direction x1. The power supply current detection terminal 282 has the same shape as the gate terminal 27. Thus, the power supply current detection terminal 282 is bent into a hook shape at its end closer to the second substrate 11B in the thickness direction z, thereby having a portion extending along the first direction x1. To this end of the power supply current detection terminal, one end of a power supply current detection wire 44 is connected. The other end of the power supply current detection wire 44 is connected to the second upper arm mounting layer 221A. Thus, the power supply current detection terminal 282 is electrically connected to the first upper arm mounting layer 211A, the second upper arm mounting layer 221A and the third upper arm mounting layer 231A. For example, the power supply current detection wire 44 is made of aluminum.

As shown in FIGS. 2-4 and 8, a pair of thermistor terminals 29 are an element of an external connection terminal provided in the semiconductor device A10. The paired thermistor terminals 29 are connected to an externally arranged control circuit for the semiconductor device A10 and supported on the case 70. The paired thermistor terminal 29 project in the same direction in which the gate terminal 27 projects along the thickness direction z. The paired thermistor terminals 29 are made of a metal rod of the same material as the gate terminal 27. The paired thermistor terminals 29 are located at the same position as the first gate terminal 27A and the first detection terminal 281A in the first direction x1 and spaced apart from the first gate terminal 27A toward the first power supply terminal 24A in the second direction x2. The paired thermistor terminal 29 are disposed close to the thermistor mounting layer 215 to face the first substrate 11A in the first direction x1. The paired thermistor terminals 29 have the same shape as the gate terminal 27. Thus, each of the paired thermistor terminals is bent into a hook shape at its end closer to the first substrate 11A in the thickness direction z, thereby having a portion extending along the first direction x1. To this end of each of the paired thermistor terminals 29, one end of a corresponding one of a paired thermistor wires 45 is connected. The other ends of the paired thermistor wires 45 are connected to paired sections of the thermistor mounting layer 215. Thus, the thermistor terminals 29 are electrically connected to the thermistor 33. For example, the paired thermistor wires 45 are made of aluminum.

As shown in FIG. 3, the switching elements 31 are semiconductor elements electrically bonded to and aligned, in the second direction x2, on each of the first mounting layer 211, the second mounting layer 221 and the third mounting layer 231. The switching elements 31 are rectangular (square in the semiconductor device A10) as viewed in the thickness direction z. The switching elements 31 are MOSFETs (Metal-Oxide-Semiconductor Field-Effect Transistors) made of a semiconductor material mainly composed of silicon carbide (SiC). Note that the switching elements 31 are not limited to MOSFETs and may be IGBTs (Insulated Gate Bipolar Transistors). In the semiconductor device A10, it is assumed that the switching elements 31 are n-channel MOSFETs made of a semiconductor material mainly composed of silicon carbide. In the semiconductor device A10, the switching elements 31 are 400 µm or less and preferably 150 µm or less in thickness. The breakdown voltage of the switching elements 31 is 1,200 V or more.

As shown in FIGS. 15-20, each of the switching elements 31 has a front surface 31A, a back surface 31B, a side surface 31C, a front surface electrode 311, a back surface electrode 312, a gate electrode 313 and an insulating film 314. The front surface 31A, the back surface 31B and the side surface 31C correspond to the "first element front surface", the "first element back surface" and the "first element side surface", respectively, as set forth in the appended claims of the present disclosure. The front surface 31A faces in the same direction in which the front surface 111 of the substrate 11 faces along the thickness direction z. The back surface 31B faces in the opposite direction of the front surface 31A. The switching elements 31 are electrically bonded to the first mounting layer 211, the second mounting layer 221 and the third mounting layer 231, with the back surfaces 31B facing the front surface 111. The side surface 31C is connected to both of the front surface 31A and the back surface 31B. The side surface 31C includes a plurality of sections (four sections in the semiconductor device A10) each facing in the first direction x1 or the second direction x2.

As shown in FIGS. 15-20, the front surface electrode 311 is provided on the front surface 31A. A source current flows through the front surface electrode 311. The front surface electrode 311 has a pair of first pads 311A and a pair of second pads 311B. The paired first pads 311A are sections of a front surface electrode 311 that are spaced apart from each other in the second direction x, so are the paired second pads 311B. In each of the switching elements 31 electrically bonded to the first mounting layer 211, the second pads 311B are located opposite to the first lower arm mounting layer 211B or the first electroconductive layer 212 across the paired first pads 311A in the first direction x1. The above-described positional relationship between the paired first pads 311A and the paired second pads 311B also applies to the switching elements 31 electrically bonded to the second mounting layer 221 or the third mounting layer 231.

As shown in FIG. 15, in each of the switching elements 31 electrically bonded to the first upper arm mounting layer 211A, the second upper arm mounting layer 221A or the third upper arm mounting layer 231A, one end of the first detection wire 431 is connected to one of the paired second pads 311B. The other end of the first detection wire 431 is connected to the first upper arm detection layer 214A, the second upper arm detection layer 224A or the third upper arm detection layer 234A. As shown in FIG. 18, in each of the switching elements 31 electrically bonded to the first lower arm mounting layer 211B, the second lower arm mounting layer 221B or the third lower arm mounting layer 231B, one end of the first detection wire 431 is connected to one of the paired first pads 311A. The other end of the first detection wire 431 is connected to the first lower arm detection layer 214B, the second lower arm detection layer 224B or the third lower arm detection layer 234B. In this way, the front surface electrodes 311 are electrically connected to the first detection layer 214, the second detection layer 224 or the third detection layer 234 via the first detection wires 431. For example, the first detection wires 431 are made of gold (Au).

As shown in FIGS. 16-20 (excluding FIG. 18), the back surface electrode 312 is provided on the entirety of the back surface 31B. A drain current flows through the back surface electrode 312. The back surface electrode 312 is electrically bonded to one of the first mounting layer 211, the second mounting layer 221 and the third mounting layer 231 via a first bonding layer 391. The first bonding layer 391 is electrically conductive. The first bonding layer 391 is sandwiched between the back surface electrode 312 and the first mounting layer 211, the second mounting layer 221 or the third mounting layer 231. For example, the first bonding layer 391 is made of lead-free solder mainly composed of tin. The first bonding layer 391 electrically connects each of the back surface electrodes 312 to one of the first mounting layer 211, the second mounting layer 221 and the third mounting layer 231.

As shown in FIGS. 15 and 18, the gate electrode 313 is provided on the front surface 31A. A gate voltage for driving each of the switching elements 31 is applied to the gate electrode 313. As shown in FIG. 15, in each of the switching elements 31 electrically bonded to the first upper arm mounting layer 211A, the second upper arm mounting layer 221A or the third upper arm mounting layer 231A, the gate electrode 313 is close to the paired second pads 311B of the front surface electrode 311. One end of a first gate wire 421, which is connected at its other end to the first upper arm gate layer 213A, the second upper arm gate layer 223A or the third upper arm gate layer 233A, is connected to the gate electrode 313. As shown in FIG. 18, in each of the switching elements 31 electrically bonded to the first lower arm mounting layer 211B, the second lower arm mounting layer 221B or the third lower arm mounting layer 231B, the gate electrode 313 is close to the paired first pads 311A of the front surface electrode 311. One end of a first gate wire 421, which is connected at its other end to the first lower arm gate layer 213B, the second lower arm gate layer 223B or the third lower arm gate layer 233B, is connected to the gate electrode 313. In this way, the gate electrodes 313 are electrically connected to the first gate layer 213, the second gate layer 223 or the third gate layer 233 via the first gate wires 421. For example, the first gate wires 421 are made of gold.

As shown in FIGS. 15-20, the insulating film 314 is provided on the front surface 31A. The insulating film 314 is electrically insulating. As viewed in the thickness direction z, the insulating film 314 surrounds the front surface electrode 311. The insulating film 314 may be formed by laminating a silicon dioxide ($SiO_2$) layer, a silicon nitride ($Si_3N_4$) layer, and a polybenzoxazole (PBO) layer on the front surface 31A in the mentioned order. For the insulating film 314, a polyimide layer may be used instead of the polybenzoxazole layer. In FIGS. 15-20, the length from the edge 314A of the insulating film 314 to the front surface electrode 311 as viewed in the thickness direction z is indicated as a gap Gp in each of the switching elements 31. The gap Gp is a length along the first direction x1 or the second direction x2. The edge 314A is rectangular (square in the semiconductor device A10) as viewed in the thickness direction z. As viewed in the thickness direction z, the ratio of the length of the gap Gp to the length of one side of the edge 314 (shorter side when the edge 314 is rectangular) is set to 5% to 25%. The longer the gap Gp is, the higher the dielectric breakdown voltage of the switching element 31 is.

As shown in FIG. 3, the protective elements 32 are semiconductor elements electrically bonded to and aligned in the second direction x2 on each of the first mounting layer 211, the second mounting layer 221 and the third mounting layer 231. The protective elements 32 are rectangular as viewed in the thickness direction z. The protective elements 32 are arranged to be electrically connected to the switching elements 31, respectively. The protective elements 32 are electrically connected to both of the front surface electrodes 311 and the back surface electrodes 312 of the switching elements 31. Thus, each of the switching elements 31 and a corresponding one of the protective elements 32 form a parallel circuit. For example, the protective elements 32 are schottky-barrier diodes made by using a semiconductor material mainly composed of silicon carbide. In the semiconductor device A10, the protective elements 32 are 400 μm or less and preferably 150 μm or less in thickness. The breakdown voltage of the protective elements 32 is 1,200 V or more.

As shown in FIGS. 15-20, each of the protective elements 32 has a front surface 32A, a back surface 32B, a side surface 32C, an anode electrode 321, a cathode electrode 322 and an insulating film 323. The front surface 32A corresponds to the "second element front surface" as set forth in the appended claims of the present disclosure. The front surface 32A faces in the same direction in which the front surface 111 of the substrate 11 faces along the thickness direction z. The back surface 32B faces in the opposite direction of the front surface 32A. The protective elements 32 are electrically bonded to the first mounting layer 211, the second mounting layer 221 and the third mounting layer 231, with the back surfaces 32B facing the front surface 111. The side surface 32C is connected to both of the front surface 32A and the back surface 32B. The side surface 32C includes a plurality of sections (four sections in the semiconductor device A10) each facing in the first direction x1 or the second direction x2.

As shown in FIGS. 15-20, the anode electrode 321 is provided on the front surface 32A. The anode electrode 321 is electrically connected to the front surface electrode 311 of the switching element 31 with which that protective element 32 is associated.

Figure 16:
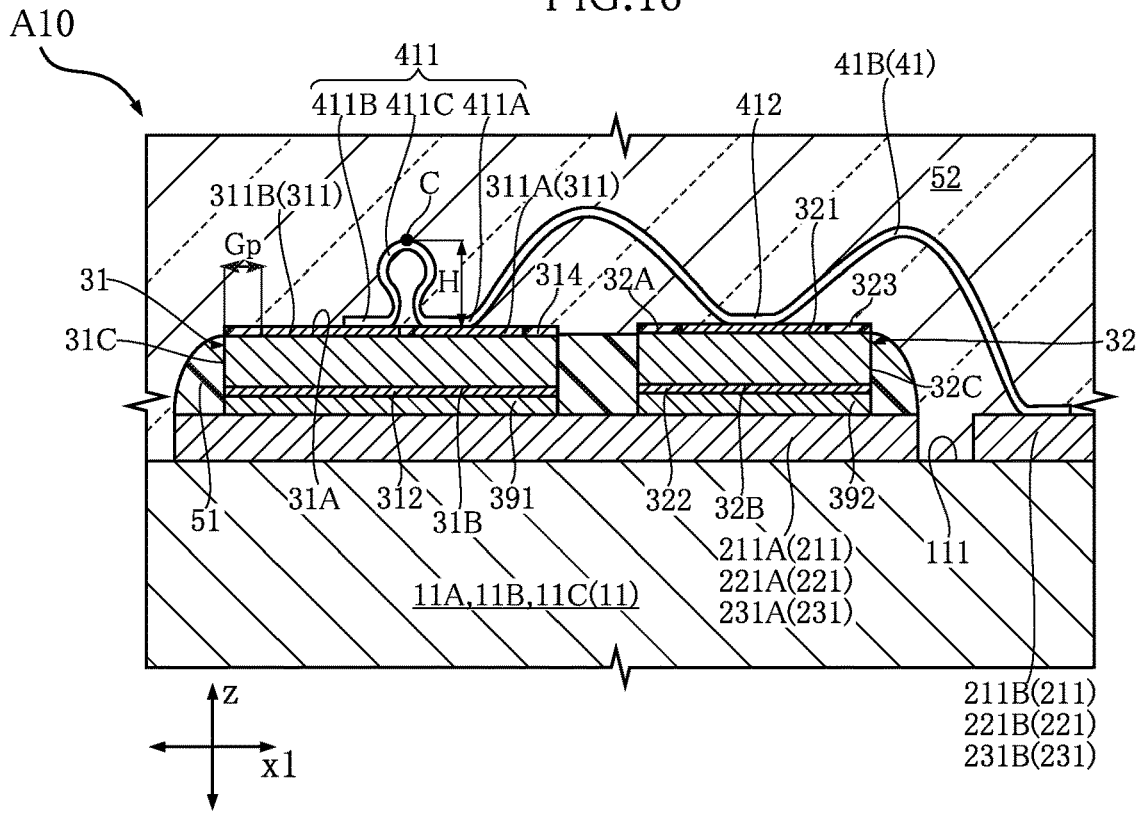
FIG. 16 is a sectional view taken along line XVI-XVI in FIG. 15.
Figure 19:
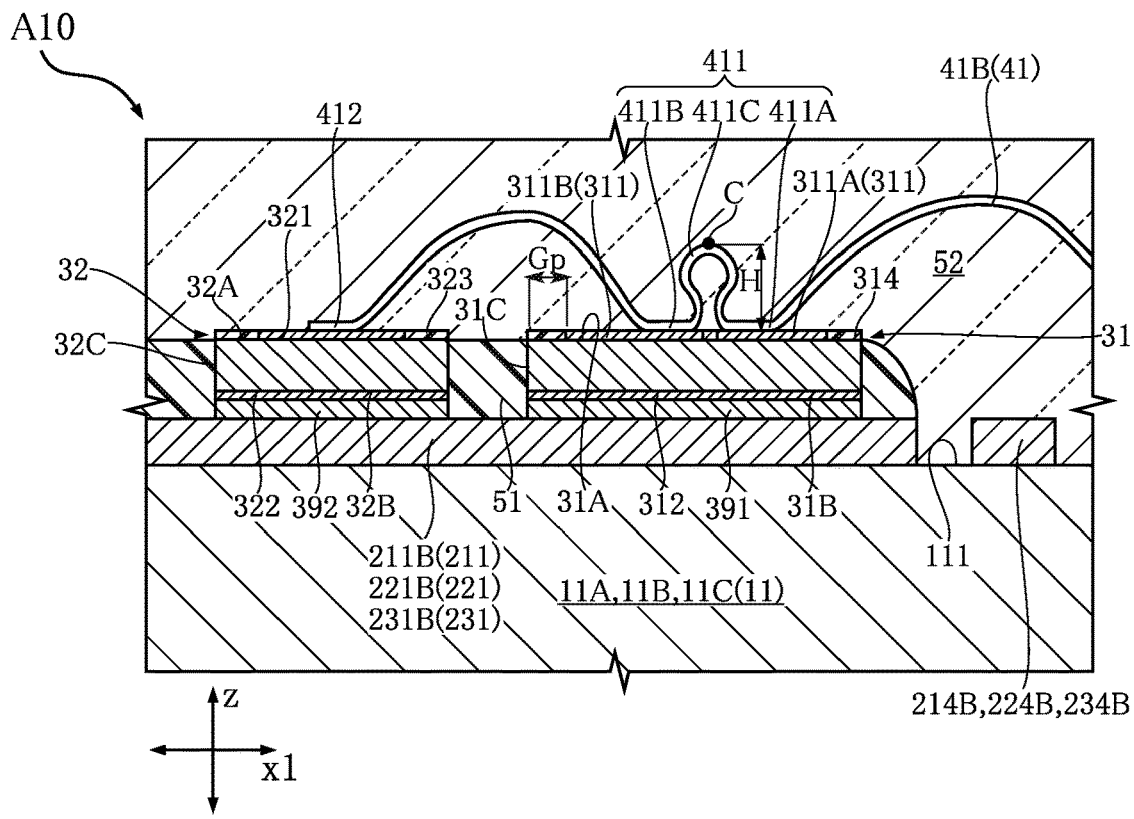
FIG. 19 is a sectional view taken along line XIX-XIX in FIG. 18.

As shown in FIGS. 16 and 19, the cathode electrode 322 is provided on the entirety of the back surface 32B. The cathode electrode 322 is electrically bonded to one of the first mounting layer 211, the second mounting layer 221 and the third mounting layer 231 via a second bonding layer 392. The second bonding layer 392 is electrically conductive. The second bonding layer 392 is sandwiched between the cathode electrode 322 and the first mounting layer 211, the second mounting layer 221 or the third mounting layer 231. The second bonding layer 392 is made of the same material as that for the first bonding layer 391. With the second bonding layer 392, the cathode electrode 322 is electrically connected, via the first mounting layer 211, the second mounting layer 221 or the third mounting layer 231, to the back surface electrode 312 of the switching element 31 with which the protective element 32 of that cathode electrode 322 is associated.

As shown in FIGS. 16 and 19, the insulating film 323 is provided on the front surface 32A. The insulating film 323 is electrically insulating. As shown in FIGS. 15 and 18, the insulating film 323 surrounds the anode electrode 321 as viewed in the thickness direction z. The insulating film 323 may be formed by laminating a silicon dioxide layer, a silicon nitride layer, and a polybenzoxazole layer on the front surface 31A in the mentioned order. For the insulating film 323, a polyimide layer may be used instead of the polybenzoxazole layer.

As shown in FIGS. 3 and 8, the thermistor 33 is an element electrically bonded to the thermistor mounting layer 215. For example, the thermistor 33 is an NTC (Negative Temperature Coefficient) thermistor. An NTC thermistor has the property of decreasing the resistance with increasing temperature. The thermistor 33 is used as a temperature detection sensor of the semiconductor device A10.

Figure 17:
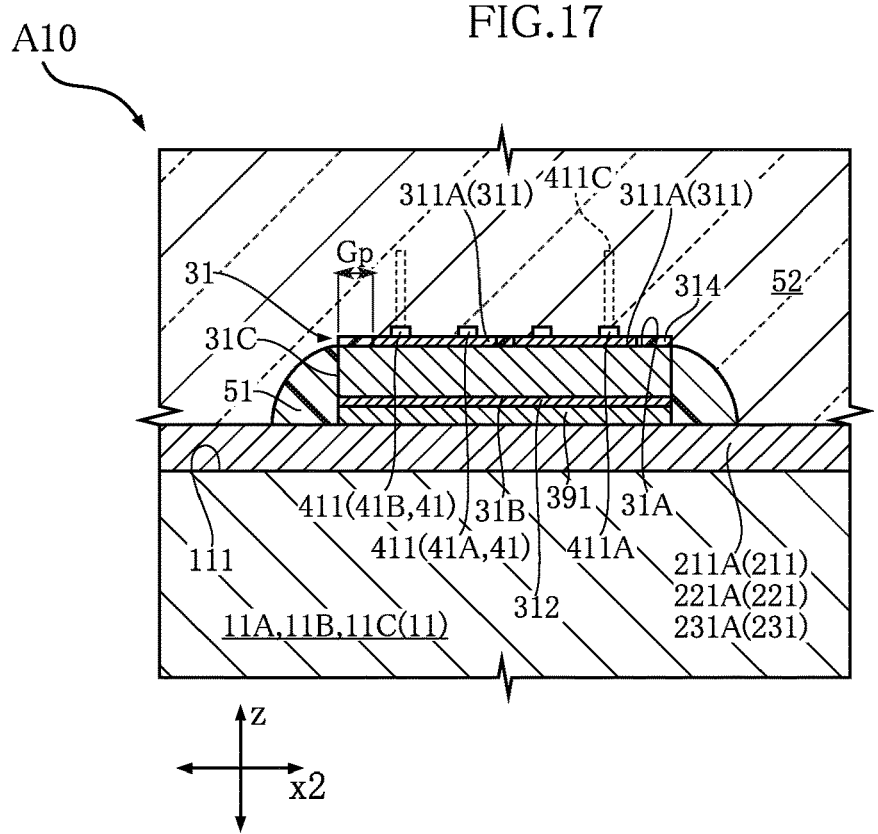
FIG. 17 is a sectional view taken along line XVII-XVII in FIG. 15.
Figure 20:
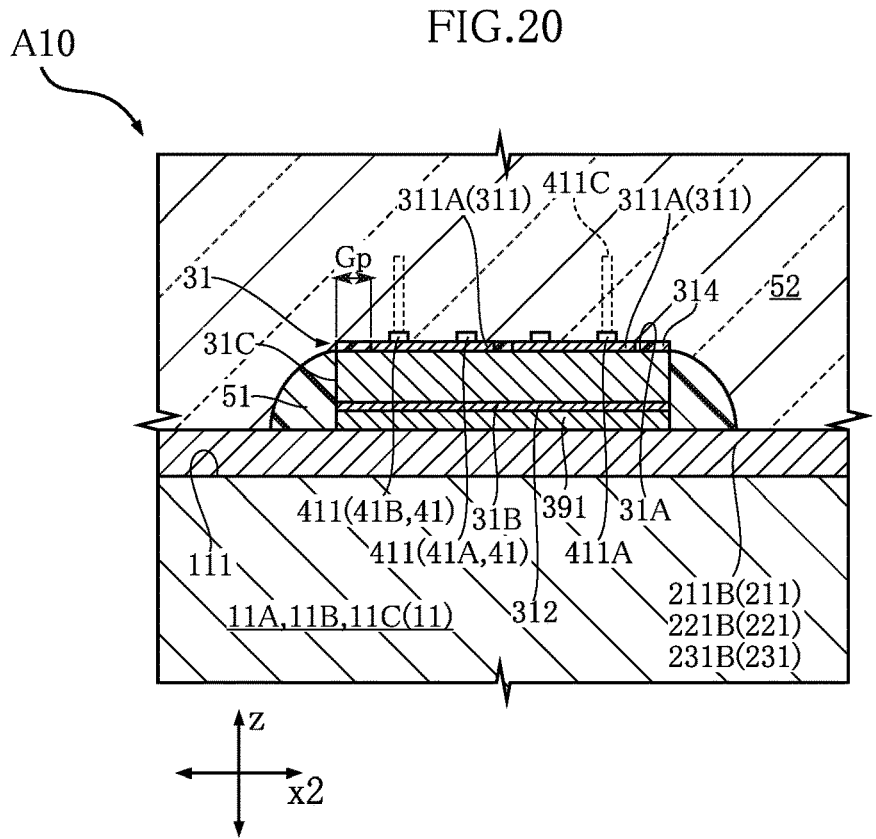
FIG. 20 is a sectional view taken along line XX-XX in FIG. 18.

As shown in FIGS. 15-17, wires 41 are connected to the front surface electrodes 311 of switching elements 31 and the first lower arm mounting layer 211B, the second lower arm mounting layer 221B or the third lower arm mounting layer 231B. As shown in FIGS. 18-20, wires 41 are connected to the front surface electrodes 311 of switching elements 31 and the first electroconductive layer 212, the second electroconductive layer 222 or the third electroconductive layer 232. For example, the wires 41 are made of aluminum. The wires 41 are larger in diameter than the first gate wires 421 and the first detection wires 431.

As shown in FIGS. 15-17, in the switching elements 31 electrically bonded to the first upper arm mounting layer 211A, wires 41 are connected to the front surface electrodes 311 and the first lower arm mounting layer 211B. As shown in FIGS. 18-20, in the switching elements 31 electrically bonded to the first lower arm mounting layer 211B, wires 41 are connected to the front surface electrodes 311 and the first electroconductive layer 212. Thus, the front surface electrodes 311 of the switching elements 31 electrically bonded to the first mounting layer 211 are electrically connected to the first lower arm mounting layer 211B or the first electroconductive layer 212.

As shown in FIGS. 15-17, in the switching elements 31 electrically bonded to the second upper arm mounting layer 221A, wires 41 are connected to the front surface electrodes 311 and the second lower arm mounting layer 221B. As shown in FIGS. 18-20, in the switching elements 31 electrically bonded to the second lower arm mounting layer 221B, wires 41 are connected to the front surface electrodes 311 and the second electroconductive layer 222. Thus, the front surface electrodes 311 of the switching elements 31 electrically bonded to the second mounting layer 221 are electrically connected to the second lower arm mounting layer 221B or the second electroconductive layer 222.

As shown in FIGS. 15-17, in the switching elements 31 electrically bonded to the third upper arm mounting layer 231A, wires are connected to the front surface electrodes 311 and the third lower arm mounting layer 231B. As shown in FIGS. 18-20, in the switching elements 31 electrically bonded to the third lower arm mounting layer 231B, wires 41 are connected to the front surface electrodes 311 and the third electroconductive layer 232. Thus, the front surface electrodes 311 of the switching elements 31 electrically bonded to the third mounting layer 231 are electrically connected to the third lower arm mounting layer 231B or the third electroconductive layer 232.

As shown in FIGS. 15-20, the wires 41 extend in the first direction x1. Each of the wires 41 has a first bonding portion 411. The first bonding portions 411 are held in contact with the front surface electrodes 311 of the switching elements 31. The wires 41 for each of the switching elements 31 include a pair of inner wires 41A and a pair of outer wires 41B. The paired inner wires 41A are flanked by the paired outer wires 41B in the second direction x2.

With reference to FIGS. 15-17, description is given below of the configuration of the wires 41 for each of the switching elements 31 electrically bonded to the first upper arm mounting layer 211A, the second upper arm mounting layer 221A or the third upper arm mounting layer 231A. As shown in FIG. 17, the first bonding portions 411 of the paired inner wires 41A are held in contact with the paired first pads 311A of the front surface electrode 311. As shown in FIG. 16, the first bonding portions 411 of the paired outer wires 41B are held in contact with both of the paired first pads 311A and the paired second pads 311B of the front surface electrode 311. As shown in FIGS. 15 and 16, each of the first bonding portions 411 of the paired outer wires 41B has a first connect portion 411A, a second connect portion 411B and a joint portion 411C. The first connect portion 411A is held in contact with a first pad 311A. The second connect portion 411B is held in contact with a second pad 311B. The joint portion 411C is sandwiched between the first connect portion 411A and the second connect portion 411B in the first direction x1. The joint portion 411C projects in the same direction in which the front surface 31A of the switching element 31 faces along the thickness direction z.

As shown in FIGS. 15 and 16, each of the wires 41 for each of the switching elements 31 electrically bonded to the first upper arm mounting layer 211A, the second upper arm mounting layer 221A or the third upper arm mounting layer 231A has a second bonding portion 412. The second bonding portion 412 is held in contact with the anode electrode 321 of the protective element 32. Thus, the anode electrodes 321 of the protective elements 32 electrically bonded to the first upper arm mounting layer 211A are electrically connected to both of the front surface electrodes 311 of the corresponding switching elements 31 and the first lower arm mounting layer 211B. The anode electrodes 321 of the protective elements 32 electrically bonded to the second upper arm mounting layer 221A are electrically connected to both of the front surface electrodes 311 of the corresponding switching elements 31 and the second lower arm mounting layer 221B. The anode electrodes 321 of the protective elements 32 electrically bonded to the third upper arm mounting layer 231A are electrically connected to both of the front surface electrodes 311 of the corresponding switching elements 31 and the third lower arm mounting layer 231B.

With reference to FIGS. 18-20, description is given below of the configuration of the wires 41 for each of the switching elements 31 electrically bonded to the first lower arm mounting layer 211B, the second lower arm mounting layer 221B or the third lower arm mounting layer 231B. As shown in FIG. 20, the first bonding portions 411 of the paired inner wires 41A are held in contact with the paired first pads 311A of the front surface electrode 311. As shown in FIG. 19, the first bonding portions 411 of the paired outer wires 41B are held in contact with both of the paired first pads 311A and the paired second pads 311B of the front surface electrode 311. As shown in FIGS. 18 and 19, each of the first bonding portions 411 of the paired outer wires 41B has a first connect portion 411A, a second connect portion 411B and a joint portion 411C. The first connect portion 411A is held in contact with a first pad 311A. The second connect portion 411B is held in contact with a second pad 311B. The joint portion 411C is sandwiched between the first connect portion 411A and the second connect portion 411B in the first direction x1. The joint portion 411C projects in the same direction in which the front surface 31A of the switching elements 31 faces along the thickness direction z.

As shown in FIGS. 18 and 19, each of the paired outer wires 41B for each of the switching elements 31 electrically bonded to the first lower arm mounting layer 211B, the second lower arm mounting layer 221B or the third lower arm mounting layer 231B has a second bonding portion 412. The second bonding portion 412 is held in contact with the anode electrode 321 of the protective element 32. Thus, the anode electrodes 321 of the protective elements 32 electrically bonded to the first lower arm mounting layer 211B are electrically connected to both of the front surface electrodes 311 of the corresponding switching elements 31 and the first electroconductive layer 212. The anode electrodes 321 of the protective elements 32 electrically bonded to the second lower arm mounting layer 221B are electrically connected to both of the front surface electrodes 311 of the corresponding switching elements 31 and the second electroconductive layer 222. The anode electrodes 321 of the protective elements 32 electrically bonded to the third lower arm mounting layer 231B are electrically connected to both of the front surface electrodes 311 of the corresponding switching elements 31 and the third electroconductive layer 232.

As shown in FIG. 18, a pair of auxiliary wires 46 are connected to the anode electrode 321 of each of the protective elements 32 electrically bonded to the first lower arm mounting layer 211B, the second lower arm mounting layer 221B or the third lower arm mounting layer 231B. The auxiliary wires 46 are connected at the other ends thereof to paired second pads 311B of the front surface electrode 311 of the switching element 31 with which the protective element 32 is associated. The auxiliary wires 46 are located between paired outer wires 41B in the second direction x2. The auxiliary wires 46 are made of the same material as that for the wires 41. The diameter of the auxiliary wires 46 are equal to that of the wires 41.

As shown in FIGS. 15-20, the moisture-resistant layer 51 covers the side surface 31C of switching elements 31. As the material for the moisture-resistant layer 51, an electrically insulating material having a high resistance to temperature cycling and a lower moisture permeability than the sealing resin 52 (silicone gel in the semiconductor device A10) is selected. As such an electrically insulating material for the moisture-resistant layer 51, polyimide and silicone gel are selected. The ratio of content by weight of polyimide to silicone gel in the moisture-resistant layer 51 is 1.5:1 to 7.0:1. That is, in the moisture-resistant layer 51, the weight of polyimide is larger than that of silicone gel. In the moisture-resistant layer 51, polyimide molecules and silicone gel molecules are mixed. Preferably, polyimide molecules and silicone gel molecules are uniformly dispersed throughout the moisture-resistant layer 51. This effectively prevents the moisture-resistant layer 51 from cracking due to temperature cycling, so that the moisture-resistant layer 51 maintains the function of preventing moisture intrusion. Although the moisture-resistant layer 51 consisting of polyimide and silicone gel alone is explained for the semiconductor device A10, other materials may be added to these materials to form the moisture-resistant layer 51. Further, although a mixture of polyimide and silicone gel is selected as the material for the moisture-resistant layer 51 in the semiconductor device A10, other materials having low moisture permeability may be selected. For example, the moisture-resistant layer 51 may be made of a mixture of polybenzoxazole and silicone gel.

An example of a method for forming the moisture-resistant layer 51 of the semiconductor device A10 is described below. A liquefied synthetic resin material containing polyimide, silicone gel and solvent is prepared. Note that the solvent is volatile. Then, the synthetic resin material is dropped with a dispenser onto the mounting layer (the first mounting layer 211, the second mounting layer 221 and the third mounting layer 231). As a result, the synthetic resin material spreads on the side surfaces 31C of the switching elements 31, so that the side surfaces 31C are covered with the synthetic rein material. Finally, the synthetic resin material is heat-cured to obtain the moisture-resistant layer 51. In this process, the solvent volatilizes. With this method, the moisture-resistant layer 51 covering the side surfaces 31C of the switching elements 31 is easily formed.

As shown in FIGS. 15-17, the moisture-resistant layer 51 is held in contact with one of the first upper arm mounting layer 211A, the second upper arm mounting layer 221A or the third upper arm mounting layer 231A and with the side surface 31C of at least one of the switching elements 31. In the thickness direction z, the moisture-resistant layer 51 extends to be spanned between the side surface 31C and the first upper arm mounting layer 211A or the second upper arm mounting layer 221A or the third upper arm mounting layer 231A, thereby crossing over the bonding layer 39 and the back surface electrode 312.

As shown in FIGS. 18-20, the moisture-resistant layer 51 is held in contact with the first lower arm mounting layer 211B, the second lower arm mounting layer 221B or the third lower arm mounting layer 231B and with the side surface 31C of switching elements 31. In the thickness direction z, the moisture-resistant layer 51 extends to be spanned between the side surface 31C and the first lower arm mounting layer 211B or the second lower arm mounting layer 221B or the third lower arm mounting layer 231B, thereby crossing over the bonding layer 39 and the back surface electrode 312.

Thus, the moisture-resistant layer 51 is held in contact with the first mounting layer 211, the second mounting layer 221 or the third mounting layer 231 and with at least one of the side surfaces 31C. In the thickness direction, the moisture-resistant layer 51 extends to be spanned between the first mounting layer 211, the second mounting layer 221 or the third mounting layer 231 and the side surface 31C.

As shown in FIGS. 15, 16, 18 and 19, the moisture-resistant layer 51 integrally covers the side surface 31C of a switching element 31 and the side surface 32C of the protective element 32 paired with that switching element 31 (the protective element 32 connected anti-parallel to the switching element 31). In the example shown in these figures, the moisture-resistant layer 51 is provided correspondingly to the pairs of switching elements 31 and protective element 32. That is, the moisture-resistant layer 51 is divided into a plurality of sections such that each section covers a pair of the side surface 31C of a switching element 31 and the side surface 32C of a protective element 32. Unlike this configuration, the moisture-resistant layer 51 may be configured to integrally cover the side surfaces 31 of a plurality of switching elements 31 on each of the first mounting layer 211, the second mounting layer 221 and the third mounting layer 231.

As shown in FIGS. 11 and 12, the sealing resin 52 is housed in a region surrounded by the case 70 and the heat sink 61. As shown in FIGS. 16, 17, 19 and 20, the sealing resin 52 covers both of the switching elements 31 and the moisture-resistant layer 51. The sealing resin 52 also covers the protective elements 32. It is preferable that the sealing resin 52 is an electrically insulating synthetic resin with excellent heat resistance and adhesion. For example, the sealing resin 52 is silicone gel mainly composed of thermosetting organopolysiloxane. The sealing resin 52 is exposed to the atmosphere.

Figure 7:
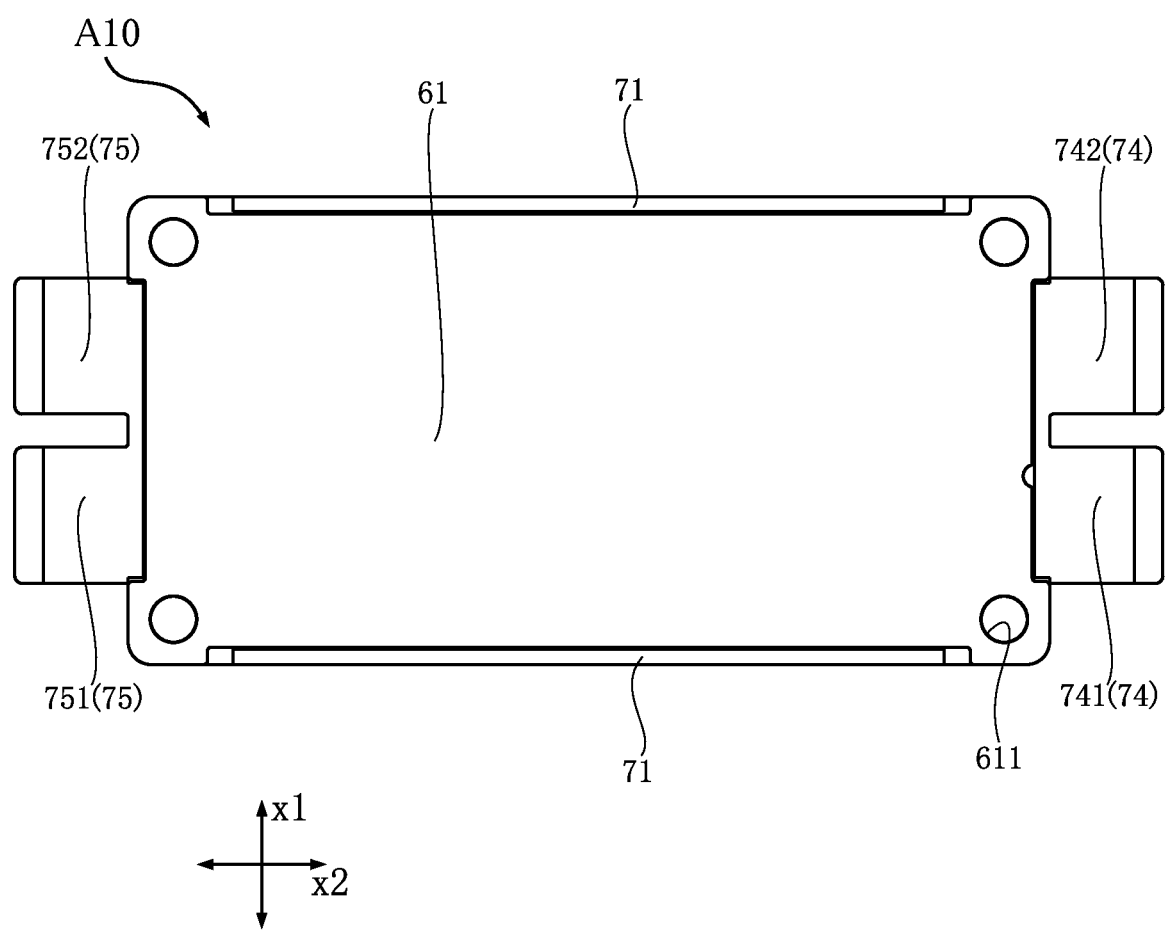
FIG. 7 is a bottom view of the semiconductor device shown in FIG. 1.

As shown in FIGS. 11 and 12, the heat sink 61 is bonded to the back surface 112 of the substrate 11. In the semiconductor device A10, the heat sink 61 is bonded to each of the back surface 112 of the first substrate 11A, the back surface 112 of the second substrate 11B and the back surface 112 of the third substrate 11C via a heat transfer layer 62 and a substrate bonding layer 69 (both described later). For example, the heat sink 61 is made of a metal plate such as a copper plate. The surface of the metal plate may be plated with nickel. As shown in FIGS. 7-9, the heat sink 61 is provided with a plurality of support holes 611 at its four corners as viewed in the thickness direction z. Each of the support holes 611 penetrates the heat sink 61 in the thickness direction z. The support holes 611 are used to support the heat sink 61, which is bonded to the substrate 11, on the case 70.

As shown in FIGS. 11 and 12, the heat transfer layer 62 is disposed on the back surface 112 of the substrate 11. The heat transfer layer 62 is made of a metallic material such as a copper foil. The heat transfer layer 62 transfers the heat generated by driving the switching elements 31 to the heat sink 61.

The substrate bonding layer 69 is a bonding material interposed between the heat sink 61 and the heat transfer layer 62, as shown in FIGS. 11 and 12. In the semiconductor device A10, the substrate bonding layer 69 is made of lead-free solder mainly composed of tin. The substrate bonding layer 59 bonds the heat sink 61 to the substrate 11.

The case 70 is an electrically insulating member surrounding the substrate 11 as viewed in the thickness direction z, as shown in FIG. 3. The case 70 is in the form of a frame. The case 70 is made of an electrically insulating synthetic resin with excellent heat resistance such as PPS (polyphenylene sulfide). The case 70 has a pair of side walls 71, a pair of terminal seats 72, mount parts 73, a power supply terminal base 74 and an output terminal base 75.

As shown in FIGS. 2, 3, 5 and 6, the paired side walls 71 are spaced apart from each other in the first direction x1 and in the form of a groove. Each of the side walls 71 is arranged along both of the second direction x2 and the thickness direction z, and one end of each side wall in the thickness direction z is held in contact with the heat sink 61. Opposite ends of each side wall 71 in the second direction x2 are connected to the paired terminal seats 72. In one of the side walls 71, the first gate terminal 27A, the first detection terminal 281A, the power supply current detection terminal 282 and the paired thermistor terminals 29 are disposed. In the other side wall 71, the second gate terminal 27B and the second detection terminal 281B are disposed. As shown in FIGS. 8-10, the ends of these terminals that are close to the substrate 11 in the thickness direction z are supported on the side walls 71.

As shown in FIGS. 3, 8 and 9, the paired terminal seats 72 are spaced apart from each other in the second direction x2. Each of the terminal seats 72 is disposed along the second direction x2. To one of the terminal seats 72 is connected the power supply terminal base 74 that projects outward in the second direction x2, and a part of the power supply terminal 24 is supported on the terminal seat 72. To the other one of the terminal seats 72 is connected the output terminal base 75 that projects outward in the second direction x2, and apart of the output terminal 25 is supported on the terminal seat 72.

As shown in FIGS. 2, 8 and 9, the mount parts 73 are provided at four corners of the case 70 as viewed in the thickness direction z. Each of the mount parts 73 is provided with a mount hole 731 penetrating the mount part 73 in the thickness direction z. The positions of the mount holes 731 correspond to the support holes 611 provided in the heat sink 61. The heat sink 61 is supported on the case 70 by inserting fastening members such as pins into the mount holes 731 and the support holes 611.

Figure 5:
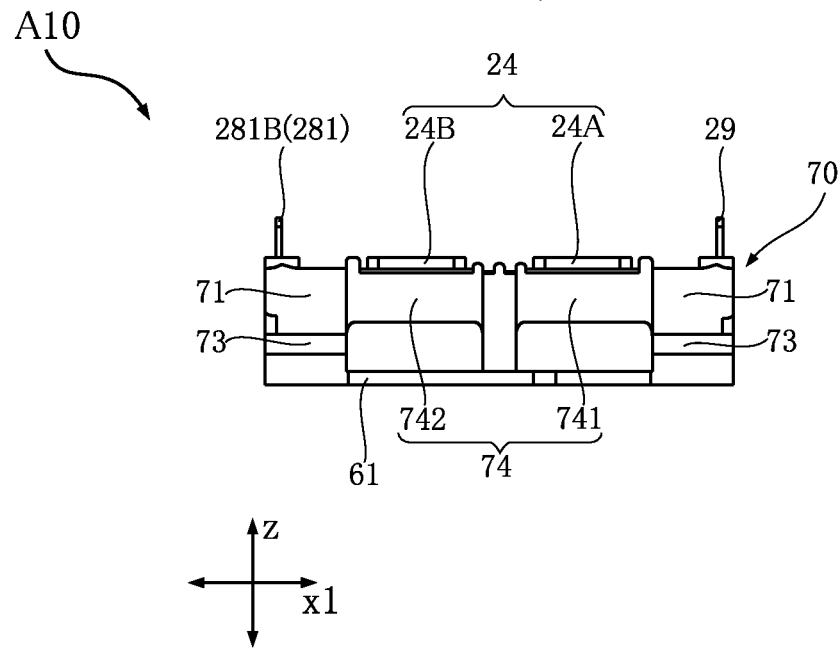
FIG. 5 is a right side view of the semiconductor device shown in FIG. 1.
Figure 13:
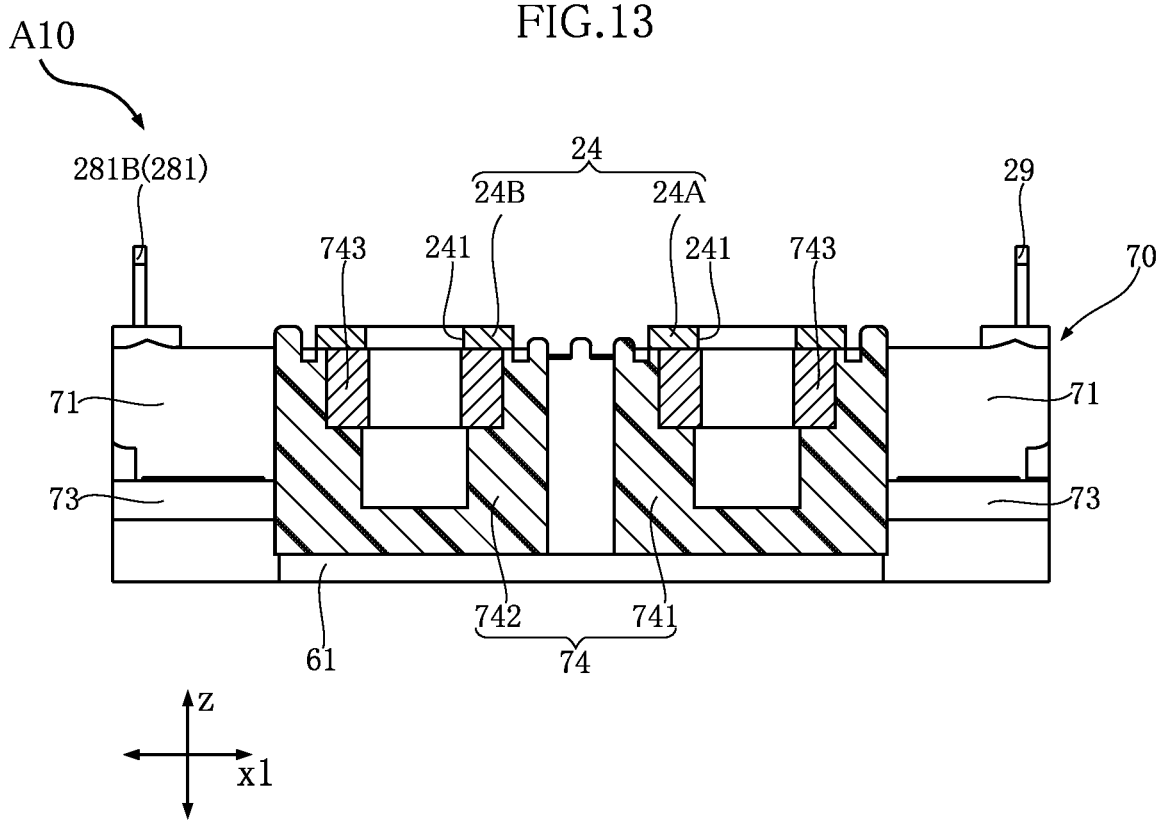
FIG. 13 is a sectional view taken along line XIII-XIII in FIG. 3.

As shown in FIGS. 2, 5 and 8, the power supply terminal base 74, along with the terminal seat 72 connected thereto, supports the power supply terminal 24. The power supply terminal base 74 includes a first terminal base 741 and a second terminal base 742. The first terminal base 741 and the second terminal base 742 are spaced apart from each other in the first direction x1. On the first terminal base 741 is supported a part of the first power supply terminal 24A, and the supported part is exposed outside the semiconductor device A10. On the second terminal base 742 is supported a part of the second power supply terminal 24B, and the supported part is exposed outside the semiconductor device A10. As shown in FIGS. 8 and 13, a nut 743 is disposed in each of the first terminal base 741 and the second terminal base 742. Each nut 743 corresponds in the thickness direction z to the coupling hole 241 provided in the first power supply terminal 24A or the second power supply terminal 24B. The fastening member such as a bolt inserted in the coupling hole 241 is in threaded engagement with a nut 743.

Figure 6:
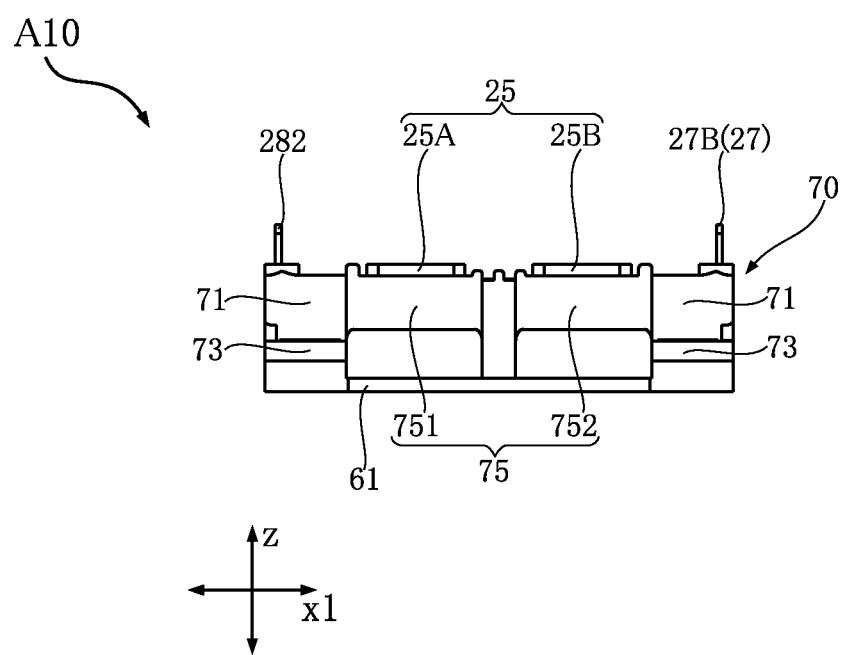
FIG. 6 is a left side view of the semiconductor device shown in FIG. 1.
Figure 14:
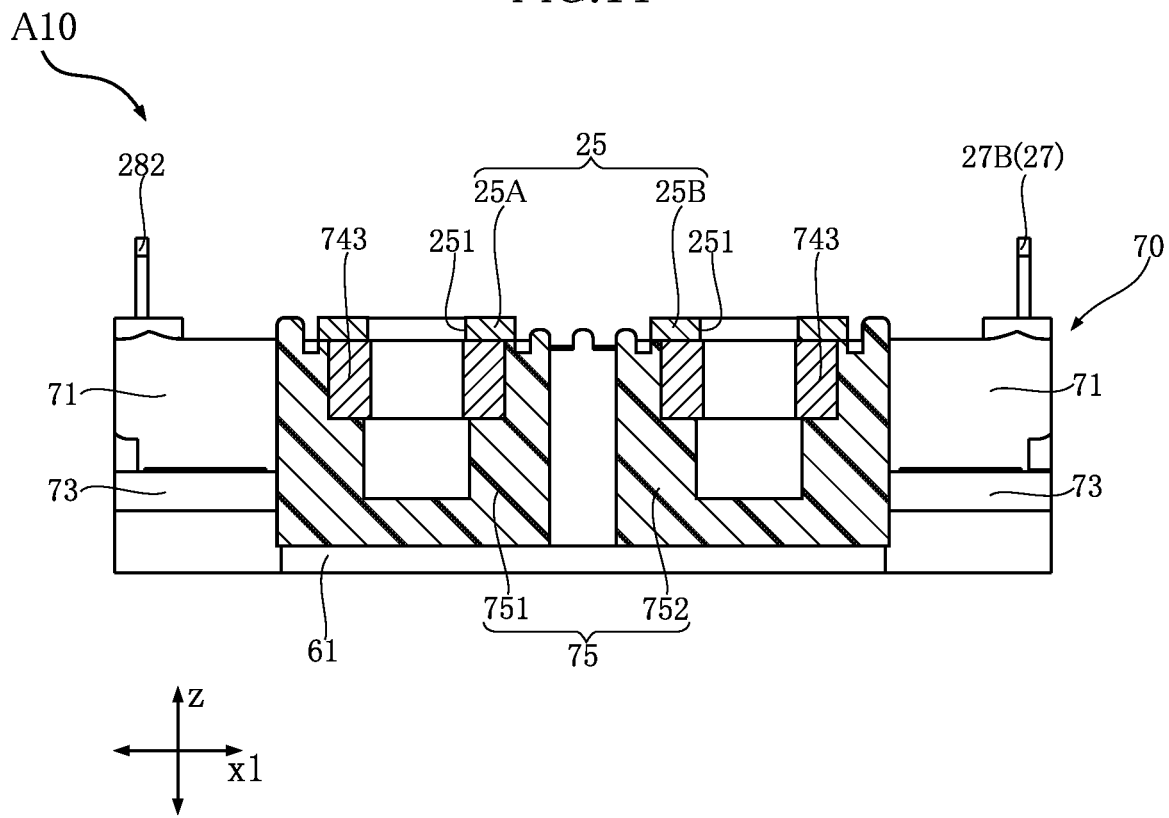
FIG. 14 is a sectional view taken along line XIV-XIV in FIG. 3.

As shown in FIGS. 2, 6 and 9, the output terminal base 75, along with the terminal seat 72 connected thereto, supports the output terminal 25. The output terminal base 75 includes a first terminal base 751 and a second terminal base 752. The first terminal base 751 and the second terminal base 752 are spaced apart from each other in the first direction x1. On the first terminal base 751 is supported a part of the first output terminal 25A, and the supported part is exposed outside the semiconductor device A10. On the second terminal base 752 is supported a part of the second output terminal 25B, and the supported part is exposed outside the semiconductor device A10. As shown in FIGS. 9 and 14, a nut 753 is disposed in each of the first terminal base 751 and the second terminal base 752. Each nut 753 corresponds in the thickness direction z to the coupling hole 251 provided in the first output terminal 25A or the second output terminal 25B. The fastening member such as a bolt inserted in the coupling hole 251 is in threaded engagement with a nut 753.

As shown in FIGS. 2, 11 and 12, the top plate 79 closes the interior of the semiconductor device A10 defined by the heat sink 61 and the case 70. The top plate 79 is supported on the paired side walls 71 of the case 70, facing the front surface 111 of the substrate 11 and being spaced apart from the front surface 111 in the thickness direction z. The top plate 79 is made of an electrically insulating synthetic resin.

Next, the circuit configuration in the semiconductor device A10 is described with reference to FIG. 21.

Figure 21:
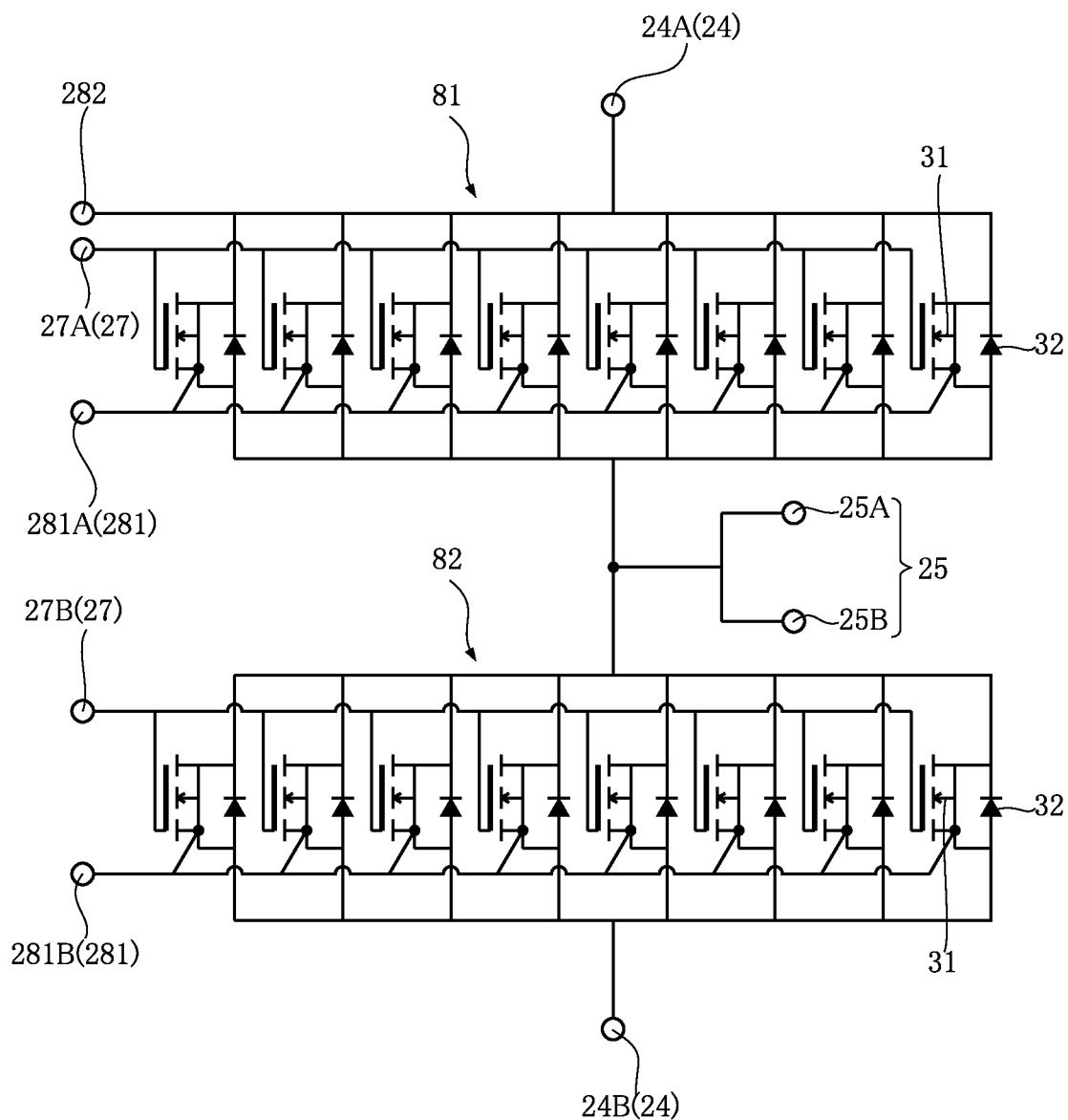
FIG. 21 is a circuit diagram of the semiconductor device shown in FIG. 1.

As shown in FIG. 21, two switching circuits, namely an upper arm circuit 81 and a lower arm circuit 82 are formed in the semiconductor device A10. The upper arm circuit 81 may be made up of the first upper arm mounting layer 211A, the second upper arm mounting layer 221A, the third upper arm mounting layer 231A, and the switching elements 31 and the protective elements 32 electrically bonded to these mounting layers. The switching elements 31 and the protective elements 32 electrically bonded to these mounting layers are connected in parallel between the first power supply terminal 24A and the output terminal 25. The gate electrodes 313 of the switching elements 31 in the upper arm circuit 81 are connected in parallel to the first gate terminal 27A. The switching elements 31 in the upper arm circuit 81 are driven simultaneously by the application of a gate voltage to the first gate terminal 27A using a driving circuit such as a gate driver disposed outside the semiconductor device A10.

The front surface electrodes 311 of the switching elements 31 in the upper arm circuit 81 are connected in parallel to the first detection terminal 281A. The source current flowing through the switching elements 31 in the upper arm circuit 81 is inputted to a control circuit disposed outside the semiconductor device A10 via the first detection terminal 281A.

In the upper arm circuit 81, the voltage applied by the first power supply terminal 24A and the second power supply terminal 24B to the first upper arm mounting layer 211A, the second upper arm mounting layer 221A and the third upper arm mounting layer 231A is inputted to the control circuit disposed outside the semiconductor device A10 via the power supply current detection terminal 282.

The lower arm circuit 82 may be made up of the first lower arm mounting layer 211B, the second lower arm mounting layer 221B, the third lower arm mounting layer 231B, and the switching elements 31 electrically bonded to these mounting layers, and the protective elements 32 are connected in parallel between the output terminal 25 and the second power supply terminal 24B. The gate electrodes 313 of the switching elements 31 in the lower arm circuit 82 are connected in parallel to the second gate terminal 27B. The switching elements 31 in the lower arm circuit 82 are driven simultaneously by the application of a gate voltage to the second gate terminal 27B using a driving circuit such as a gate driver disposed outside the semiconductor device A10.

The front surface electrodes 311 of the switching elements 31 in the lower arm circuit 82 are connected in parallel to the second detection terminal 281B. The source current flowing through the switching elements 31 in the lower arm circuit 82 is inputted to a control circuit disposed outside the semiconductor device A10 via the second detection terminal 281B.

Alternating voltages of various frequencies are output from the output terminal 25 by connecting a DC power supply to the first power supply terminal 24A and the second power supply terminal 24B and driving the switching elements 31 in the upper arm circuit 81 and the lower arm circuit 82. The alternating voltage output from the output terminal 25 is supplied to a power supply target such as a motor.

The advantages of the semiconductor device A10 are described below.

Figure 22:
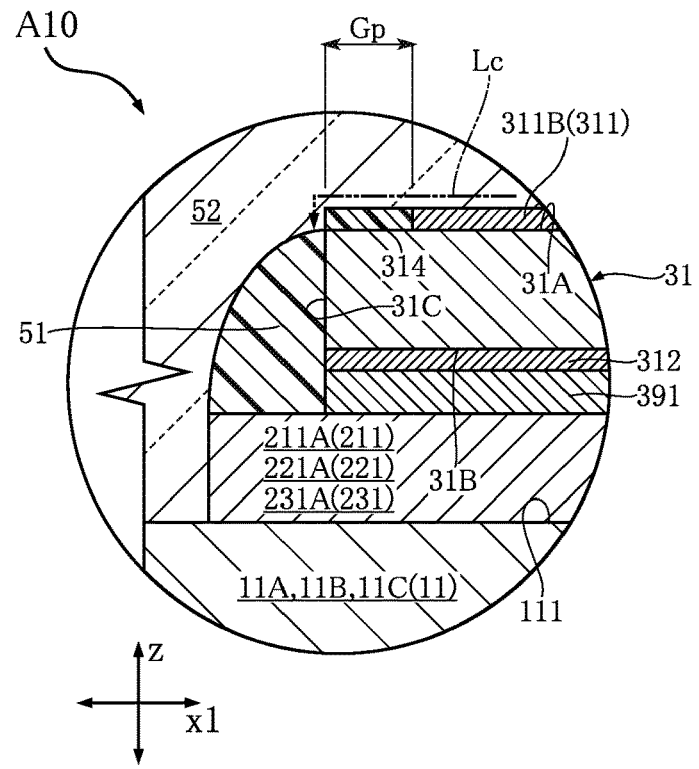
FIG. 22 shows a portion of FIG. 16 as enlarged.

With the configuration of the semiconductor device A10, the moisture-resistant layer 51 is held in contact with both of the mounting layer (the first mounting layer 211, the second mounting layer 221 and the third mounting layer 231) and the side surface 31C of the switching elements 31. In the thickness direction z, the moisture-resistant layer 51 extends to be spanned between the mounting layer and the side surface 31C. When moisture enters the sealing resin 52 due to the effect of high temperature and high humidity, a leakage current Lc is likely to be generated from the front surface electrode 311 of the switching element 31, as shown in FIG. 22. On the switching element 31, the leakage current Lc tries to flow along the front surface of the insulating film 314 and the side surface 31C. The provision of the moisture-resistant layer 51 makes the path of the leakage current Lc longer, making it difficult for the leakage current Lc to flow. Since the leakage current Lc is thus prevented from reaching the mounting layer, breakdown of the switching element 31 due to the flow of the leakage current Lc is prevented. Thus, the semiconductor device A10 operates stably under high temperature and high humidity conditions. When the switching element 31 or the protective element 32 has a relatively small thickness of 150 μm or less, the path of the leakage current Lc becomes relatively short. When a voltage of 1,200 V or more is applied to such a semiconductor device, the leakage current Lc flows relatively easily. Provision of the moisture-resistant layer 51 is particularly effective for such a relatively thin switching element 31.

Figure 23:
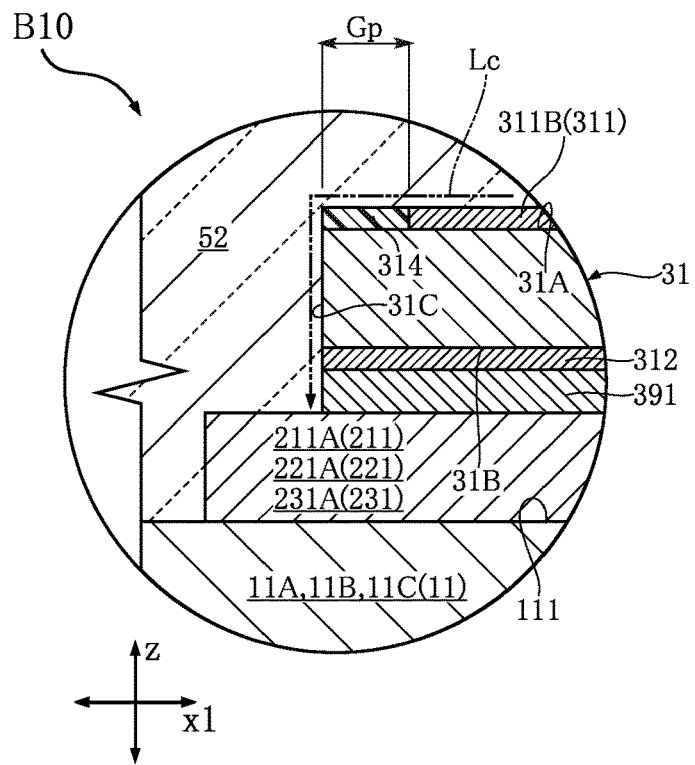
FIG. 23 is a sectional view showing a portion of a semiconductor device of a comparative example (a switching element bonded to an upper arm layer) as enlarged.

In the comparative example B10 shown in FIG. 23, which does not include a moisture-resistant layer 51, the leakage current Lc is conducted to the mounting layer (the first mounting layer 211, the second mounting layer 221 and the third mounting layer 231) along the side surface 31C of the switching element 31. This causes a short circuit between the front surface electrode 311 and the back surface electrode 312 of the switching element 31, resulting in breakdown of the switching element 31.

It is preferable that the moisture-resistant layer 51 contains polyimide. Polyimide is an electrically insulating material that is resistant to temperature cycling and not easily affected by moisture. Thus, by containing polyimide, the moisture-resistant layer 51 reliably prevents the leakage current Lc from flowing along the side surface 31C as shown in FIG. 22 even under high temperature and high humidity conditions.

It is preferable that the moisture-resistant layer 51 contains silicone gel in addition to polyimide. Such a moisture-resistant layer 51 has a lower Young's modulus as compared with a moisture-resistant layer 51 made of polyimide alone. Thus, the moisture-resistant layer 51 easily follows the thermal strain of the switching element 31 during the use of the semiconductor device A10. This reduces the shearing stress acting on the switching element 31.

Moreover, containing polyimide and silicone gel in the moisture-resistant layer 51 enhances the resistance of the moisture-resistant layer 51 to temperature cycling. A semiconductor device A10 with a moisture-resistant layer 51 made of polyimide alone was subjected to a temperature cycling test in a range of −40 to 125° C. As a result, the semiconductor device A10 was broken after about 20 cycles. Presumably, a crack was formed in the moisture-resistant layer 51, and moisture entering through the crack caused the breakdown. A semiconductor device A10 with a moisture-resistant layer 51 made of polyimide and silicone gel was subjected to the same temperature cycling test, and the semiconductor device A10 was not broken even after 1000 cycles. This is because the Young's modulus of this moisture-resistant layer 51 is lower than that of the moisture-resistant layer 51 made of polyimide alone, and hence the shearing stress acting on the moisture-resistant layer 51 due to thermal expansion or contraction is reduced. Thus, it is preferable that the moisture-resistant layer 51 contains polyimide and silicone gel.

The semiconductor device A10 includes wires 41 connected to the front surface electrodes 311 of the switching elements 31, and the wires 41 extend in the first direction x1. Thus, the moisture-resistant layer 51 that covers the side surface 31C of the switching element 31 can be formed without being hindered by the wires 41.

The first bonding portion 411 of each of the paired outer wires 41B has the first connect portion 411A held in contact with the first pad 311A, the second connect portion 411B held in contact with the second pad 311B, and the joint portion 411C located between the first connect portion 411A and the second connect portion 411B. The joint portion 411C projects in the same direction in which the front surface 31A of the switching element 31 faces along the thickness direction z. As shown in FIGS. 16 and 19, it is preferable that the height H of the joint portion 411C in the thickness direction z from the front surface of the front surface electrode 311 of the switching element 31 to the top C of the joint portion 411C is not less than three times the diameter of the wires 41. For example, when the diameter of the wires 41 is 300 µm, it is preferable that the height H of the joint portion 411C is 900 µm or more. With such a configuration, the joint portion 411C functions as an elastic member capable of elastically deforming in the first direction x1 to reduce the shearing stress acting on the first connect portion 411A and the second connect portion 411B. Thus, detachment of the first bonding portion 411 from the front surface electrode 311 due to shearing stress is prevented. In the semiconductor device A10, the diameter of the wires 41 is 400 µm, and the height H of the joint portion 411C is 1,600 µm. Note that when the height H of the joint portion 411C in the semiconductor device A10 is 800 µm, at least one of the first connect portion 411A or the second connect portion 411B may be detached in the $\Delta T_j$ power cycling test described later.

The semiconductor device A10 has the heat sink 61 bonded to the back surface 112 of the substrate 11. Thus, the heat generated at the switching elements 31 is efficiently dissipated outside the semiconductor device A10. In this case, it is preferable that the substrate 11 is made of a ceramic with excellent thermal conductivity (e.g. aluminum nitride).

FIGS. 24-50 show semiconductor devices A11 to A15 that are variations of the semiconductor device A10.

[First Variation]

Figure 24:
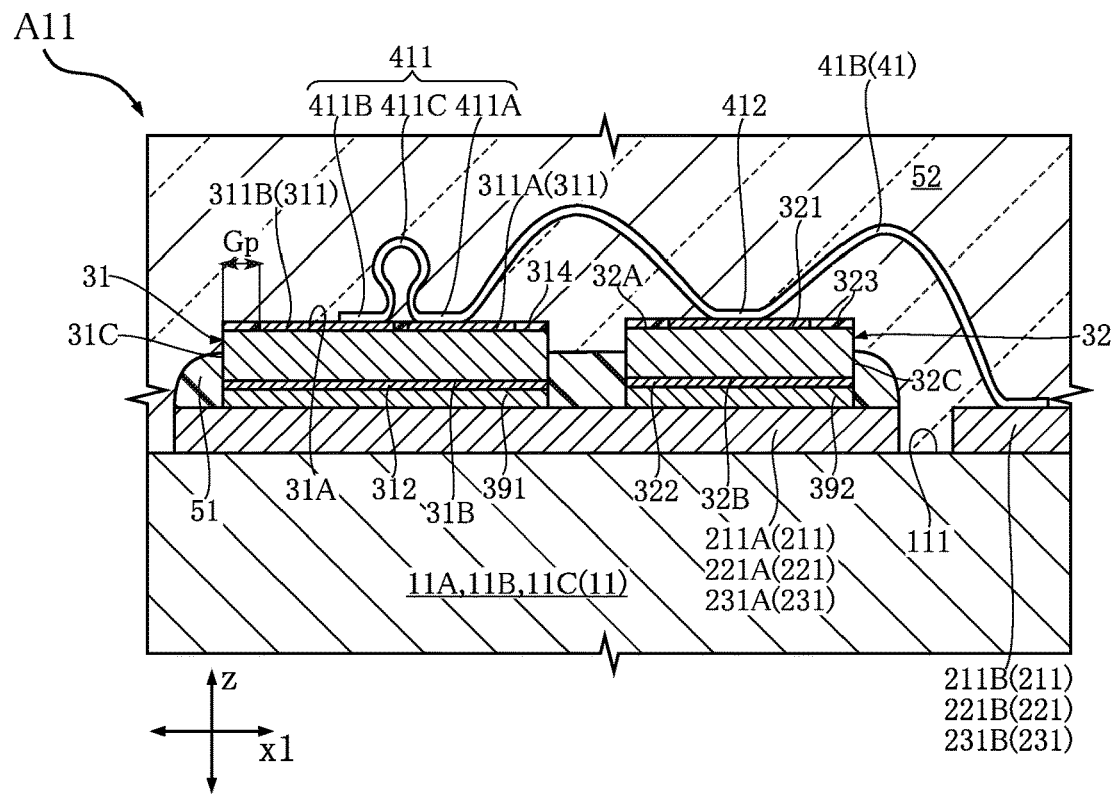
FIG. 24 is a sectional view showing a portion of a semiconductor device (a switching element and a protective element bonded to the upper arm layer) according to a first variation of the first embodiment of the present disclosure.
Figure 25:
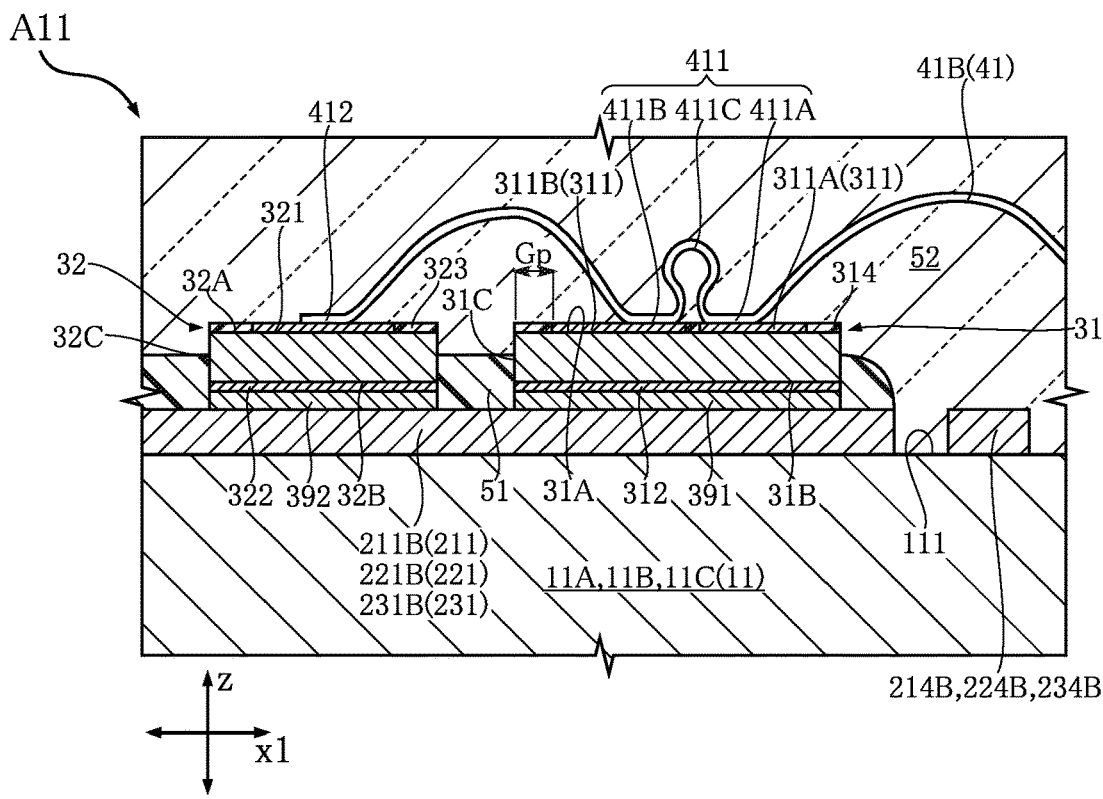
FIG. 25 is a sectional view showing a portion of the semiconductor device (a switching element and a protective element bonded to the lower arm layer) according to the first variation of the first embodiment of the present disclosure.
Figure 26:
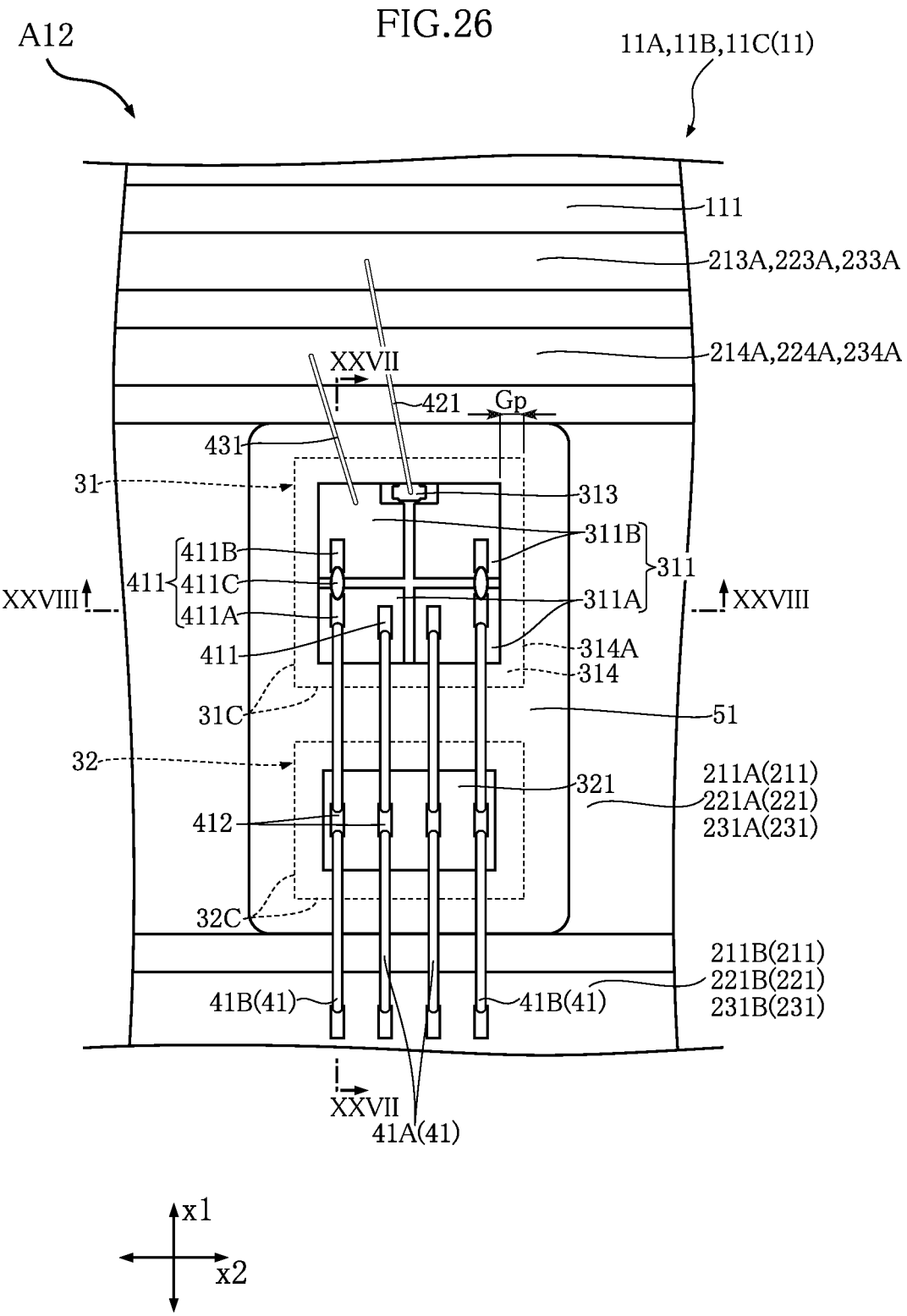
FIG. 26 is a plan view showing a portion of a semiconductor device (a switching element and a protective element bonded to the upper arm mounting layer) according to a second variation of the first embodiment of the present disclosure.
Figure 27:
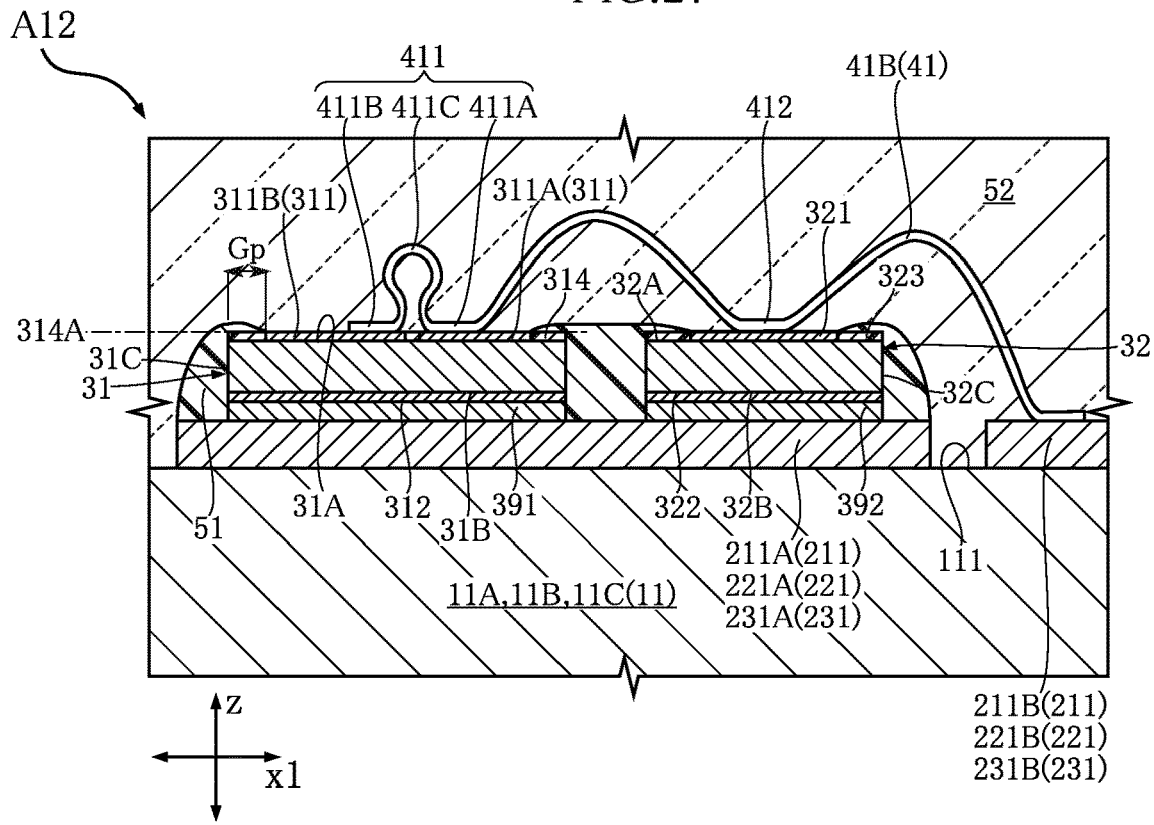
FIG. 27 is a sectional view taken along line XXVII-XXVII in FIG. 26.
Figure 28:
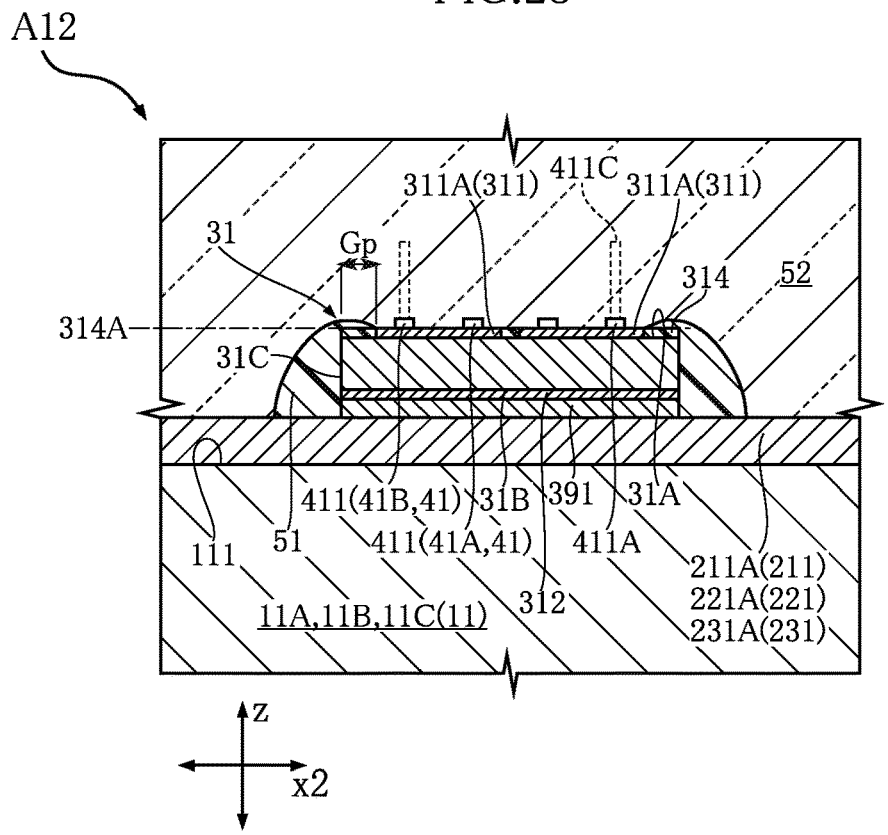
FIG. 28 is a sectional view taken along line XXVIII-XXVIII in FIG. 26.
Figure 29:
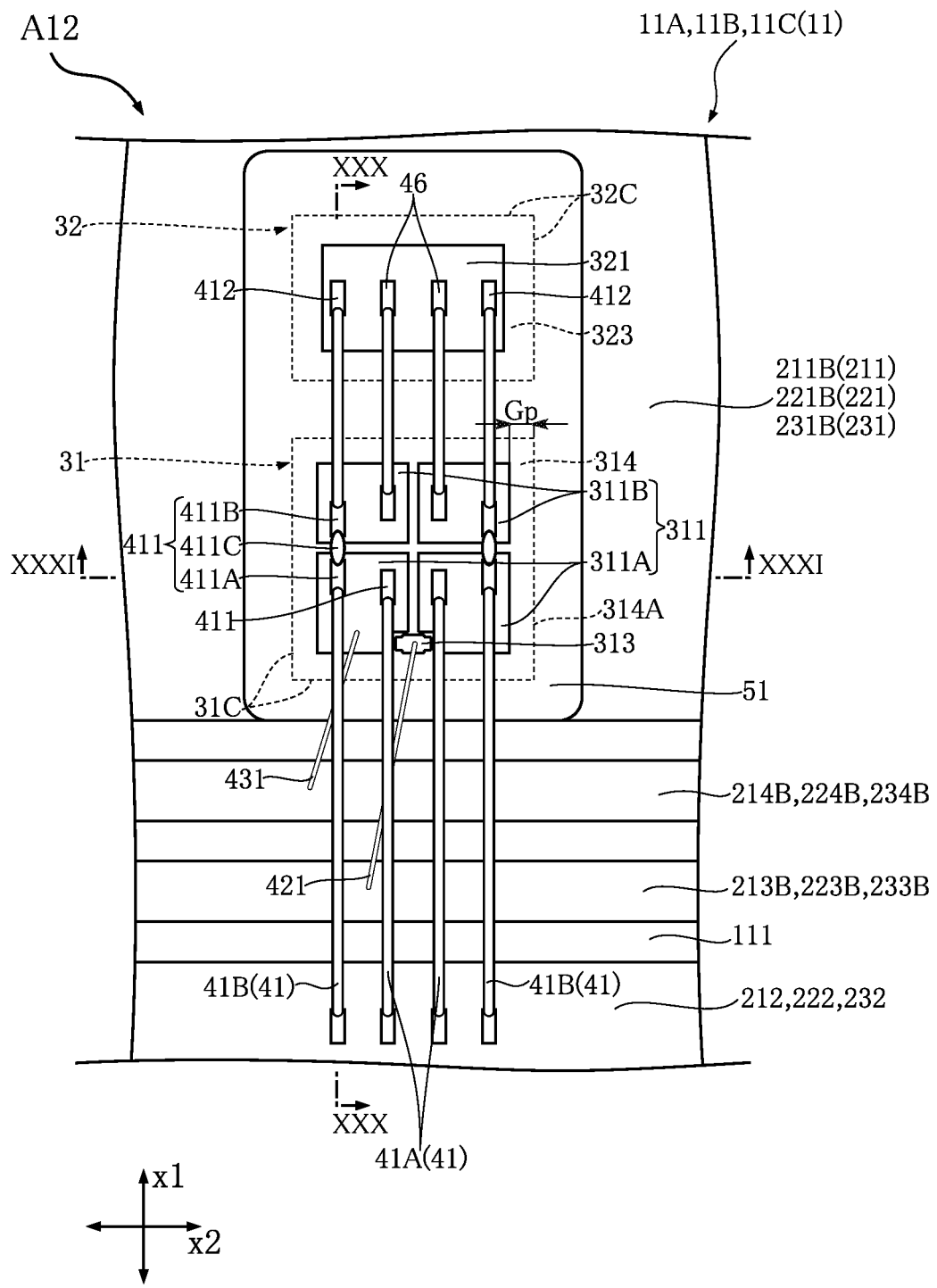
FIG. 29 is a plan view showing a portion of a semiconductor device (a switching element and a protective element bonded to the lower arm mounting layer) according to the second variation of the first embodiment of the present disclosure.
Figure 30:
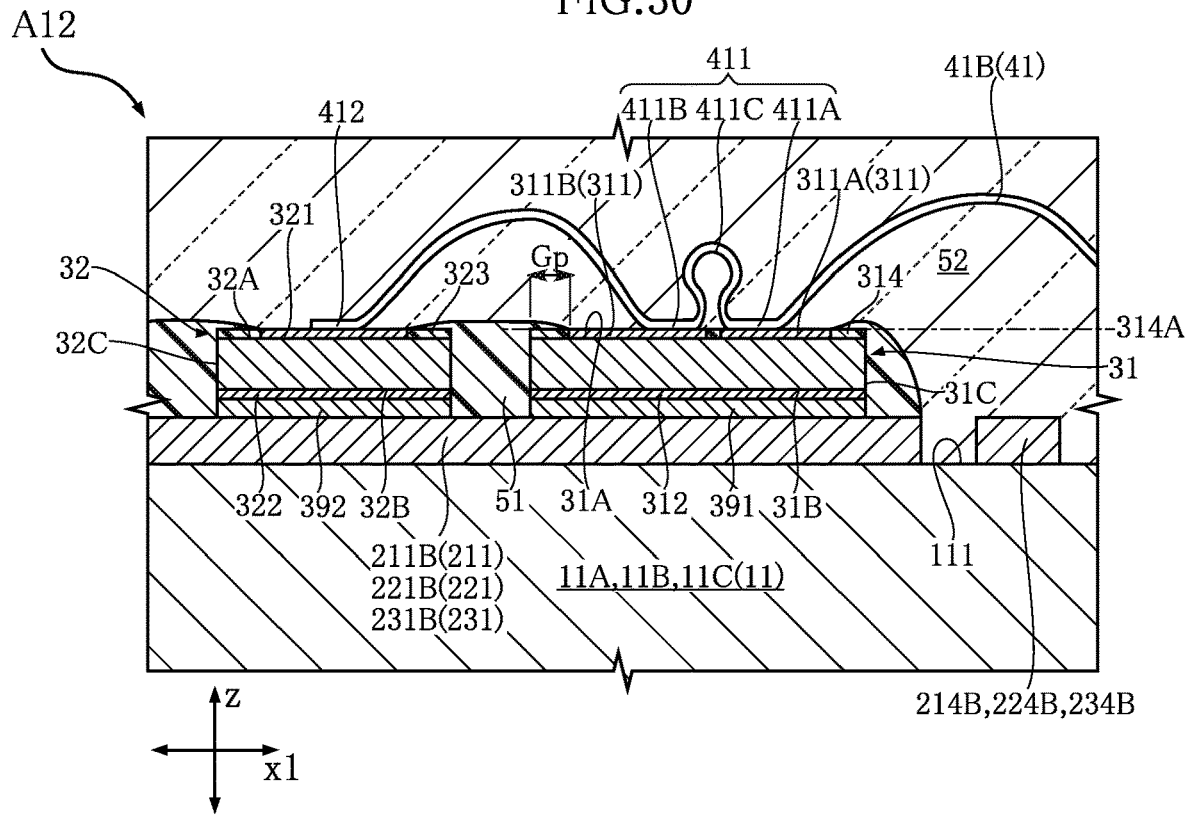
FIG. 30 is a sectional view taken along line XXX-XXX in FIG. 29.
Figure 31:
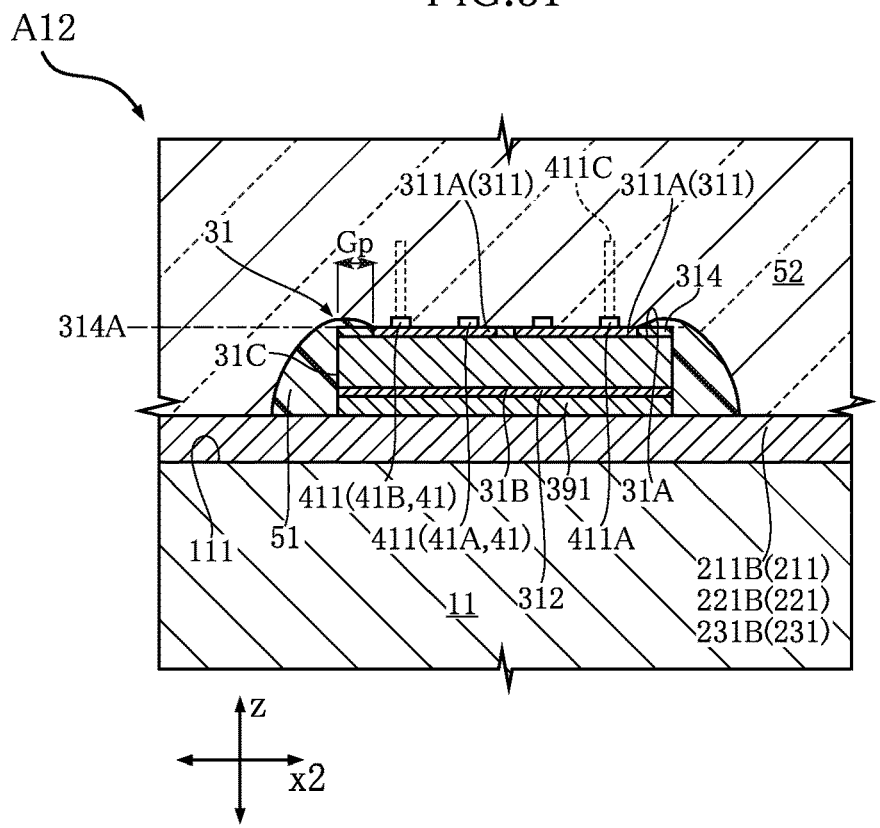
FIG. 31 is a sectional view taken along line XXXI-XXXI in FIG. 29.

A semiconductor device A11 according to a first variation of the semiconductor device A10 is described with reference to FIGS. 24 and 25. The semiconductor device A11 is an example in which the contact area of the moisture-resistant layer 51 with the switching element 31 is smaller than that in the foregoing semiconductor device A10. Note that FIG. 24 is a sectional view taken along the same plane as FIG. 16. FIG. 25 is a sectional view taken along the same plane as FIG. 19.

As shown in FIGS. 24 and 25, the moisture-resistant layer 51 covers a part of the side surface 31C of the switching element 31.

The advantages of the semiconductor device A11 are described below.

With the configuration of the semiconductor device A11, the moisture-resistant layer 51 is held in contact with both of the mounting layer (the first mounting layer 211, the second mounting layer 221 and the third mounting layer 231) and the side surface 31C of the switching elements 31. In the thickness direction z, the moisture-resistant layer 51 extends to be spanned between the mounting layer and the side surface 31C. Thus, the semiconductor device A11 also operates stably under high temperature and high humidity conditions.

[Second Variation]

A semiconductor device A12 according to a second variation of the semiconductor device A10 is described with reference to FIGS. 26-31. The semiconductor device A12 is an example in which the contact area of the moisture-resistant layer 51 with the switching element 31 is larger than that in the foregoing semiconductor device A10.

As shown in FIGS. 26-31, at the switching element 31, the moisture-resistant layer 51 is held in contact with both of the side surface 31C and the insulating film 314. The moisture-resistant layer 51 spans the edge 314A, as viewed in the thickness direction z, of the insulating film 314.

The advantages of the semiconductor device A12 are described below.

With the configuration of the semiconductor device A12, the moisture-resistant layer 51 is held in contact with both of the mounting layer (the first mounting layer 211, the second mounting layer 221 and the third mounting layer 231) and the side surface 31C of the switching elements 31. In the thickness direction z, the moisture-resistant layer 51 extends to be spanned between the mounting layer and the side surface 31C. Thus, the semiconductor device A12 also operates stably under high temperature and high humidity conditions.

At the switching element 31 of the semiconductor device A12, the moisture-resistant layer 51 is held in contact with both of the side surface 31C and the insulating film 314. The moisture-resistant layer 51 spans the edge 314A, as viewed in the thickness direction z, of the insulating film 314. Such a configuration makes the path of the leakage current Lc shown in FIG. 22 longer than that in the semiconductor device A10, making it more difficult for the leak current Lc to flow than in the semiconductor device A10. Moreover, since the moisture-resistant layer 51 covers the insulating film 314, the insulating film 314 is protected from external factors.

[Third Variation]

A semiconductor device A13 according to a third variation of the semiconductor device A10 is described with reference to FIGS. 32-37. The semiconductor device A13 is an example in which the contact area of the moisture-resistant layer 51 with the switching element 31 is larger than that in the foregoing semiconductor device A12.

As shown in FIGS. 32-37, at the switching element 31, the moisture-resistant layer 51 is held in contact with both of the side surface 31C and the insulating film 314. The moisture-resistant layer 51 spans the edge 314A, as viewed in the thickness direction z, of the insulating film 314. Moreover, the moisture-resistant layer 51 is held in contact with at least a part of the front surface electrode 311.

The advantages of the semiconductor device A13 are described below.

With the configuration of the semiconductor device A13, the moisture-resistant layer 51 is held in contact with both of the mounting layer (the first mounting layer 211, the second mounting layer 221 and the third mounting layer 231) and the side surface 31C of the switching elements 31. In the thickness direction z, the moisture-resistant layer 51 extends to be spanned between the mounting layer and the side surface 31C. Thus, the semiconductor device A13 also operates stably under high temperature and high humidity conditions.

Figure 32:
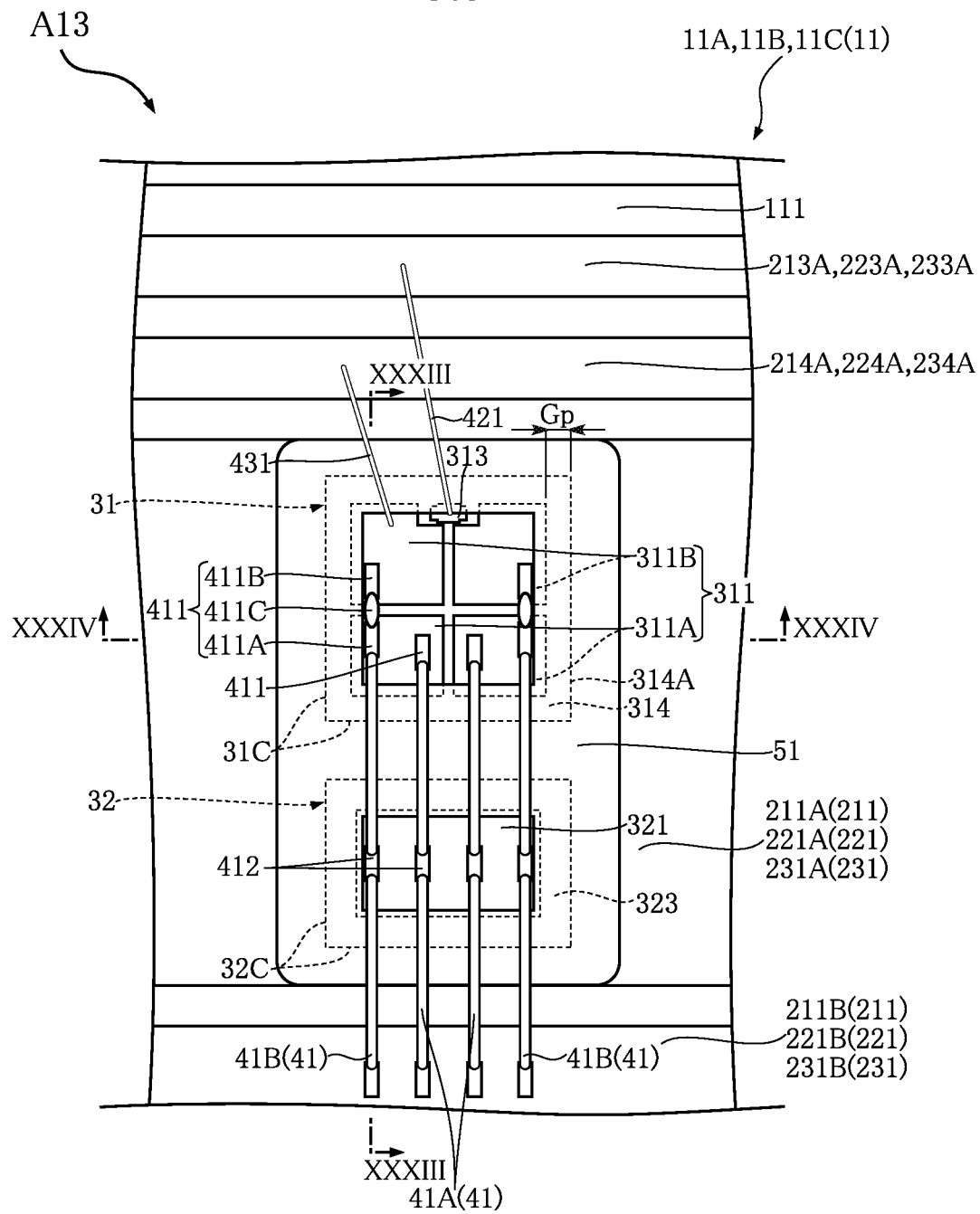
FIG. 32 is a plan view showing a portion of a semiconductor device (a switching element and a protective element bonded to the upper arm mounting layer) according to a third variation of the first embodiment of the present disclosure.
Figure 33:
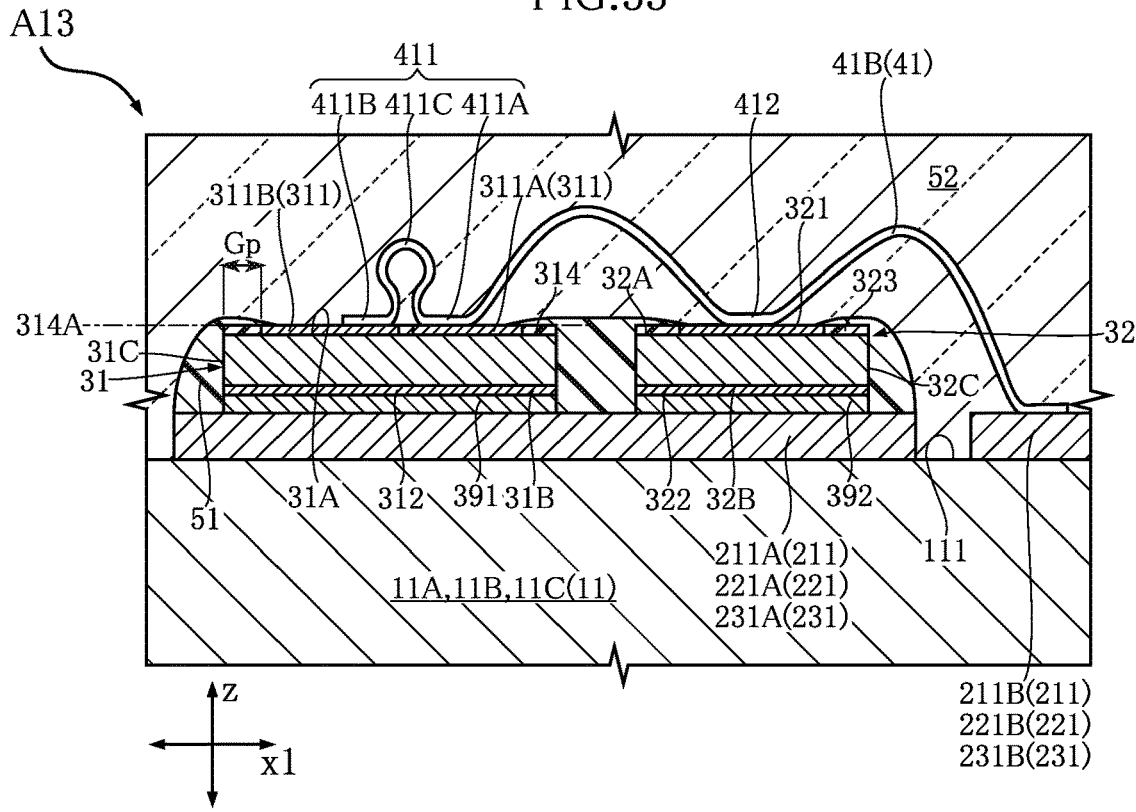
FIG. 33 is a sectional view taken along line XXXIII-XXXIII in FIG. 32.
Figure 34:
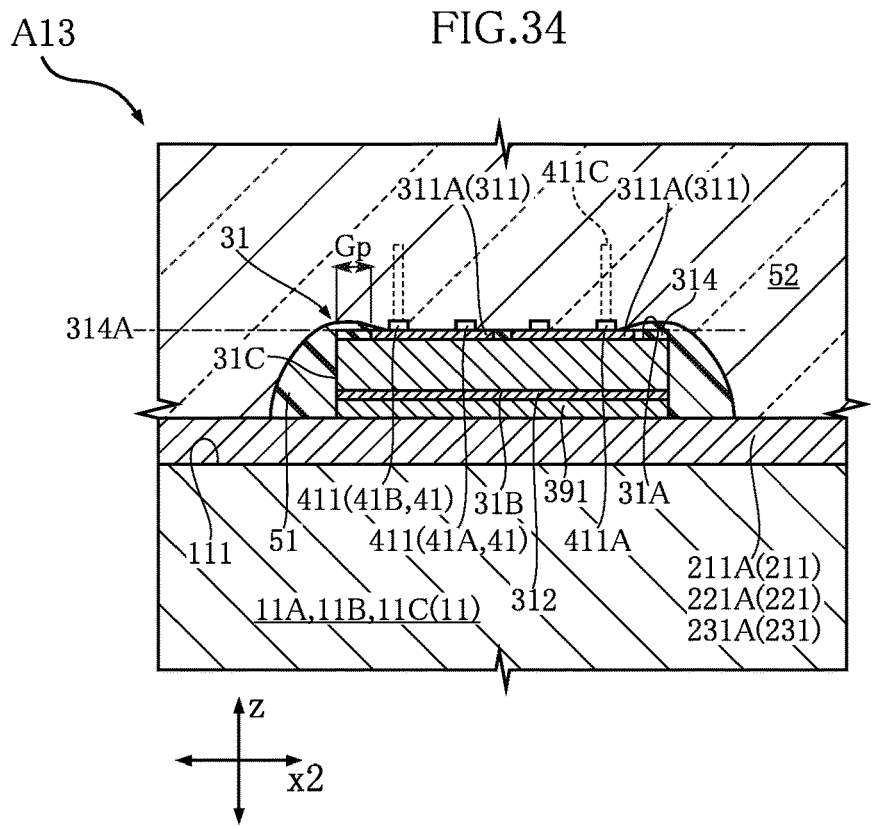
FIG. 34 is a sectional view taken along line XXXIV-XXXIV in FIG. 32.
Figure 35:
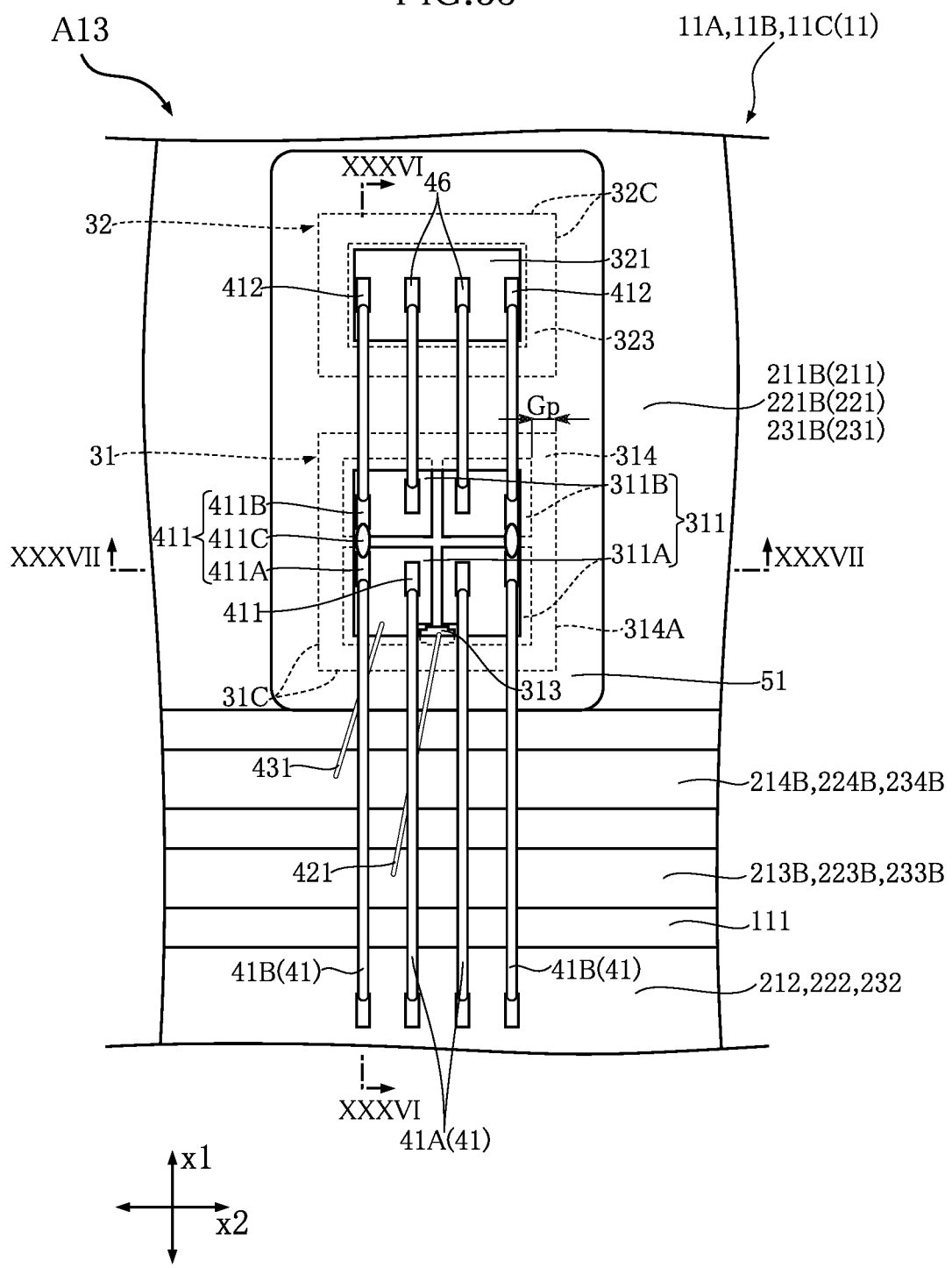
FIG. 35 is a plan view showing a portion of a semiconductor device (a switching element and a protective element bonded to the lower arm mounting layer) according to the third variation of the first embodiment of the present disclosure.
Figure 36:
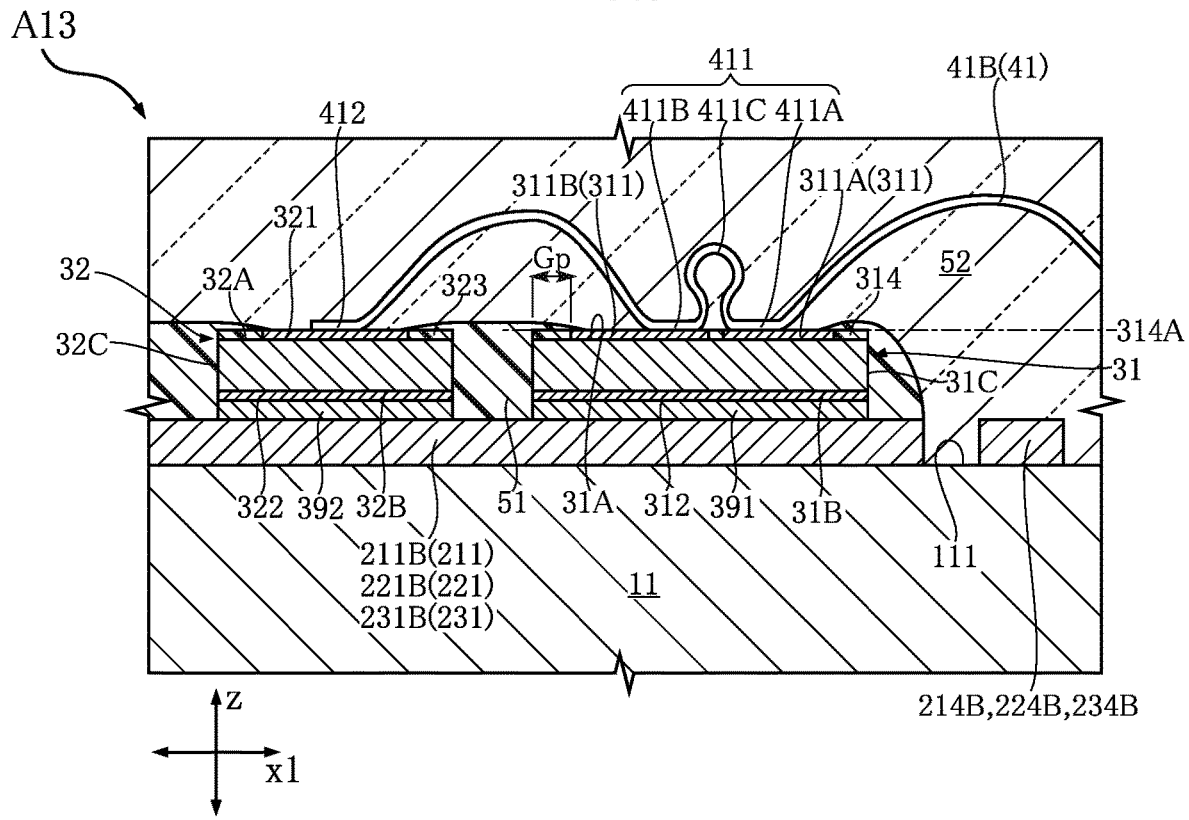
FIG. 36 is a sectional view taken along line XXXVI-XXXVI in FIG. 35.
Figure 37:
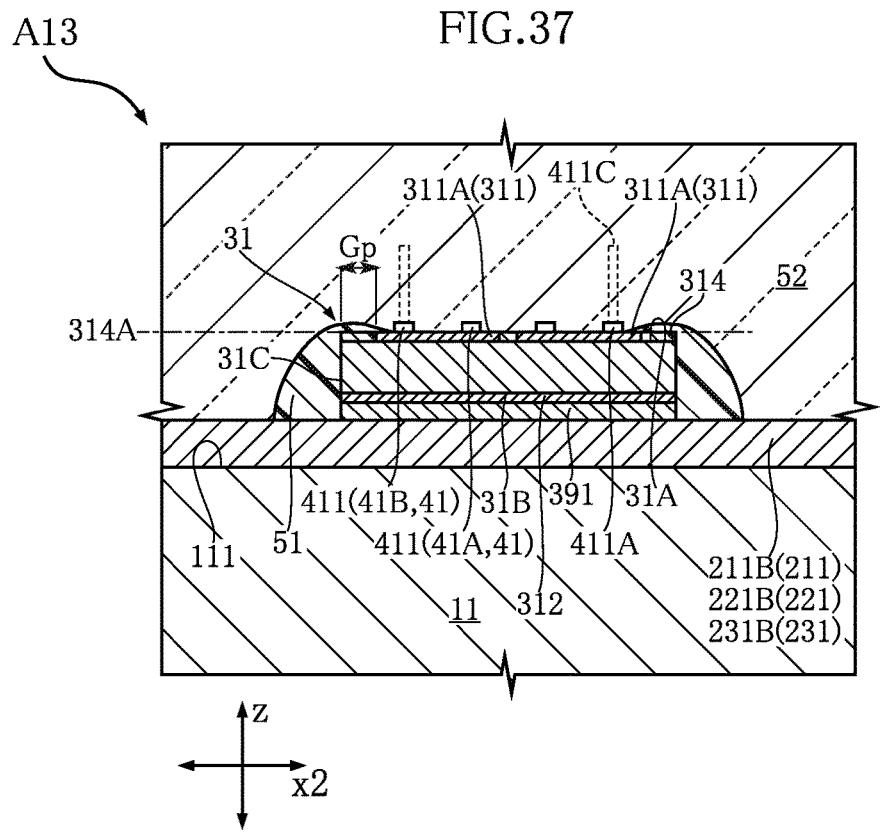
FIG. 37 is a sectional view taken along line XXXVII-XXXVII in FIG. 35.

At the switching element 31 of the semiconductor device A13, the moisture-resistant layer 51 is held in contact with both of the side surface 31C and the insulating film 314, and also in contact with at least a part of the front surface electrode 311. As shown in FIGS. 32 and 35, as viewed in the thickness direction z, the moisture-resistant layer 51 surrounds the front surface electrode 311 while overlapping with a part of the front surface electrode 311. This configuration improves the dielectric breakdown voltage of the side surface 31C as compared with that in the semiconductor device A12, making it more difficult for the leak current Lc to flow than in the semiconductor device A12. Moreover, since the moisture-resistant layer 51 covers the insulating film 314, the insulating film 314 is protected from external factors.

[Fourth Variation]

A semiconductor device A14 according to a fourth variation of the semiconductor device A10 is described with reference to FIGS. 38-43. The semiconductor device A14 is an example in which the contact area of the moisture-resistant layer 51 with the switching element 31 is larger than that in the foregoing semiconductor device A13.

As shown in FIGS. 38-43, at the switching element 31, the moisture-resistant layer 51 is held in contact with both of the side surface 31C and the insulating film 314. The moisture-resistant layer 51 spans the edge 314A, as viewed in the thickness direction z, of the insulating film 314. Moreover, the moisture-resistant layer 51 is held in contact with the front surface electrode 311 and at least a part of the first bonding portions 411 of the wires 41. Thus, the switching elements 31 are entirely covered with the moisture-resistant layer 51. However, the first bonding portions 411 are not completely covered with the moisture-resistant layer 51, and the upper ends of the first bonding portions 411 are exposed from the moisture-resistant layer 51. That is, the thickness of the moisture-resistant layer 51 covering the front surface 31A of the switching element 31 is smaller than the diameter of the wires 41.

As shown in FIGS. 38, 39, 41 and 42, the moisture-resistant layer 51 covers the entirety of the front surface of the protective element 32 associated with the switching element 31. However, the second bonding portions 412 of the wires 41 are not completely covered with the moisture-resistant layer 51, and the upper ends of the second bonding portions 411 are exposed from the moisture-resistant layer 51. That is, the thickness of the moisture-resistant layer 51 covering the front surface 32A of the protective element 32 is smaller than the diameter of the wires 41.

An example of a method for forming the moisture-resistant layer 51 of the semiconductor device A14 is described below. A liquefied synthetic resin material containing polyimide, silicone gel and solvent is prepared. Note that the solvent is volatile. Then, after the switching elements 31 and the protective elements 32 are electrically connected to the mounting layer on which these elements are mounted (the first mounting layer 211, the second mounting layer 221 and the third mounting layer 231), the synthetic resin material is dropped onto respective upper surfaces of a switching element 31 and a protective element 32 with a dispenser. Since the synthetic resin material has fluidity, it spreads over the entirety of the upper surface of the switching element 31 including the front surface electrode 311, the gate electrode 313 and the insulating film 314, and further spreads from the side surface 31C of the switching element 31 onto the mounting layer. Similarly, at the protective element 32, the entirety of the front surface of the protective element 32 is covered with the synthetic resin material. Thus, the entirety of the front surface of the switching element 31 is covered with the synthetic resin material. Due to the surface tension of the synthetic resin material, the thickness of the synthetic resin material on the upper surface of the switching element 31 becomes generally uniform. Finally, the synthetic resin material is heat-cured to obtain the moisture-resistant layer 51. In this process, the solvent volatilizes. With this method, the moisture-resistant layer 51 covering the switching element 31 and the protective element 32 is easily formed.

The advantages of the semiconductor device A14 are described below.

With the configuration of the semiconductor device A14, the moisture-resistant layer 51 is held in contact with both of the mounting layer (the first mounting layer 211, the second mounting layer 221 and the third mounting layer 231) and the side surface 31C of the switching elements 31. In the thickness direction z, the moisture-resistant layer 51 extends to be spanned between the mounting layer and the side surface 31C. Thus, the semiconductor device A14 also operates stably under high temperature and high humidity conditions.

At each of the switching elements 31, the moisture-resistant layer 51 is held in contact with both of the side surface 31C and the insulating film 314. The moisture-resistant layer 51 is also held in contact with the front surface electrode 311 and at least a part of the first bonding portions 411 of the wires 41. Since the entirety of the switching element 31 is covered with the moisture-resistant layer 51 in this way, moisture entering the sealing resin 52 is prevented from reaching the front surface of the switching element 31. Thus, dielectric breakdown of the switching elements 31 caused by the leakage current Lc shown in FIG. 22, which is due to the influence of moisture, is effectively prevented. Moreover, since the moisture-resistant layer 51 covers the insulating film 314, the insulating film 314 is protected from external factors.

Figure 38:
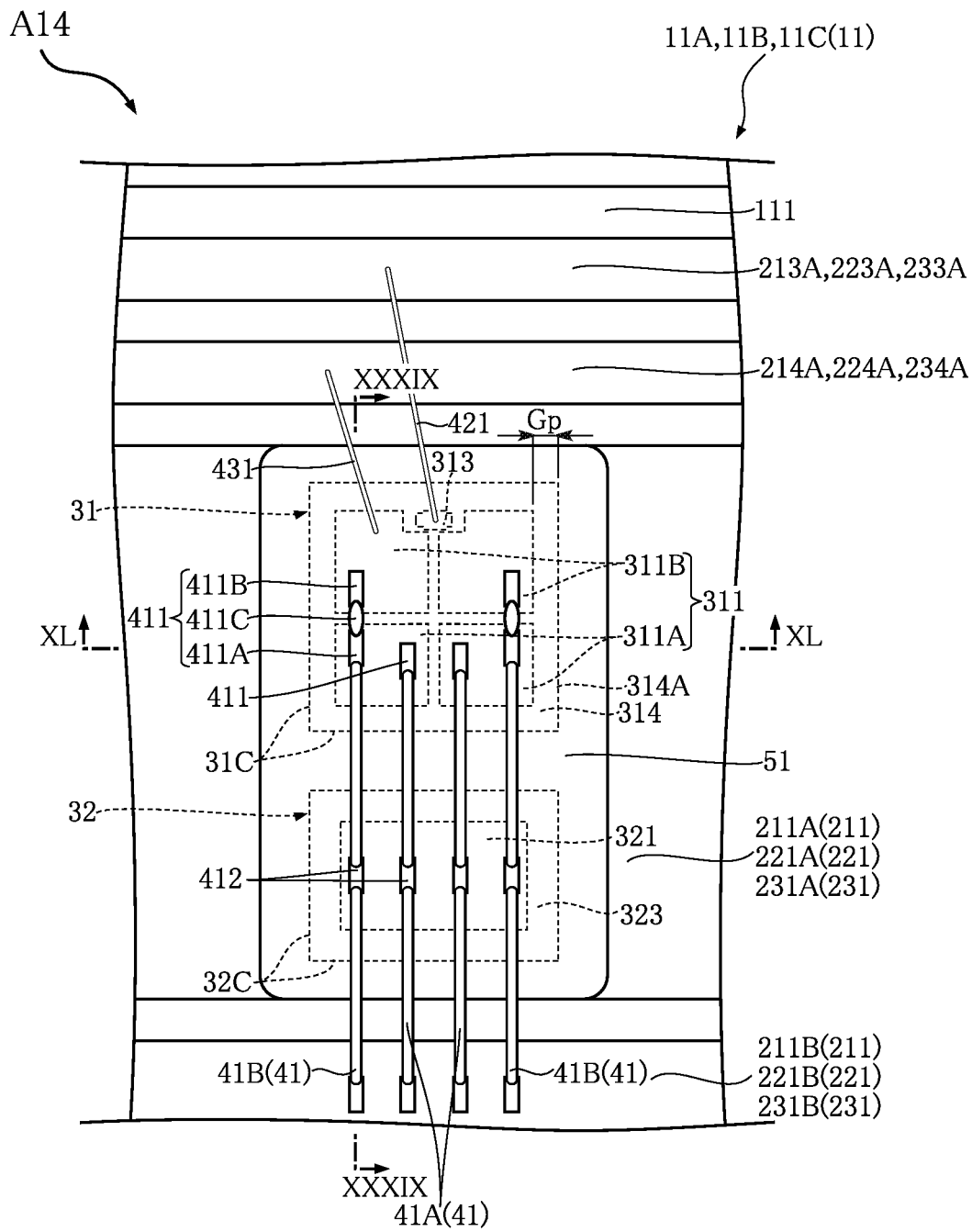
FIG. 38 is a plan view showing a portion of a semiconductor device (a switching element and a protective element bonded to the upper arm mounting layer) according to a fourth variation of the first embodiment of the present disclosure.
Figure 39:
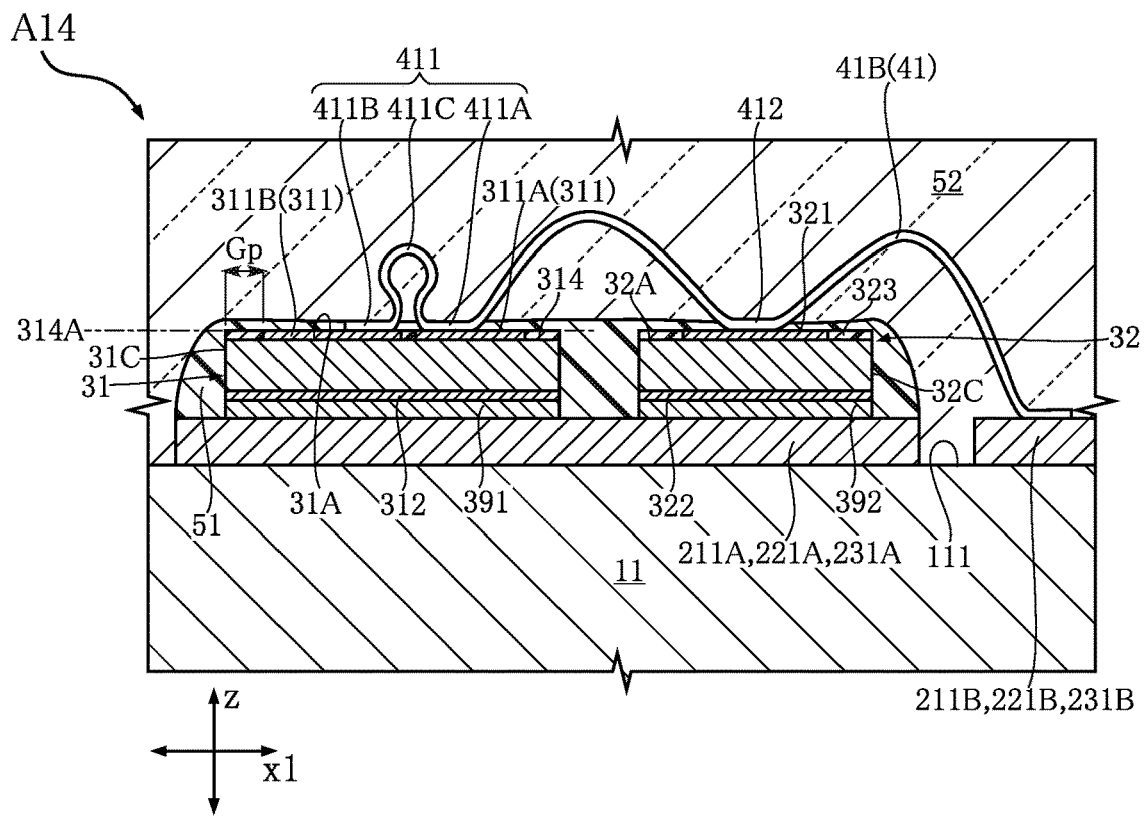
FIG. 39 is a sectional view taken along line XXXIX-XXXIX in FIG. 38.
Figure 40:
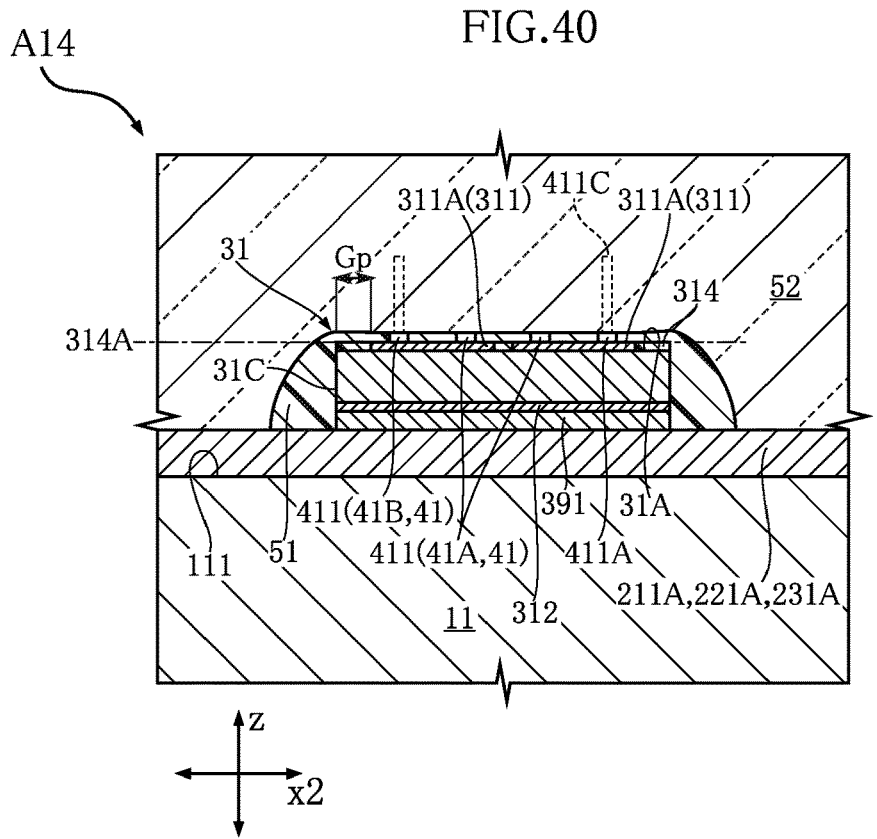
FIG. 40 is a sectional view taken along line XL-XL in FIG. 38.
Figure 41:
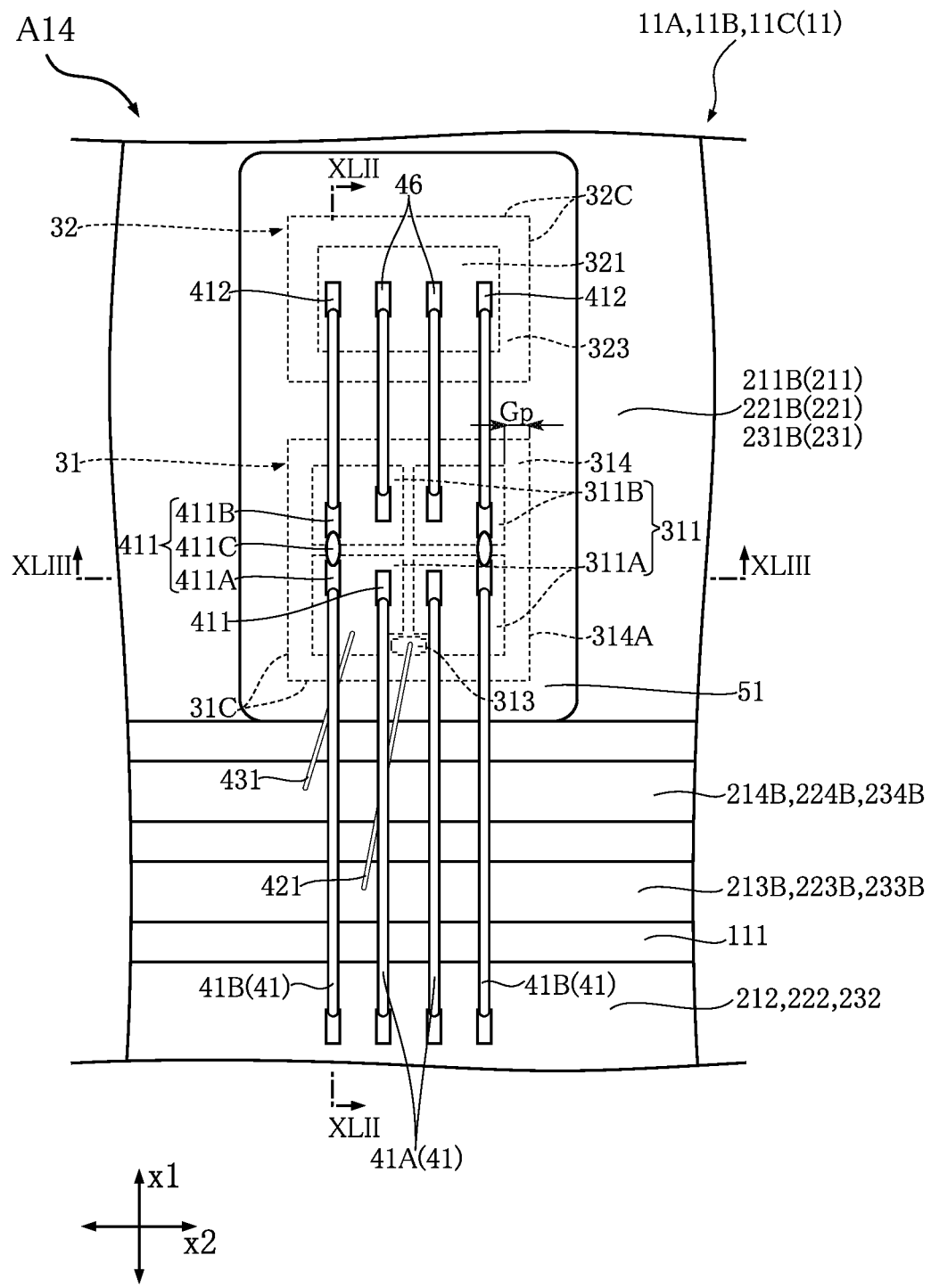
FIG. 41 is a plan view showing a portion of a semiconductor device (a switching element and a protective element bonded to the lower arm mounting layer) according to the fourth variation of the first embodiment of the present disclosure.
Figure 42:
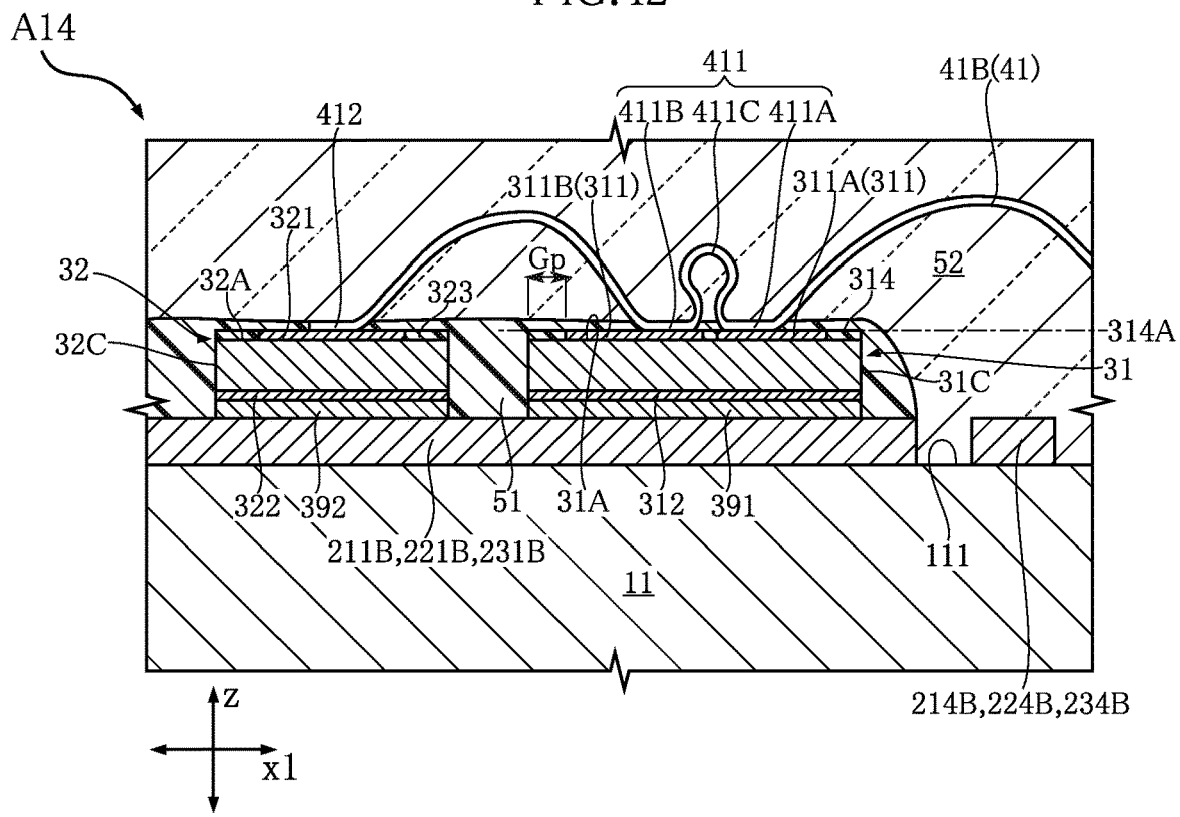
FIG. 42 is a sectional view taken along line XLII-XLII in FIG. 41.
Figure 43:
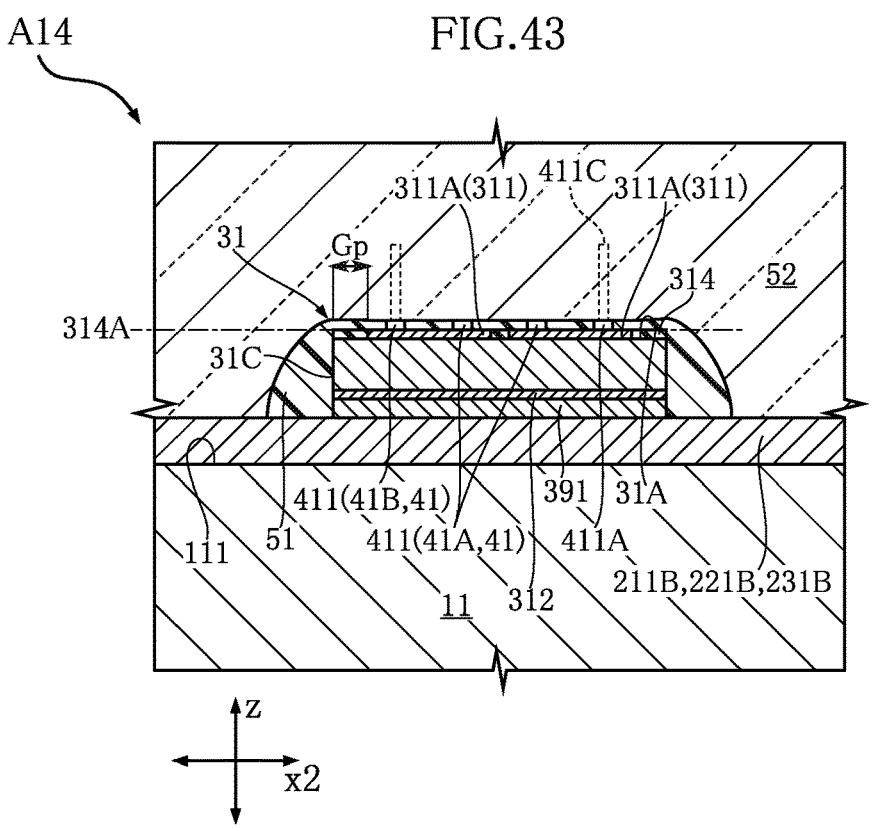
FIG. 43 is a sectional view taken along line XLIII-XLIII in FIG. 41.
Figure 44:
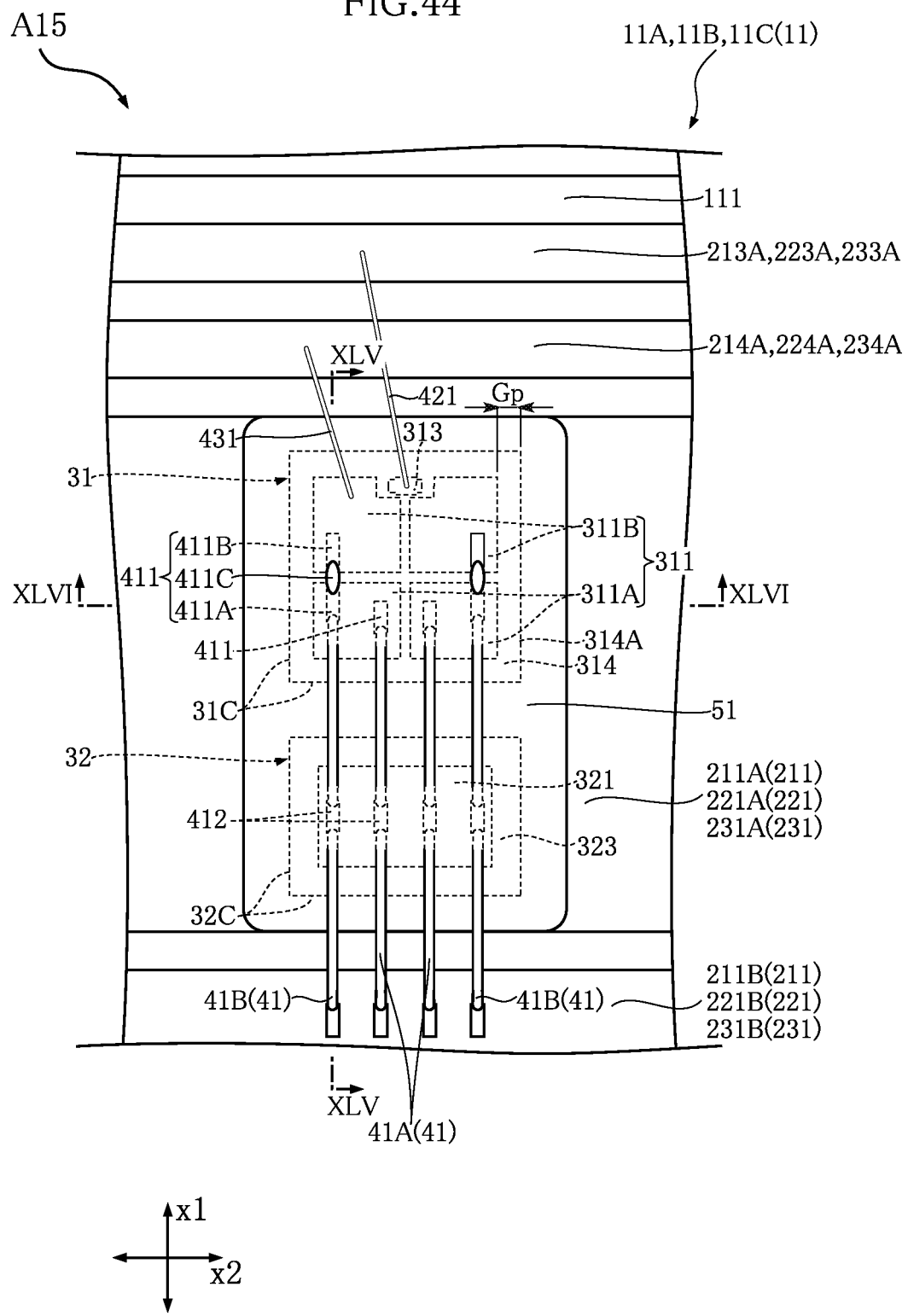
FIG. 44 is a plan view showing a portion of a semiconductor device (a switching element and a protective element bonded to the upper arm mounting layer) according to a fifth variation of the first embodiment of the present disclosure.
Figure 45:
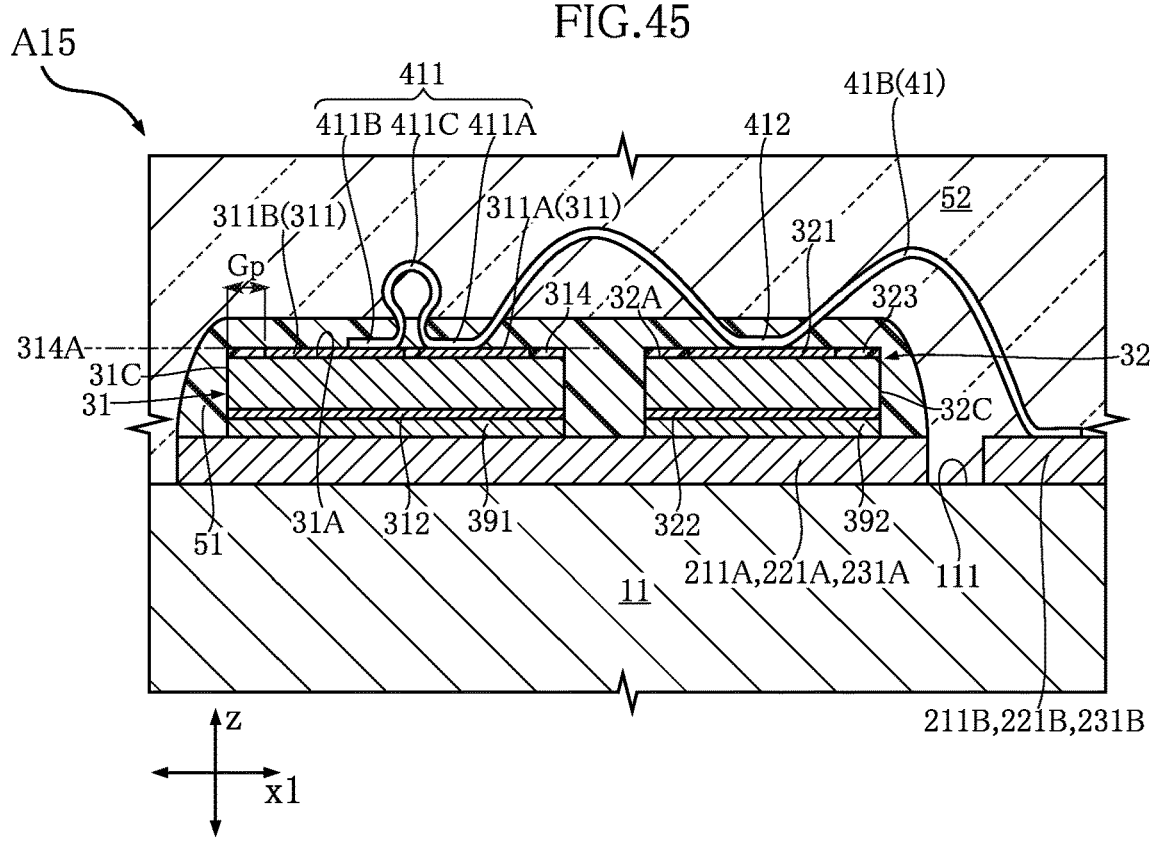
FIG. 45 is a sectional view taken along line XLV-XLV in FIG. 44.
Figure 46:
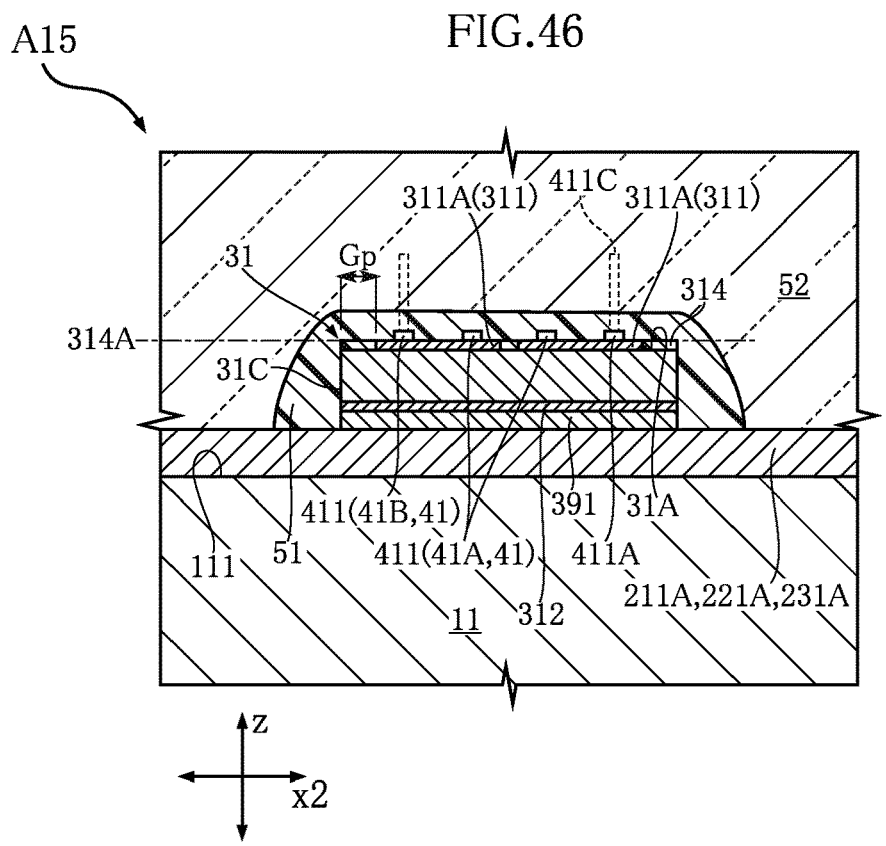
FIG. 46 is a sectional view taken along line XLVI-XLVI in FIG. 45.
Figure 47:
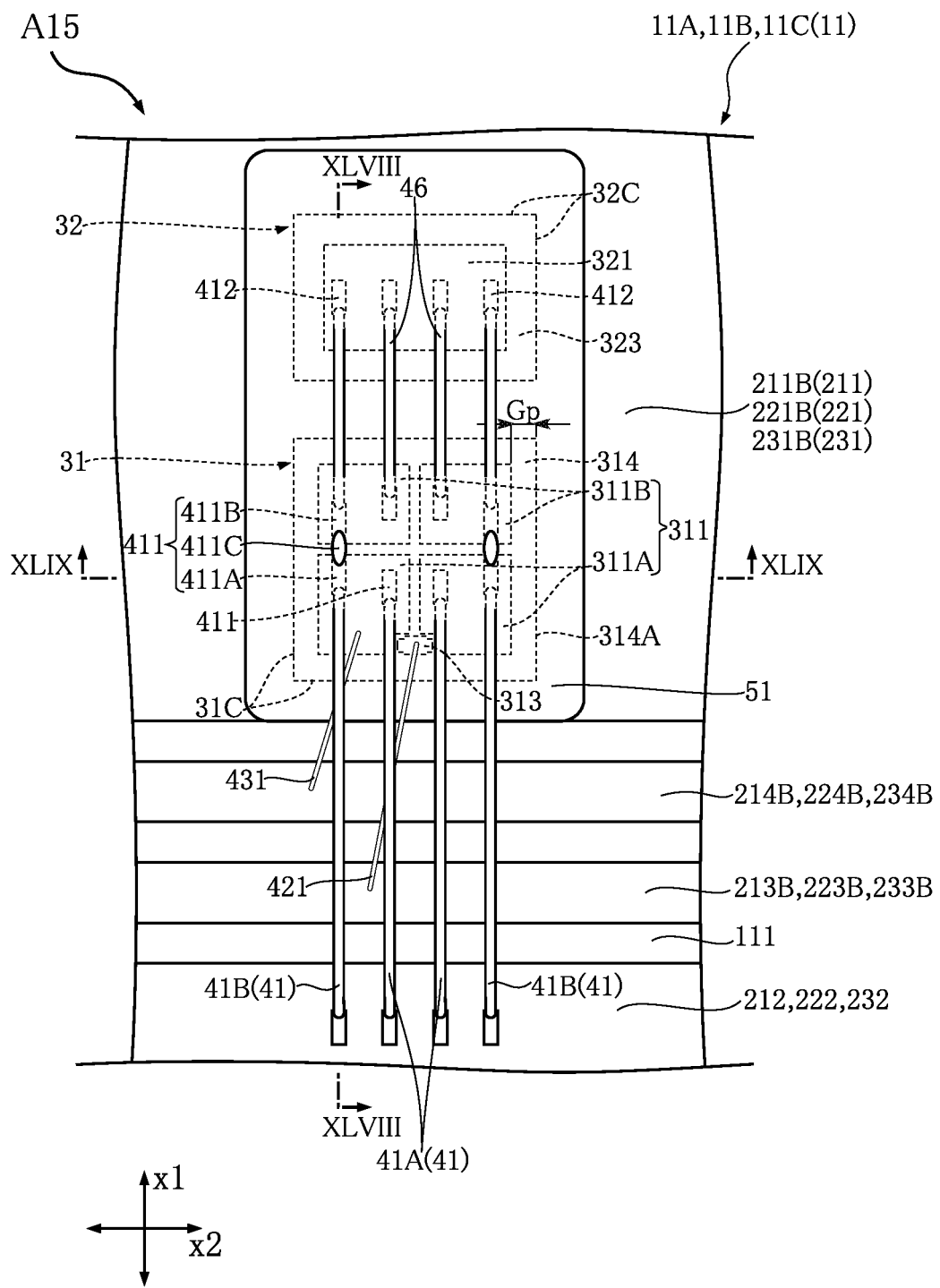
FIG. 47 is a plan view showing a portion of the semiconductor device (a switching element and a protective element bonded to the lower arm mounting layer) according to the fifth variation of the first embodiment of the present disclosure.
Figure 48:
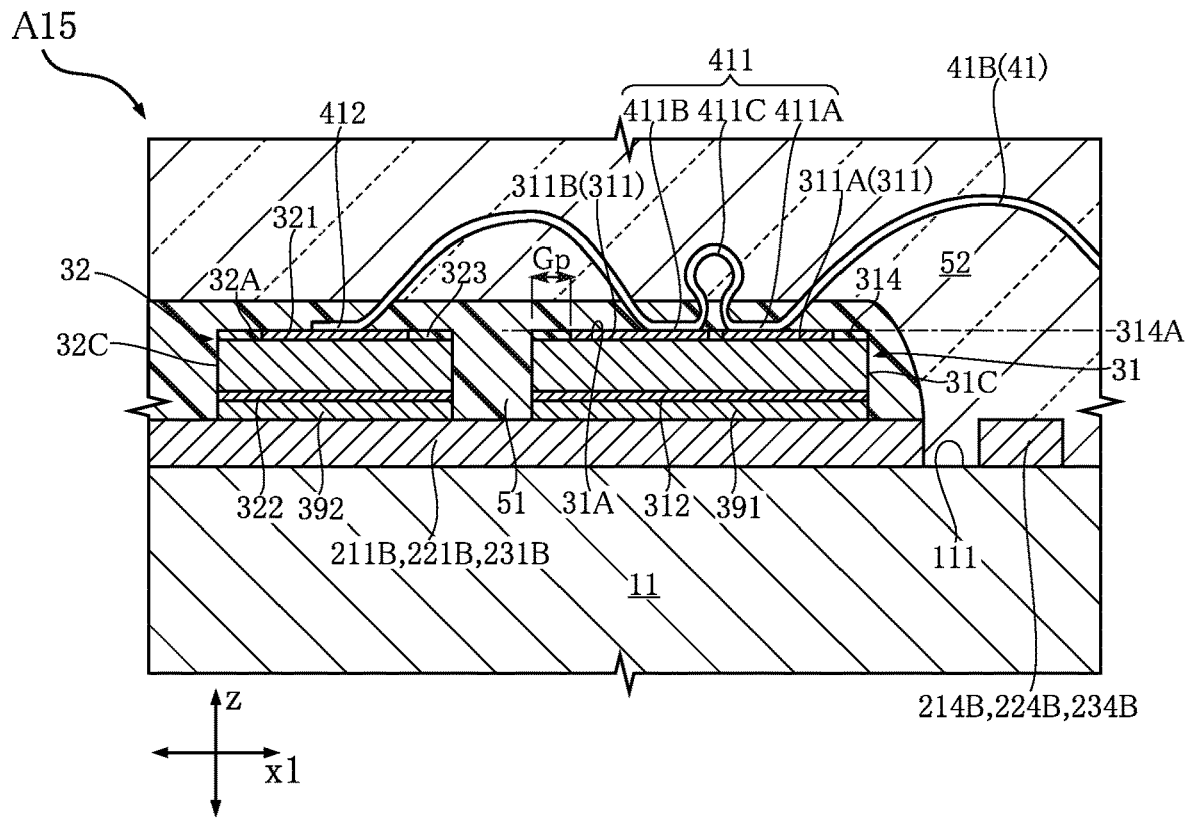
FIG. 48 is a sectional view taken along line XLVIII-XLVIII in FIG. 47.
Figure 49:
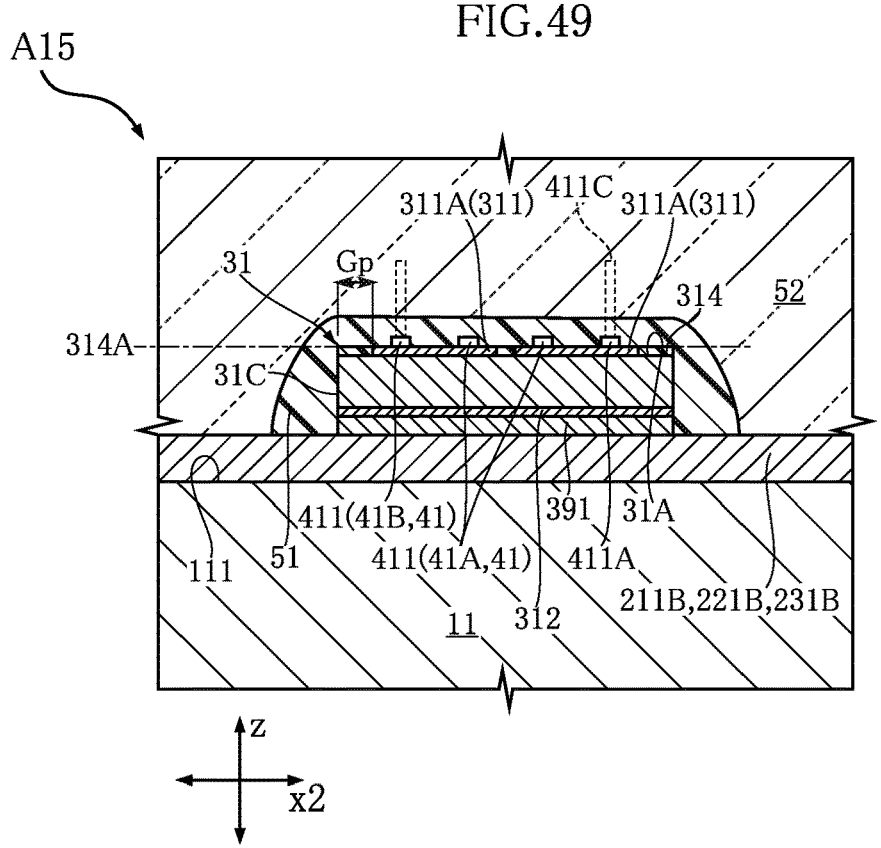
FIG. 49 is a sectional view taken along line XLIX-XLIX in FIG. 47.

At each of the switching elements 31, the paired outer wires 41B, each of which has the joint portion 411C of the first bonding portion 411 that projects in the thickness direction z, are arranged on the opposite sides of the paired inner wires 41A in the second direction x2. Thus, the synthetic resin material for forming the moisture-resistant layer 51 can be dropped from above the front surface 31A of the switching element 31 without interfering with the joint portion 411C. As shown in FIG. 38, in the semiconductor device A14, the joint portions 411C are provided only in the first bonding portions 411 of the paired outer wires 41B. It may be considered, as another example, to provide the joint portions 411C not only in the first bonding portions 411 of the paired outer wires 41B but also in the first bonding portions 411 of the paired inner wires 41A. With such a configuration, however, two adjacent joint portions 411C are located close to each other, which makes it difficult to drop the synthetic resin material for forming the moisture-resistant layer 51 onto the switching element 31. Moreover, when the synthetic resin material is dropped on the switching element 31, the synthetic resin material may rise to the upper end of the joint portions 411C. In such a case, since the Young's modulus of the moisture-resistant layer 51 is relatively high, heat generated from the switching elements 31 exerts a large shearing stress on the joint portions 411C. This may result in detachment of the first connect portions 411A and the second connect portions 411B of the first bonding portions 411 from the front surface electrode 311 of the switching element 31. Thus, in terms of the reliability of the semiconductor device A14, it is preferable that a larger distance is secured between two adjacent joint portions 411C in the second direction x2.

The moisture-resistant layer 51 also covers the entirety of the protective element 32 associated with the switching element 31 which the moisture-resistant layer covers. Thus, protective element 32 is effectively protected from external factors. On the other hand, the first bonding portions 411 are not completely covered with the moisture-resistant layer 51, and the upper ends of the first bonding portions 411 are exposed from the moisture-resistant layer 51. That is, the thickness of the moisture-resistant layer 51 covering the front surface 31A of the switching element 31 is smaller than the diameter of the wires 41. With this configuration, an excessively large shearing stress is less likely to act on the first bonding portions 411, as compared with the configuration in which the first bonding portions 411 are completely covered with the moisture-resistant layer 51. Thus, detachment of the first bonding portions 411 from the front surface electrode 311 of the switching element 31 is prevented, which enhances the reliability of the semiconductor device A14.

Figures 50, 51:
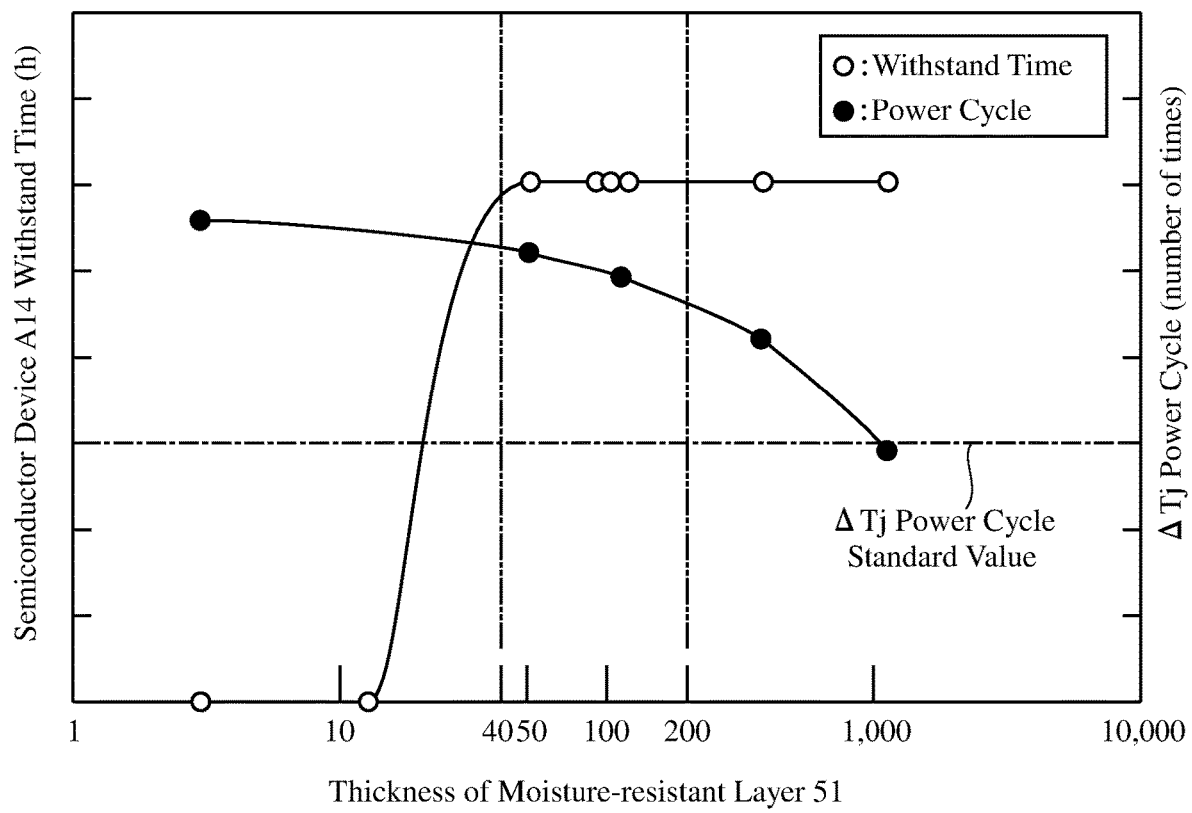
FIG. 50 shows test results based on variations in thicknesses of the moisture-resistant layer of the semiconductor device according to the fourth variation of the first embodiment of the present disclosure.
FIG. 51 shows results of the H3TRB test on the semiconductor device according to the fourth variation of the first embodiment of the present disclosure and the semiconductor device of the comparative example.

Next, with reference to FIG. 50, description is given of a favorable thickness of the moisture-resistant layer 51 in the semiconductor device A14. FIG. 50 shows the results of a H3TRB test and a $\Delta T_j$ power cycling test with varying thicknesses of the moisture-resistant layer 51 of the semiconductor device A14. The thickness of the moisture-resistant layer 51 shown in FIG. 50 is the thickness at the corner of the insulating film 314 (i.e., the portion connected to both of the edge 314A and the side surface 31C) of a switching element 31. Before the H3TRB test is conducted, the semiconductor device A14 has been subjected to temperature cycles from −40 to 125° C. The number of the temperature cycles was 300. In the H3TRB test, the semiconductor device A14 was driven at a DC voltage of 1,360 V as explained later. In the $\Delta T_j$ power cycling test, the temperature $\Delta T_j$ of the first bonding layer 391 for electrically bonding the switching elements 31 to the mounting layer (the first mounting layer 211, the second mounting layer 221 and the third mounting layer 231) was set to 100° C. In light of this, the range of the temperature cycles in the $\Delta T_j$ power cycling test was from 50 to 150° C.

The left vertical axis in FIG. 50 is for indicating the withstand time of the semiconductor device A14 in the H3TRB test. The "withstand time" means the time from the start of the test to the time when dielectric breakdown is observed in at least one of the switching elements 31 of the semiconductor device A14. The right vertical axis in FIG. 50 is for indicating the number of temperature cycles done in the $\Delta T_j$ power cycling test before the first bonding portion 411 of a wire 41, connected to the front surface electrode 311 of a switching element 31, was detached from the front surface electrode 311 (hereinafter referred to as "$\Delta T_j$ power cycle"). The desirable number of temperature cycles (or the standard value of the $\Delta T_j$ power cycle, indicated in FIG. 50) is 15,000 times. The horizontal axis in FIG. 50 represents the thickness of the moisture-resistant layer 51.

As shown in FIG. 50, the withstand time of the semiconductor device A14 increases sharply when the thickness of the moisture-resistant layer 51 exceeds 10 μm. This indicates that the resistance to breakdown of the switching element 31 due to moisture intrusion (or reliability related to moisture absorption) improves with increasing thickness of the moisture-resistant layer 51. On the other hand, the OT: power cycle gradually reduces with increasing thickness of the moisture-resistant layer 51. This indicates that increasing the thickness of the moisture-resistant layer 51 leads to an increased risk of detachment of the first bonding portion 411 of the wire 41 from the front surface electrode 311 of the switching element 31 or detachment of the second bonding portion 412 of the wire 41 from the anode electrode 321 of the protective element 32. These test results reveal that preferable thickness of the moisture-resistant layer 51 is in the range from 40 to 200 μm. More preferable range of the thickness of the moisture-resistant layer 51 may be from 50 to 100 μm. Experiments have confirmed that the thickness of the moisture-resistant layer 51 on the upper surface of the switching element 31 is 1.2 times the thickness of the moisture-resistant layer 51 at the corners. Accordingly, the preferable thickness of the moisture-resistant layer 51 on the upper surface of the switching element 31 is from 48 to 240 μm, and more preferably, from 60 to 120 μm.

FIG. 51 shows the results (unit: h) of the H3TRB test performed on the semiconductor device A14 and a comparative example B10 that does not include the moisture-resistant layer 51 shown in FIG. 23. As described before, a semiconductor device determined to be acceptable in the H3TRB test (the device withstand time is 1000 h or more) is expected to operate stably under high temperature and high humidity conditions. In the H3TRB test, when the rating voltage is 1,700 V, the DC voltage for driving the semiconductor device A14 and the comparative example B10 is set to 1,360 V (80% of the rating voltage). As a result of the H3TRB test performed based on this DC voltage, the withstand time of the semiconductor device A14 was found to 1000 h or more, which is acceptable. Thus, the semiconductor device A14 is expected to operate stably under high temperature and high humidity conditions. On the other hand, the withstand time of the comparative example B10 was 10 to 500 h, which is not acceptable. The comparative example B10 is considered to be inferior to the semiconductor device A14 in terms of the capability of stable operation under high temperature and high humidity conditions.

As shown in FIG. 51, the insulation resistance reduction rate (unit: %) of the sealing resin 52 during the H3TRB test was 20% in the semiconductor device A14 and 84% in the comparative example B10. Presumably, the insulation resistance reduction rate of the sealing resin 52 shown in FIG. 51 were obtained because even when moisture enters the sealing resin 52 due to a high temperature and high humidity environment, the moisture-resistant layer 51 hinders the leakage current Lc shown in FIG. 22 from flowing along the side surfaces 31C of the switching element.

[Fifth Variation]

A semiconductor device A15 according to a fifth variation of the semiconductor device A10 is described with reference to FIGS. 44-49. The semiconductor device A15 is an example in which the thickness of the moisture-resistant layer 51 on the upper surface of a switching element 31 is larger than that in the foregoing semiconductor device A14.

As shown in FIGS. 44-49, at the switching elements 31, the moisture-resistant layer 51 covers both of the switching elements 31 and the first bonding portions 411 of the wires 41.

As shown in FIGS. 44, 45, 47 and 48, the moisture-resistant layer 51 covers the entirety of the front surface of the protective element 32 associated with the switching element 31 and the second bonding portions 412 of the wires 41 connected to the anode electrode 321 of the protective element 32.

The advantages of the semiconductor device A15 are described below.

With the configuration of the semiconductor device A15, the moisture-resistant layer 51 is held in contact with both of the mounting layer (the first mounting layer 211, the second mounting layer 221 and the third mounting layer 231) and the side surface 31C of switching elements 31. In the thickness direction z, the moisture-resistant layer 51 extends to be spanned between the mounting layer and the side surface 31C. Thus, the semiconductor device A15 also operates stably under high temperature and high humidity conditions.

At the switching element 31, the moisture-resistant layer covers both of the switching element 31 and the first bonding portions 411 of the wires 41. Since the entirety of the switching element 31 is covered with the moisture-resistant layer 51 in this way, moisture entering the sealing resin 52 is prevented from reaching the front surface 31A of the switching element 31. Thus, dielectric breakdown of the switching elements 31 caused by the leakage current Lc shown in FIG. 22, which is due to the influence of moisture, is effectively prevented. Moreover, since the moisture-resistant layer 51 covers the insulating film 314, the insulating film 314 is protected from external factors. In the semiconductor device A15 again, it is preferable that the thickness of the moisture-resistant layer 51 on the upper surface of the switching element 31 is from 48 to 240 μm.

Second Embodiment

A semiconductor device A20 according to a second embodiment of the present disclosure is described below with reference to FIGS. 52-57. In these figures, the elements that are identical or similar to those of the foregoing semiconductor device A10 are designated by the same reference signs as those used for the foregoing embodiment and, descriptions thereof are omitted.

The semiconductor device A20 differs from the foregoing semiconductor device A10 in that it includes clips 47 instead of the wires 41.

Figure 52:
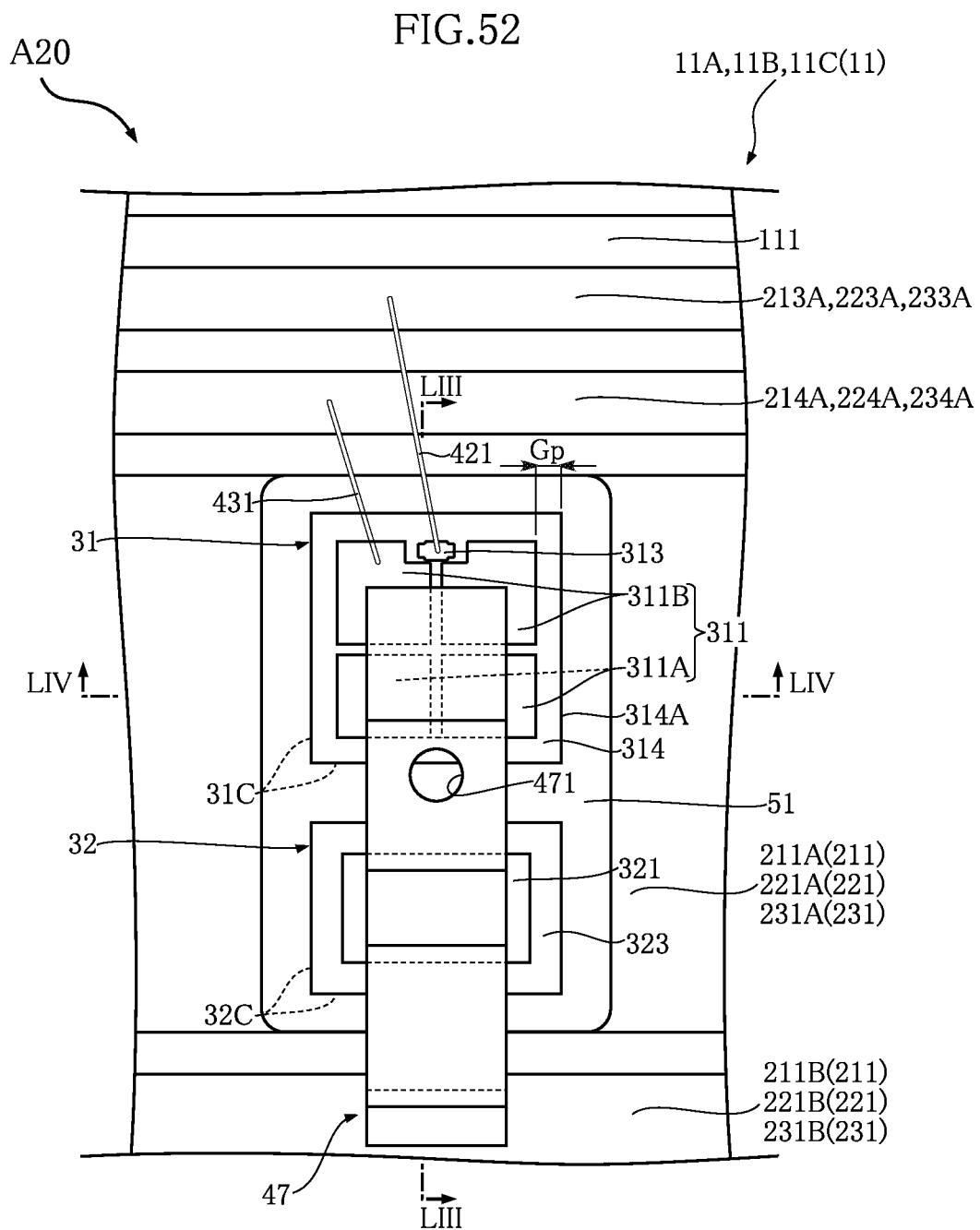
FIG. 52 is a plan view showing a portion of a semiconductor device (a switching element and a protective element bonded to the upper arm mounting layer) according to a second embodiment of the present disclosure.
Figure 53:
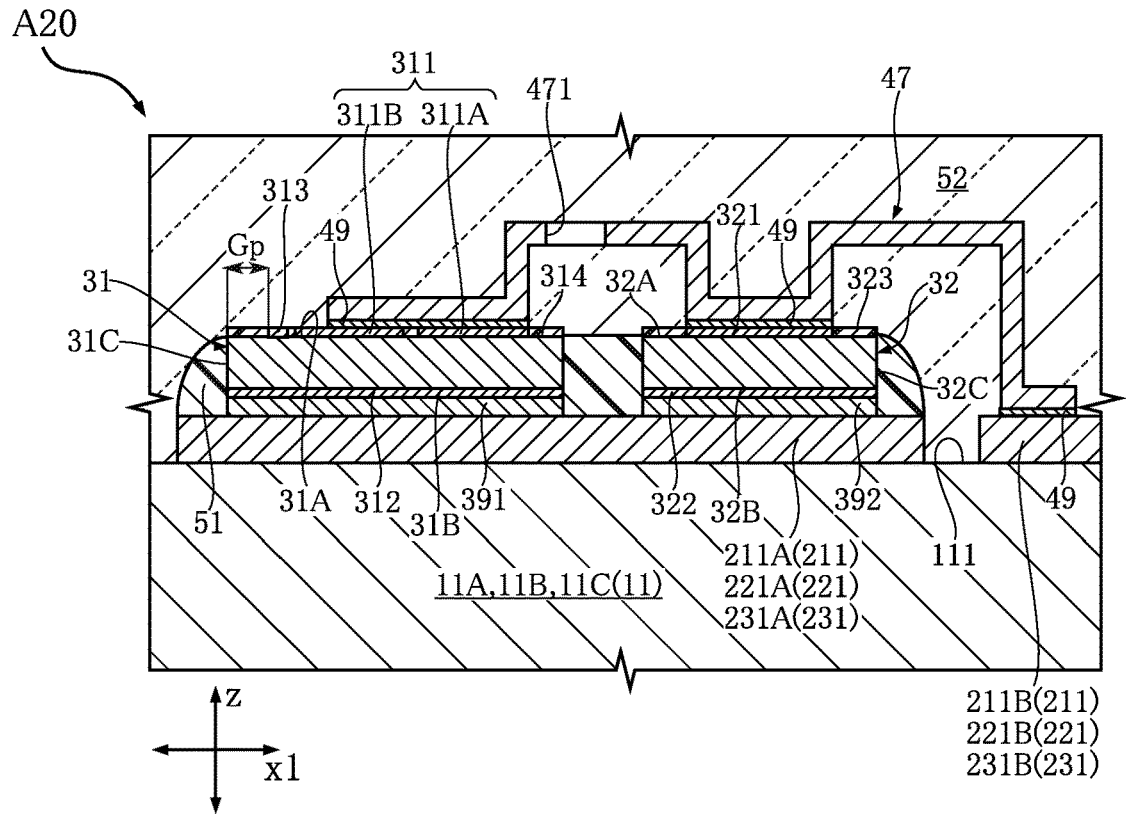
FIG. 53 is a sectional view taken along line LIII-LIII in FIG. 52.
Figure 54:
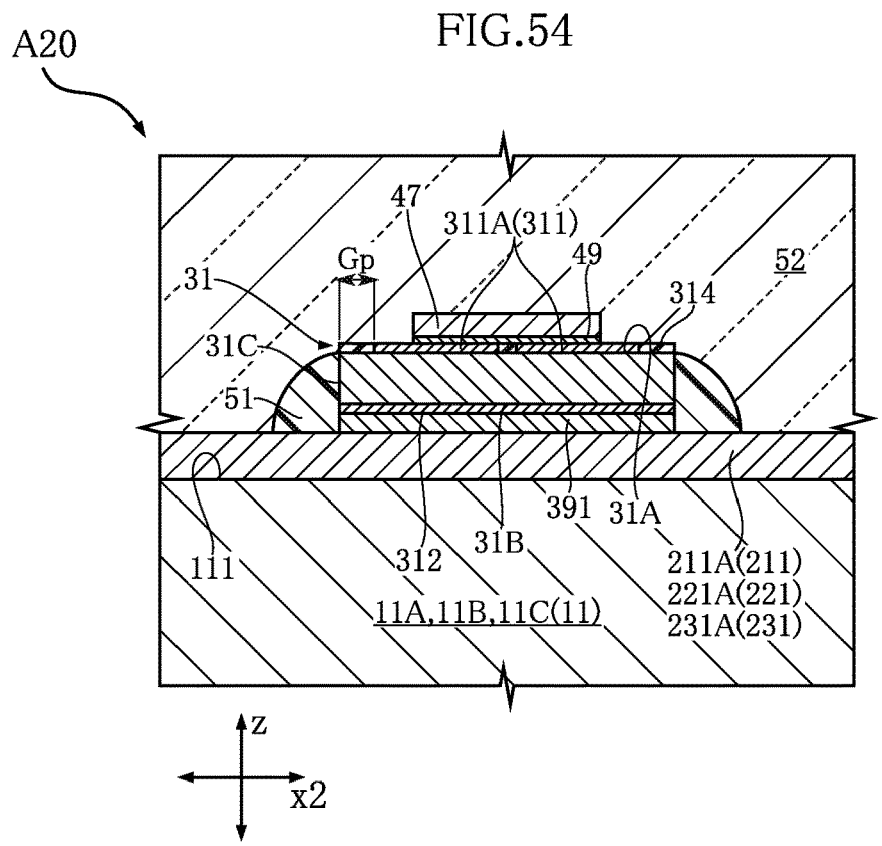
FIG. 54 is a sectional view taken along line LIV-LIV in FIG. 52.
Figure 55:
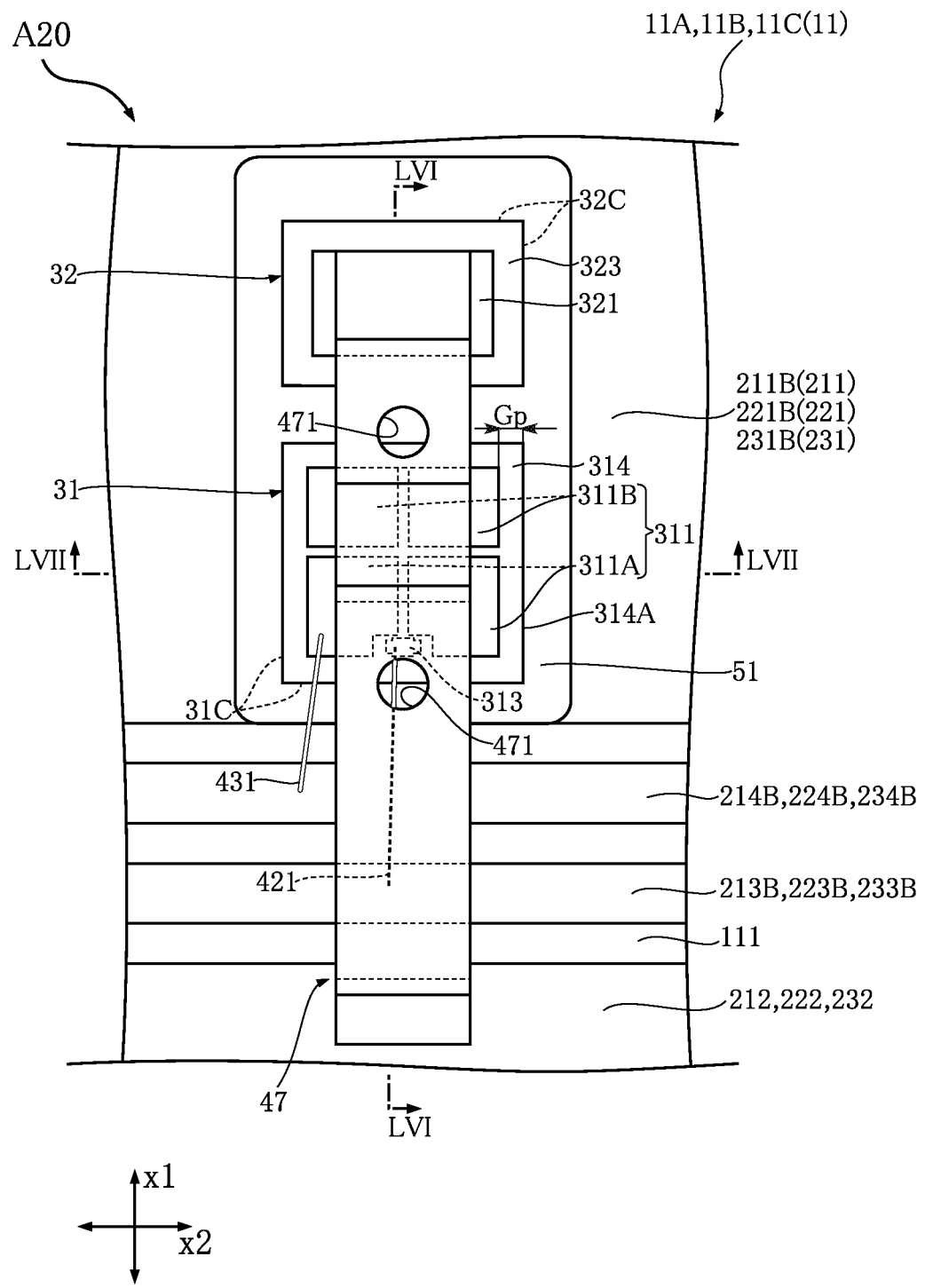
FIG. 55 is a plan view showing a portion of the semiconductor device (a switching element and a protective element bonded to the lower arm mounting layer) according to the second embodiment of the present disclosure.
Figure 56:
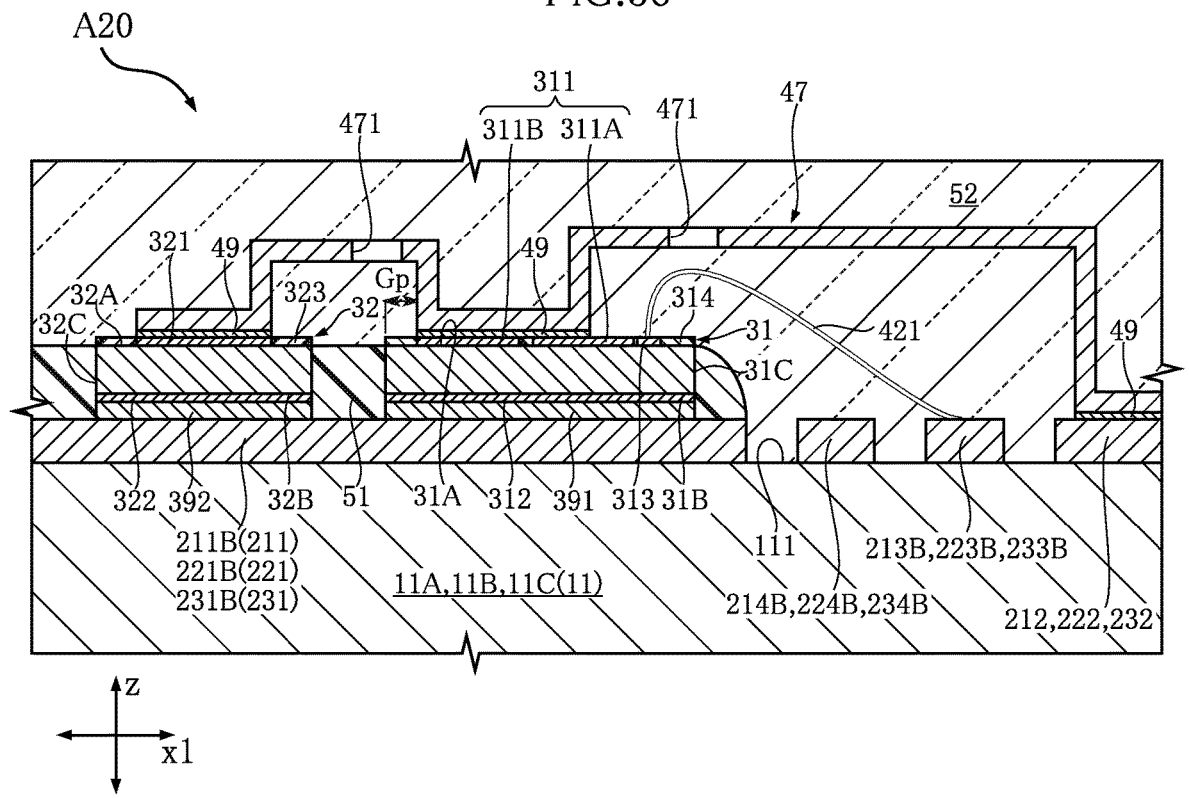
FIG. 56 is a sectional view taken along line LVI-LVI in FIG. 55.
Figure 57:
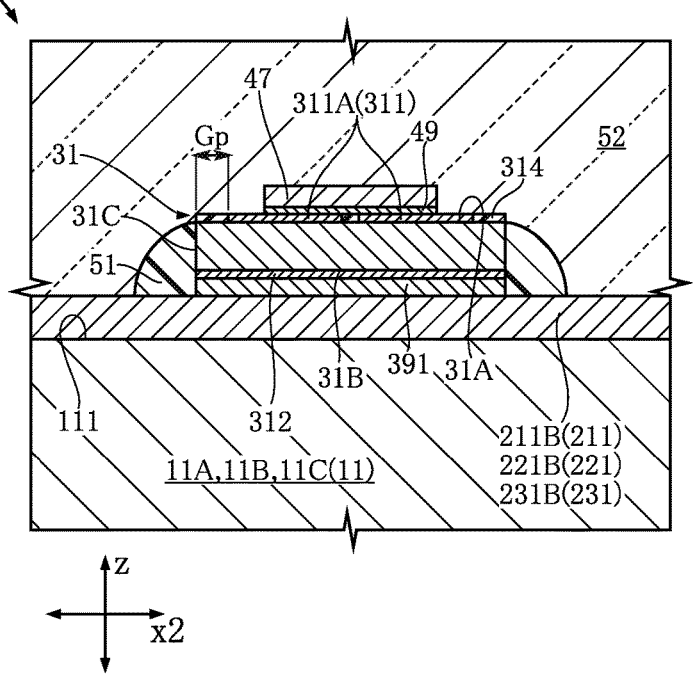
FIG. 57 is a sectional view taken along line LVII-LVII in FIG. 55.

As shown in FIGS. 52-54, the clips 47 are electrically bonded to the front surface electrodes 311 of the switching elements 31 and the first lower arm mounting layer 211B, the second lower arm mounting layer 221B or the third lower arm mounting layer 231B. As shown in FIGS. 55-57, the clips 47 are electrically bonded to the front surface electrodes 311 of the switching elements 31 and the first electroconductive layer 212, the second electroconductive layer 222 or the third electroconductive layer. The clips 47 are formed by bending a thin metal plate such as a copper plate. As shown in FIGS. 52 and 55, the clips 47 are each in the form of a strip extending in the first direction x1 as viewed in the thickness direction z. As shown in FIGS. 53 and 56, the clips 47 have a hook-like shape as viewed in the second direction x2. As shown in FIGS. 53 and 56, the clips 47 are electrically bonded to an object such as the front surface electrode 311 by using a clip bonding layer 49. The clip bonding layer 49 is electrically conductive. For example, the clip bonding layer 49 is made of lead-free solder mainly composed of tin. To use the clip bonding layer 49, a plating layer of nickel or gold, for example, is applied to the front surface of the front surface electrode 311. In the semiconductor device A20, when the front surface electrode 311 is covered with the moisture-resistant layer 51, the clip bonding layer 49 and the plating layer are also covered with the moisture-resistant layer 51.

As shown in FIGS. 52-54, in the switching elements 31 electrically bonded to the first upper arm mounting layer 211A, the clips 47 are electrically bonded to the front surface electrodes 311 and the first lower arm mounting layer 211B. As shown in FIGS. 55-57, in the switching elements 31 electrically bonded to the first lower arm mounting layer 211B, the clips 47 are electrically bonded to the front surface electrodes 311 and the first electroconductive layer 212. Thus, the front surface electrodes 311 of the switching elements 31 electrically bonded to the first mounting layer 211 are electrically connected to the first lower arm mounting layer 211B or the first electroconductive layer 212.

As shown in FIGS. 52-54, in the switching elements 31 electrically bonded to the second upper arm mounting layer 221A, the clips 47 are electrically bonded to the front surface electrodes 311 and the second lower arm mounting layer 221B. As shown in FIGS. 55-57, in the switching elements 31 electrically bonded to the second lower arm mounting layer 221B, the clips 47 are electrically bonded to the front surface electrodes 311 and the second electroconductive layer 222. Thus, the front surface electrodes 311 of the switching elements 31 electrically bonded to the second mounting layer 221 are electrically connected to the second lower arm mounting layer 221B or the second electroconductive layer 222.

As shown in FIGS. 52-54, in the switching elements 31 electrically bonded to the third upper arm mounting layer 231A, the clips 47 are electrically bonded to the front surface electrodes 311 and the third lower arm mounting layer 231B. As shown in FIGS. 55-57, in the switching elements 31 electrically bonded to the third lower arm mounting layer 231B, the clips 47 are electrically bonded to the front surface electrodes 311 and the third electroconductive layer 232. Thus, the front surface electrodes 311 of the switching elements 31 electrically bonded to the third mounting layer 231 are electrically connected to the third lower arm mounting layer 231B or the third electroconductive layer 232.

With reference to FIGS. 52 and 53, description is given below of the configuration of the clips 47 for each of the switching elements 31 electrically bonded to the first upper arm mounting layer 211A, the second upper arm mounting layer 221A or the third upper arm mounting layer 231A. As shown in FIG. 53, each clip 47 is electrically bonded also to the anode electrode 321 of the protective element 32 associated with the switching element 31 by using the clip bonding layer 49. Thus, the anode electrode 321 of the protective element 32 electrically bonded to the first upper arm mounting layer 211A is electrically connected to both of the front surface electrode 311 of the corresponding switching element 31 and the first lower arm mounting layer 211B. The anode electrode 321 of the protective element 32 electrically bonded to the second upper arm mounting layer 221A is electrically connected to both of the front surface electrode 311 of the corresponding switching element 31 and the second lower arm mounting layer 221B. Also, the anode electrode 321 of the protective element 32 electrically bonded to the third upper arm mounting layer 231A is electrically connected to both of the front surface electrode 311 of the corresponding switching element 31 and the third lower arm mounting layer 231B.

As shown in FIGS. 52 and 53, each of the clips 47 has an opening 471 penetrating in the thickness direction z. The opening 471 is located between the front surface electrode 311 of the switching element 31 and the anode electrode 321 of the protective element 32 in the first direction x. As viewed in the thickness direction z, the edge 314A of the insulating film 314 of the switching element 31 is visible through the opening 471. When clips 47 are electrically bonded to the front surface electrodes 311 of the switching elements 31, most of the switching elements 31 are covered with the clips 47. By forming an opening 471 in each clip 47 at a location overlapping with the switching element 31 as viewed in the thickness direction, the synthetic resin material for forming the moisture-resistant layer 51 can be dropped under the clip 47. Thus, the synthetic resin material can be dropped uniformly over the entirety of the switching element 31. Although the semiconductor device A20 is described as having an opening 471 in each clip 47, a cutout penetrating in the thickness direction z may be formed, instead of the opening 471, in each clip 46 at a location overlapping with the switching element 31 as viewed in the thickness direction z.

With reference to FIGS. 55 and 56, description is given below of the configuration of the clips 47 for each of the switching elements 31 electrically bonded to the first lower arm mounting layer 211B, the second lower arm mounting layer 221B or the third lower arm mounting layer 231B. As shown in FIG. 56, each clip 47 is electrically bonded also to the anode electrode 321 of the protective element 32 associated with the switching element 31 by using the clip bonding layer 49. Thus, the anode electrode 321 of the protective element 32 electrically bonded to the first lower arm mounting layer 211B is electrically connected to both of the front surface electrode 311 of the corresponding switching element 31 and the first electroconductive layer 212. The anode electrode 321 of the protective element 32 electrically bonded to the second lower arm mounting layer 221B is electrically connected to both of the front surface electrode 311 of the corresponding switching element 31 and the second electroconductive layer 222. Also, the anode electrode 321 of the protective element 32 electrically bonded to the third lower arm mounting layer 231B is electrically connected to both of the front surface electrode 311 of the corresponding switching element 31 and the third electroconductive layer 232. Since the clip 47 is electrically bonded to the anode electrode 321, the paired auxiliary wires 46 shown in FIG. 18 are not connected to the anode electrode 321 in the semiconductor device A20.

As shown in FIGS. 55 and 56, each of the clips 47 has a pair of openings 471 penetrating in the thickness direction z. The paired openings 471 are located on the opposite sides of the front surface electrode 311 of the switching element 31 in the first direction x1. As viewed in the thickness direction z, the edge 314A of the insulating film 314 of the switching element 31 is visible through the paired openings 471.

The advantages of the semiconductor device A20 are described below.

With the configuration of the semiconductor device A20, the moisture-resistant layer 51 is held in contact with both of the side surfaces 31C of the switching elements 31 and the first mounting layer 211, the second mounting layer 221 or the third mounting layer 231. In the thickness direction, the moisture-resistant layer 51 extends to be spanned between the first mounting layer 211, the second mounting layer 221 or the third mounting layer 231 and the side surfaces 31C. Thus, the semiconductor device A20 also operates stably under high temperature and high humidity conditions.

The configuration of the moisture-resistant layer 51 of the semiconductor device A20 is the same as that of the semiconductor device A10. Note however that the configuration of the moisture-resistant layer 51 in the semiconductor devices A11 to A15 may be employed in the semiconductor device A20.

The semiconductor device A20 has clips 47 instead of the wires 41. The cross sectional area (the area in cross section along the second direction x2) of the clip 47 is larger than that of the wires 41. Thus, the electric resistance of the clip 47 is lower than that of the wires 41. Thus, the parasitic resistance of the semiconductor device A20 is lower than that of the semiconductor device A10, so that the power loss of the semiconductor device A20 is reduced as compared with the semiconductor device A10.

Since the cross sectional area of the clip 47 is larger than that of the wires 41, the clip 47 conducts more heat in the first direction x1 than the wires 41. Thus, heat generated from the switching elements 31 is dissipated more efficiently. For example, on the first substrate 11A, the heat generated from the switching elements 31 is likely to be accumulated in the first upper arm mounting layer 211A that constitutes the upper arm circuit 81 shown in FIG. 21. The clips 47 efficiently dissipate the heat accumulated in the first upper arm mounting layer 211A to the first lower arm mounting layer 211B and the first electroconductive layer 212.

The number of the switching elements electrically bonded to each of the first mounting layer 211, the second mounting layer 221 and the third mounting layer 231 can be set appropriately in accordance with the required power conversion. The first mounting layer 211, the second mounting layer 221 and the third mounting layer 231 are examples of a "mounting layer" as set forth in the appended claims of the present disclosure. The number of sections constituting the "mounting layer" is not limited to six as is in the present disclosure, and may be set appropriately.

The foregoing embodiments show the example in which the moisture-resistant layer 51 covers the switching elements 31 and the protective elements 32 connected antiparallel to the switching elements 31. However, in a semiconductor device that does not use the protective elements 32 but uses the switching elements 31 alone (the configuration that does not use an external free wheeling diode), the moisture-resistant layer 51 may cover the switching elements 31. Further, the present disclosure is applicable not only to switching elements but also to rectifier elements. For example, the present disclosure is applicable to a semiconductor device that includes a plurality of schottky-barrier diodes. In this case, the configuration such as the material, thickness or formation area of the moisture-resistant layer 51 is the same as that of the foregoing embodiments.

In the foregoing embodiments, as one example, the semiconductor device includes a substrate 11 on which electrically conductive members (the mounting layer and the electroconductive layer) made of a thin metal film are disposed, and the switching elements 31 electrically bonded to the electrically conductive members. The present disclosure is not limited to such an example and also applicable to a resin package-type semiconductor device that includes a lead frame on which elements such as switching elements or rectifier elements are electrically bonded and resin-molded. Since such a semiconductor device also has a risk of moisture intrusion through the sealing resin, covering the entire surfaces or side surfaces of the switching elements or rectifier elements with the moisture-resistant layer according to the present disclosure provides the same advantages. Note that the connection structure by wire bonding using the wires 41 in the semiconductor device A10 or the connection structure using a thin metal plate or clips 47 in the semiconductor device A20 is also applicable to a resin package-type semiconductor device.

The present disclosure is not limited to foregoing embodiments. The specific configuration of each part of the present disclosure may be varied in many ways.

The present disclosure at least includes the configurations related to the following clauses in addition to the configurations as set forth in the appended claims.

Clause 1.
A semiconductor device comprising:
a first electroconductive layer;
a second electroconductive layer spaced apart from the first electroconductive layer;
a semiconductor element including a semiconductor layer, a front surface electrode provided on an upper surface of the semiconductor layer, and a back surface electrode provided on a lower surface of the semiconductor layer, the semiconductor element being mounted on the first electroconductive layer with the back surface electrode electrically connected to the first electroconductive layer;
a connection structure electrically connected to the front surface electrode and the second electroconductive layer;
a first insulating layer covering at least a side surface of the semiconductor element; and
a second insulating layer covering the first insulating layer,
wherein the first insulating layer is made of a material having a lower moisture permeability than the second insulating layer. The first insulating layer functions as a barrier film for preventing moisture intrusion.

Clause 2.
The semiconductor device according to clause 1, wherein the first insulating layer covers an entirety of the semiconductor element.

Clause 3.
The semiconductor device according to clause 1, wherein the connection structure includes a connecting portion held in contact with the front surface electrode, and
the first insulating layer covers an entirety of the semiconductor element except the connecting portion.

Clause 4.
The semiconductor device according to clause 1, wherein the first insulating layer is from 40 to 200 μm in thickness at a corner located between an upper surface and the side surface of the semiconductor element, and
the first insulating layer is from 48 to 240 μm in thickness on the upper surface of the semiconductor element.

Clause 5.
The semiconductor device according to clause 4, wherein the first insulating layer is from 50 to 100 μm in thickness at the corner located between the upper surface and the side surface of the semiconductor element, and
the first insulating layer is from 60 to 120 μm in thickness on the upper surface of the semiconductor element.

Clause 6.
The semiconductor device according to clause 1, wherein the connection structure includes a connection structure using a wire, and
a thickness of the first insulating layer on an upper surface of the semiconductor element is smaller than a diameter of the wire.

Clause 7.
The semiconductor device according to clause 6, wherein the wire includes a connecting portion held in contact with the front surface electrode, and
the thickness of the first insulating layer on the upper surface of the semiconductor element is smaller than a height of the connecting portion (a distance from a front surface of the front surface electrode to a top of the connecting portion). That is, the top of the connecting portion is exposed from the first insulating layer. The connecting portion is crushed with a wedge tool during a bonding process, and the height of the connecting portion is smaller than the diameter of the wire.

Clause 8.
The semiconductor device according to clause 1, wherein the semiconductor layer is 400 μm or less in thickness.

Clause 9.
The semiconductor device according to clause 8, wherein the semiconductor layer is 150 μm or less in thickness.

Clause 10.
The semiconductor device according to clause 1, wherein the semiconductor element further comprises a voltage withstanding structure including an insulating layer covering an upper surface of the semiconductor layer and surrounding an edge of the front surface electrode, and the first insulating layer covers the voltage withstanding structure. In the voltage withstanding structure, an oxide film or a nitride film is formed on the semiconductor layer, and a layer such as a polyimide layer or a polybenzoxazole layer is formed thereon as the insulating layer.

Clause 11.
The semiconductor device according to clause 1, wherein the first insulating layer contains a synthetic resin that is polyimide or polybenzoxazole.

Clause 12.
The semiconductor device according to clause 11, wherein the first insulating layer contains silicone gel.

Clause 13.
The semiconductor device according to clause 12, wherein the synthetic resin and the silicone gel are uniformly dispersed in the first insulating layer.

Clause 14.
The semiconductor device according to clause 12 or 13, wherein a content by weight of the synthetic resin in the first insulating layer is larger than that of the silicone gel.

Clause 15.
The semiconductor device according to clause 14, wherein the ratio of content by weight of the synthetic resin to the silicone gel in the first insulating layer is from 1.5:1 to 7.0:1.

Clause 16.
The semiconductor device according to clause 1, wherein the connection structure includes a connection structure using a wire and a connection structure using a thin metal plate.

Clause 17.
The semiconductor device according to clause 1, wherein the semiconductor layer is made of a semiconductor material mainly composed of silicon carbide.

Clause 18
The semiconductor device according to clause 17, wherein the semiconductor element includes a MOSFET or a schottky-barrier diode.

Clause 19.
The semiconductor device according to clause 1, wherein breakdown voltage of the protective element is 1,200 V or more.

Clause 20.

The semiconductor device according to clause 1, wherein the first electroconductive layer and the second electroconductive layer are made of a lead frame, and the second insulating layer comprises a resin package sealing the first electroconductive layer, the second electroconductive layer, the semiconductor element and the connection structure.

Clause 21.

The semiconductor device according to clause 1, wherein the first electroconductive layer and the second electroconductive layer comprise a metal layer disposed on an insulating substrate, and the second insulating layer includes a resin package sealing the insulating substrate, the first electroconductive layer, the second electroconductive layer, the semiconductor element and the connection structure. The sealing resin contains silicone gel.

Clause 22.

The semiconductor device according to clause 1, wherein the second insulating layer has a front surface exposed to outside air (atmosphere).

Clause 23.

A method for manufacturing a semiconductor device as set forth in any one of clauses 1 to 22, the method comprising the steps of:

preparing a synthetic resin material containing: a material having a lower moisture permeability than a material forming the second insulating layer, or a precursor thereof; and a volatile solvent, electrically connecting the back surface electrode to the first electroconductive layer, dropping the synthetic resin material onto an upper surface of the semiconductor element to cover the semiconductor element with the synthetic resin material, and heat-curing the synthetic resin material with the semiconductor element covered with the synthetic resin material, to thereby form the first insulating layer. Before the step of heat-curing the synthetic resin material, the synthetic resin material does not need to have the function of the first insulating layer. It is only necessary that the synthetic resin material has the function of the first insulating layer after it is heat-cured. For example, polyimide is dissolved in the solvent in the state of a precursor, and it becomes polyimide through "imidization" after heat-curing, to thereby have the function as the first insulating layer.

Clause 24.

The method for manufacturing the semiconductor device according to clause 23, further comprising the step of connecting the connection structure to the front surface electrode and the second electroconductive layer before the step of covering the semiconductor element with the synthetic resin material.

The invention claimed is:

1. A semiconductor device comprising:
a first mounting layer including an upper surface facing a vertical direction upwardly;
a bonding layer that is electrically conductive and disposed on the upper surface of the first mounting layer;
a switching element which includes a first element upper surface facing a same direction that the upper surface of the first mounting layer faces, a first element lower surface facing an opposite direction of the first element upper surface, and a first element side surface connected to both of the first element upper surface and the first element lower surface, the switching element being electrically bonded to the first mounting layer with the first element lower surface facing the upper surface of the first mounting layer;
a conductive member connected to an upper surface electrode of the first element upper surface;
a resin layer that covers at least the first element side surface; and
a sealing resin that covers the switching element, the resin layer, and at least a part of the conductive member,
wherein the resin layer is held in contact with both of a side surface of the bonding layer and the first element side surface in a manner such that the resin layer bridges the side surface of the bonding layer and the first element side surface in the vertical direction.

2. The semiconductor device according to claim 1, wherein the side surface of the bonding layer is flush with a side surface of the switching element at their joint.

3. The semiconductor device according to claim 1, further comprising a second mounting layer that is electrically connected to the conductive member, wherein the resin layer does not cover the second mounting layer.

4. The semiconductor device according to claim 1, wherein the resin layer does not cover the first element upper surface.

5. The semiconductor device according to claim 1, wherein the resin layer covers at least a part of the first element upper surface.

6. The semiconductor device according to claim 1, wherein the switching element is a MOSFET formed on a SiC substrate.

7. The semiconductor device according to claim 1, wherein the first mounting layer comprises a lead frame.

8. The semiconductor device according to claim 1, further comprising a substrate on a surface of a conductive layer opposite to a surface of the conductive layer on which the switching element is mounted.

9. The semiconductor device according to claim 8, wherein the substrate is made of a ceramic with excellent thermal conductivity.

10. The semiconductor device according to claim 8, wherein the resin layer is disposed on the first mounting layer, and is not in contact with the substrate.

11. The semiconductor device according to claim 8, wherein the sealing resin does not cover a side of the substrate.

12. The semiconductor device according to claim 8, wherein a side surface and a lower surface of the substrate are exposed from the sealing resin.

13. The semiconductor device according to claim 1, wherein the conductive member comprises wires.

14. The semiconductor device according to claim 1, wherein the conductive member comprises a thin metal plate.

15. The semiconductor device according to claim 1, further comprising protective elements parallelly connected to the switching element, wherein the resin layer is arranged between the protective elements.

16. The semiconductor device according to claim 1, wherein the resin layer comprises polyimide.

17. The semiconductor device according to claim 1, wherein the resin layer comprises silicone gel.

18. The semiconductor device according to claim 15, wherein the resin layer covers the protective elements.

19. A semiconductor device comprising:
a first lead frame including an upper surface facing a vertical direction upwardly;
a bonding layer that is electrically conductive and disposed on the upper surface of the first lead frame;

a switching element which includes a first element upper surface facing a same direction that the upper surface of the first lead frame faces, a first element lower surface facing an opposite direction of the first element upper surface, and a first element side surface connected to both of the first element upper surface and the first element lower surface, the switching element being electrically bonded to the first lead frame with the first element lower surface facing the upper surface of the first lead frame;

a conductive member connected to an upper surface electrode of the first element upper surface;

a resin layer that covers at least the first element side surface; and a sealing resin that covers the switching element, the resin layer, and at least a part of the conductive member, wherein the resin layer is held in contact with both of a side surface of the bonding layer and the first element side surface in a manner such that the resin layer bridges the side surface of the bonding layer and the first element side surface in the vertical direction.

20. The semiconductor device according to claim 19, wherein the side surface of the bonding layer is flush with a side surface of the switching element at their joint.

21. The semiconductor device according to claim 19, further comprising a second lead frame that is electrically connected to the conductive member, wherein the resin layer does not cover the second lead frame.

22. The semiconductor device according to claim 19, wherein the resin layer does not cover the first element upper surface.

23. The semiconductor device according to claim 19, wherein the resin layer covers at least a part of the first element upper surface.

24. The semiconductor device according to claim 19, wherein the switching element is a MOSFET formed on a SiC substrate.

25. The semiconductor device according to claim 19, wherein the conductive member comprises wires.

26. The semiconductor device according to claim 19, wherein the conductive member comprises a thin metal plate.

27. The semiconductor device according to claim 19, further comprising protective elements parallelly connected to the switching element, wherein the resin layer is arranged between the protective elements.

28. The semiconductor device according to claim 19, wherein the resin layer comprises polyimide.

29. The semiconductor device according to claim 19, wherein the resin layer comprises silicone gel.

30. The semiconductor device according to claim 27, wherein the resin layer covers the protective elements.

* * * * *